(12) United States Patent
Takahashi et al.

(10) Patent No.: US 8,283,667 B2
(45) Date of Patent: Oct. 9, 2012

(54) THIN FILM TRANSISTOR

(75) Inventors: Erika Takahashi, Kanagawa (JP);
Takayuki Kato, Kanagawa (JP);
Hidekazu Miyairi, Kanagawa (JP);
Yasuhiro Jinbo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 479 days.

(21) Appl. No.: 12/547,119

(22) Filed: Aug. 25, 2009

(65) Prior Publication Data
US 2010/0059749 A1 Mar. 11, 2010

(30) Foreign Application Priority Data

Sep. 5, 2008 (JP) ................................. 2008-228765

(51) Int. Cl.
*H01L 29/72* (2006.01)
(52) U.S. Cl. ............................ 257/57; 257/59; 257/66
(58) Field of Classification Search .............. 257/57, 257/59, 66
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,311,040 A | 5/1994 | Hiramatsu et al. |
| 5,453,858 A | 9/1995 | Yamazaki |
| 5,514,879 A | 5/1996 | Yamazaki |
| 5,591,987 A | 1/1997 | Yamazaki et al. |
| 5,614,732 A | 3/1997 | Yamazaki |
| 5,648,662 A | 7/1997 | Zhang et al. |
| 5,677,236 A | 10/1997 | Saitoh et al. |
| 5,701,167 A | 12/1997 | Yamazaki |
| 5,766,989 A | 6/1998 | Maegawa et al. |
| 5,849,601 A | 12/1998 | Yamazaki |
| 5,859,445 A | 1/1999 | Yamazaki |
| 5,864,150 A | 1/1999 | Lin |
| 5,932,302 A | 8/1999 | Yamazaki et al. |
| 6,011,277 A | 1/2000 | Yamazaki |
| 6,023,075 A | 2/2000 | Yamazaki |
| 6,153,893 A | 11/2000 | Inoue et al. |
| 6,171,674 B1 | 1/2001 | Yamazaki et al. |
| 6,183,816 B1 | 2/2001 | Yamazaki et al. |

(Continued)

FOREIGN PATENT DOCUMENTS

EP 0 449 539 A2 10/1991
(Continued)

OTHER PUBLICATIONS

Kim, et al., "42.1: A Novel Four-Mask-Count Process Architecture for TFT-LCDs", SID Digest 00; SID International Symposium Digest of Technical Papers, pp. 1006-1009, 2000.

(Continued)

*Primary Examiner* — Edward Wojciechowicz
(74) *Attorney, Agent, or Firm* — Nixon Peabobdy LLP; Jeffrey L. Costellia

(57) ABSTRACT

A thin film transistor is provided, which includes a gate electrode layer over a substrate, a gate insulating layer over the gate electrode layer, a layer including an amorphous semiconductor over the gate insulating layer, a pair of crystal regions over the layer including the amorphous semiconductor, and source and drain regions over and in contact with the pair of crystal regions. The source and drain regions include a microcrystalline semiconductor layer to which an impurity imparting one conductivity type is added.

21 Claims, 26 Drawing Sheets

U.S. PATENT DOCUMENTS

| | | |
|---|---|---|
| 6,252,249 B1 | 6/2001 | Yamazaki |
| 6,281,520 B1 | 8/2001 | Yamazaki |
| 6,306,213 B1 | 10/2001 | Yamazaki |
| 6,468,617 B1 | 10/2002 | Yamazaki et al. |
| 6,468,839 B2 | 10/2002 | Inoue et al. |
| 6,737,676 B2 | 5/2004 | Yamazaki |
| 6,756,258 B2 | 6/2004 | Zhang et al. |
| 6,835,523 B1 | 12/2004 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,199,846 B2 | 4/2007 | Lim |
| 8,013,338 B2 * | 9/2011 | Kobayashi et al. ............. 257/59 |
| 2002/0009819 A1 | 1/2002 | Flewitt |
| 2005/0022864 A1 | 2/2005 | Fujioka et al. |
| 2005/0115930 A1 | 6/2005 | Tanaka et al. |
| 2009/0033818 A1 | 2/2009 | Nakajima et al. |
| 2009/0057683 A1 | 3/2009 | Nakajima et al. |
| 2009/0061574 A1 | 3/2009 | Nakajima et al. |

FOREIGN PATENT DOCUMENTS

| | | |
|---|---|---|
| EP | 0 535 979 A2 | 4/1993 |
| EP | 1 505 174 A1 | 2/2005 |
| JP | 57-071126 | 5/1982 |
| JP | 58-092217 | 6/1983 |
| JP | 59-072781 | 4/1984 |
| JP | 02-001174 | 1/1990 |
| JP | 03-185840 | 8/1991 |
| JP | 06-326312 | 11/1994 |
| JP | 2000-277439 | 10/2000 |
| JP | 2001-007024 | 1/2001 |
| JP | 2004-014958 | 1/2004 |
| JP | 2005-049832 | 2/2005 |
| JP | 2005-167051 | 6/2005 |
| WO | WO 02/07207 A1 | 1/2002 |

OTHER PUBLICATIONS

Arai, et al., "41.2: Micro Silicon Technology for Active Matrix OLED Dispay", SID Digest '07: SID International Symposium Digest of Technical Papers, vol. XXXVIII, pp. 1370-1373, 2007.

Fujiwara, et al., "Stress-Induced Nucleation of Microcrystalline Silicon From Amorphous Phase", Jpn. J. Appl. Phys. (Japanese Journal of Applied Physics), vol. 41/Part1, No. 5A, pp. 2821-2828, May 2002.

Kamei, et al., "A Significant Reduction of Impurity Contents in Hydrogenated Microcrystalline Silicon Films for Increased Grain Size and Reduced Defect Density", Jpn. J. Appl. Phys. (Japanese Journal of Applied Physics), vol. 37/Part2, No. 3A, pp. L265-L268, Mar. 1998.

Song et al., "34.1: Advanced Four-Mask Process Architecture for the A-Si TFT Array Manufacturing Method", SID Digest '02 : SID International Symposium Digest of Technical Papers, pp. 1038-1041, 2002.

Choi et al., "P-16: Novel Four-Mask Process in the FFS TFT-LCD With Optimum Multiple-Slit Design Applied by the Use of a Gray-Tone Mask", SID Digest '05: SID International Symposium Digest of Technical Papers, pp. 284-287, 2005.

Lee et al., "High-Mobility Nanocrystalline Silicon Thin-Film Transistors Fabricated by Plasma-Enhanced Chemical Vapor Deposition", Appl. Phys. Lett. (Applied Physics Letters), vol. 86, pp. 222106-1-222106-3, May 2005.

Lee et al., "High Mobility N-Channel and P-Channel Nanocrystalline Silicon Thin-Film Transistors", IEDM 05: Technical Digest of International Electron Devices Meeting, pp. 937-940, 2005.

Lee et al., "Directly Deposited Nanocrystalline Silicon Thin-Film Transistors With Ultra High Mobilities", Appl. Phys. Lett. (Applied Physics letters), vol. 89, pp. 252101-1-252101-3, Dec. 2006.

Lee et al., "How to Achieve High Mobility Thin Film Transistors by Direct Deposition of Silicon Using 13.56 MHz RF PECVD?", IEDM, pp. 295-298, 2006.

Esmaeili-Rad et al., "High Stability, Low Leakage Nanocrystalline Silicon Bottom Gate Thin Film Transistors for Amoled Displays", IEEE IEDM, pp. 303-306, 2006.

Lee et al., "Leakage Current Mechanisms in Top-Gate Nanocrystalline Silicon Thin Film Transistors", Appl. Phys. Lett. (Applied Physics Letters), vol. 92, pp. 083509-1-083509-3, Feb. 2008.

Lee et al., "Stability of nc-Si:H TFTs With Silicon Nitride Gate Dielectric", IEEE Transactions on Electron Devices, vol. 54, No. 1, pp. 45-51, Jan. 2007.

Sazonov et al., "Low-Temperature Materials and Thin Film Transistors for Flexible Electronics", Proceedings of the IEEE, vol. 93, No. 8, pp. 1420-1428, Aug. 2005.

Lee et al., "Top-Gate TFTs Using 13.56 MHz PECVD Microcrystalline Silicon", IEEE Electron Device Letters, vol. 26, No. 9, pp. 637-639, Sep. 2005.

Lee et al., "Postdeposition Thermal Annealing and Material Stability of 75° C. Hydrogenated Nanocrystalline Silicon Plasma-Enhanced Chemical Vapor Deposition Films", J. Appl. Phys. (Journal of Applied Physics), vol. 98, pp. 034305-1-034305-7, Aug. 2005.

Fujiwara et al., "Microcrystalline Silicon Nucleation Sites in the Sub-Surface of Hydrogenated Amorphous Silicon", Surface Science, vol. 497, pp. 333-340, 2002.

Fujiwara, et al., "Real-Time Spectroscopic Ellipsometry Studies of the Nucleation and Grain Growth Processes in Microcrystalline Silicon Thin Films", Phys. Rev. B (Physical Review. B), vol. 63, pp. 115306-1-115306-9, Feb. 2001.

* cited by examiner

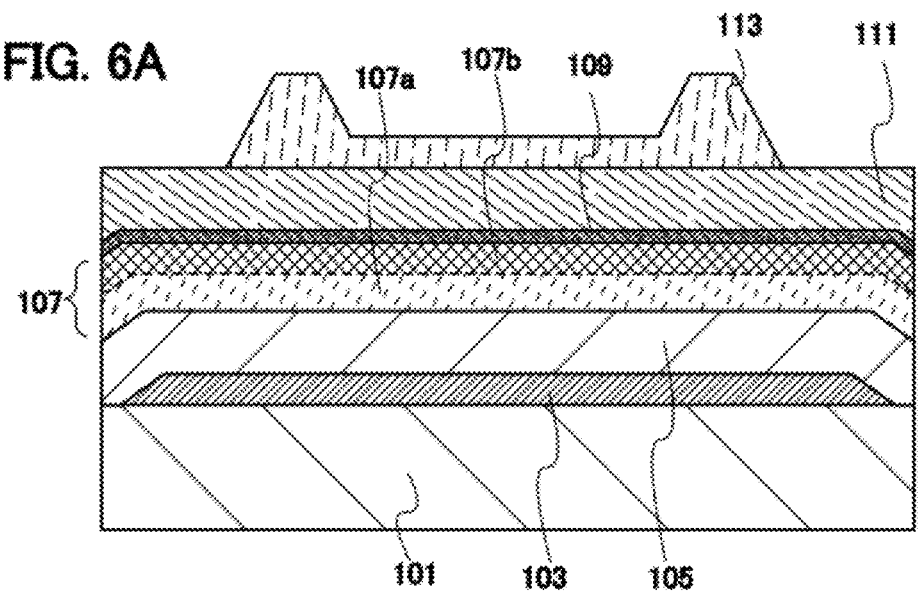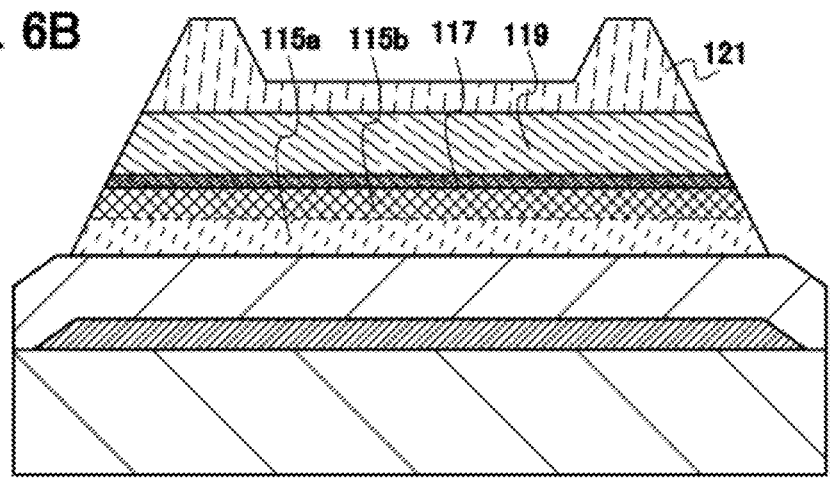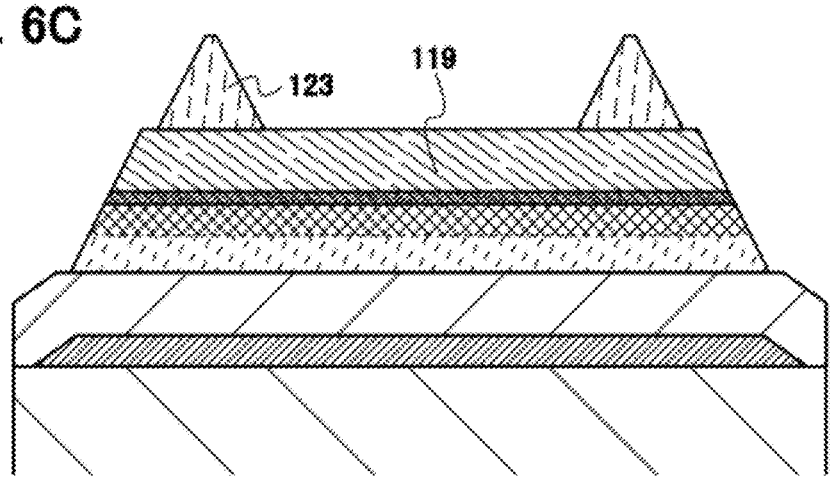

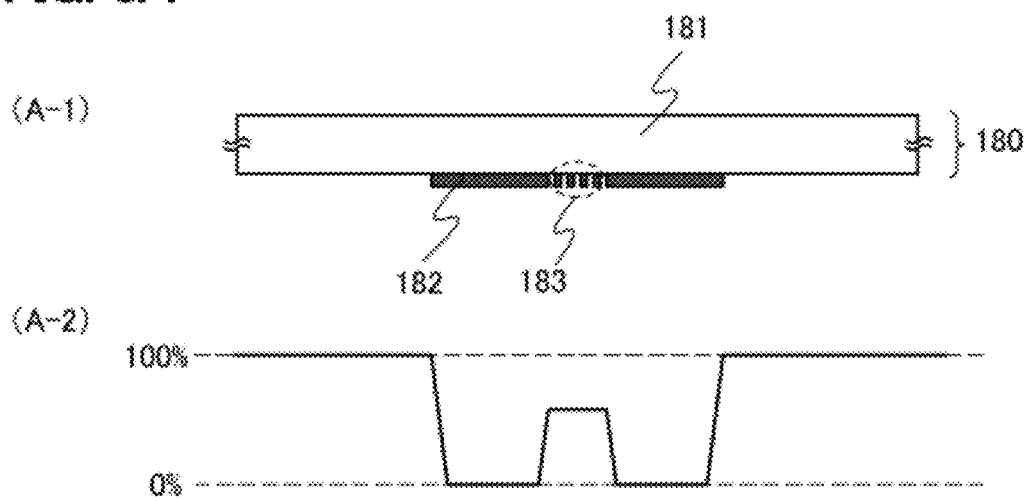
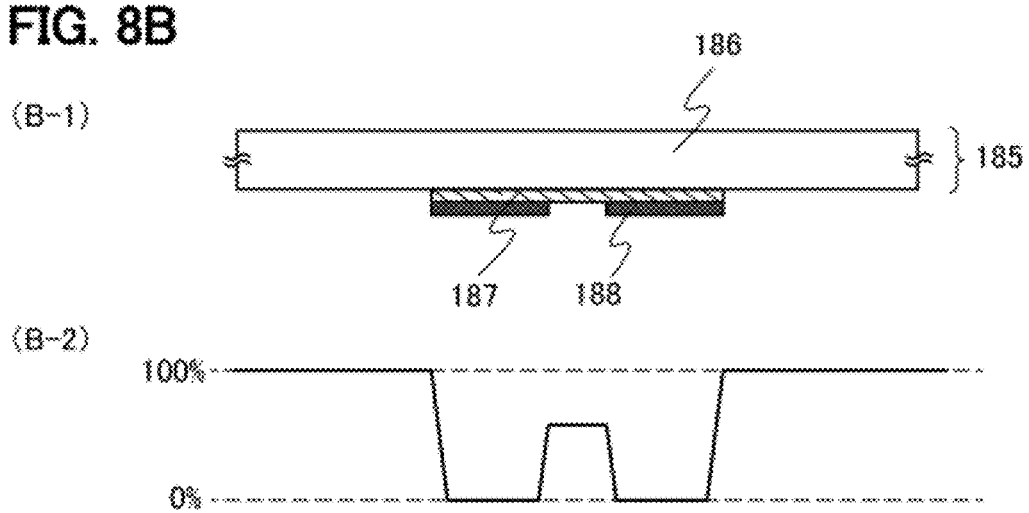

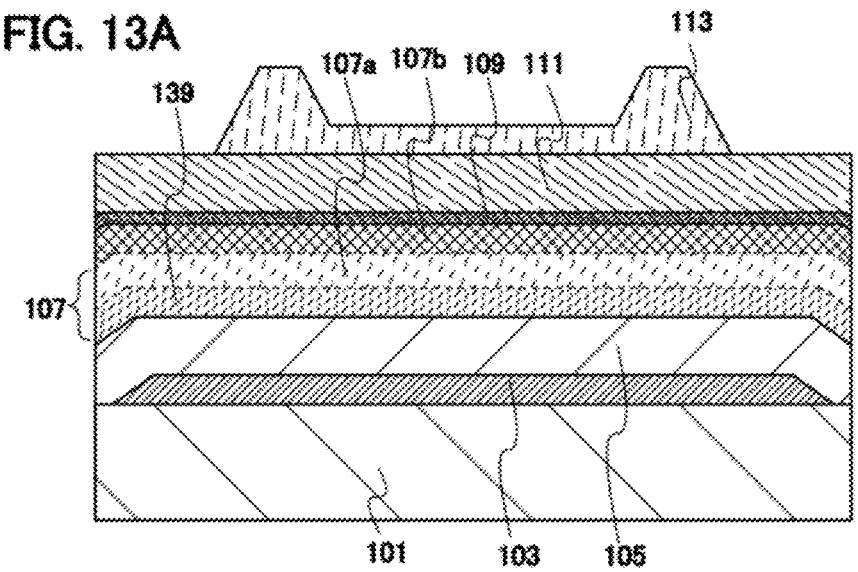
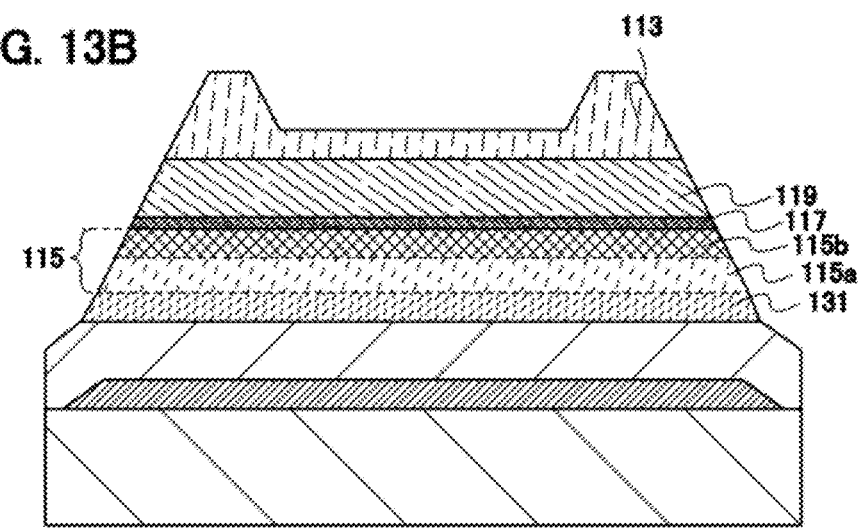

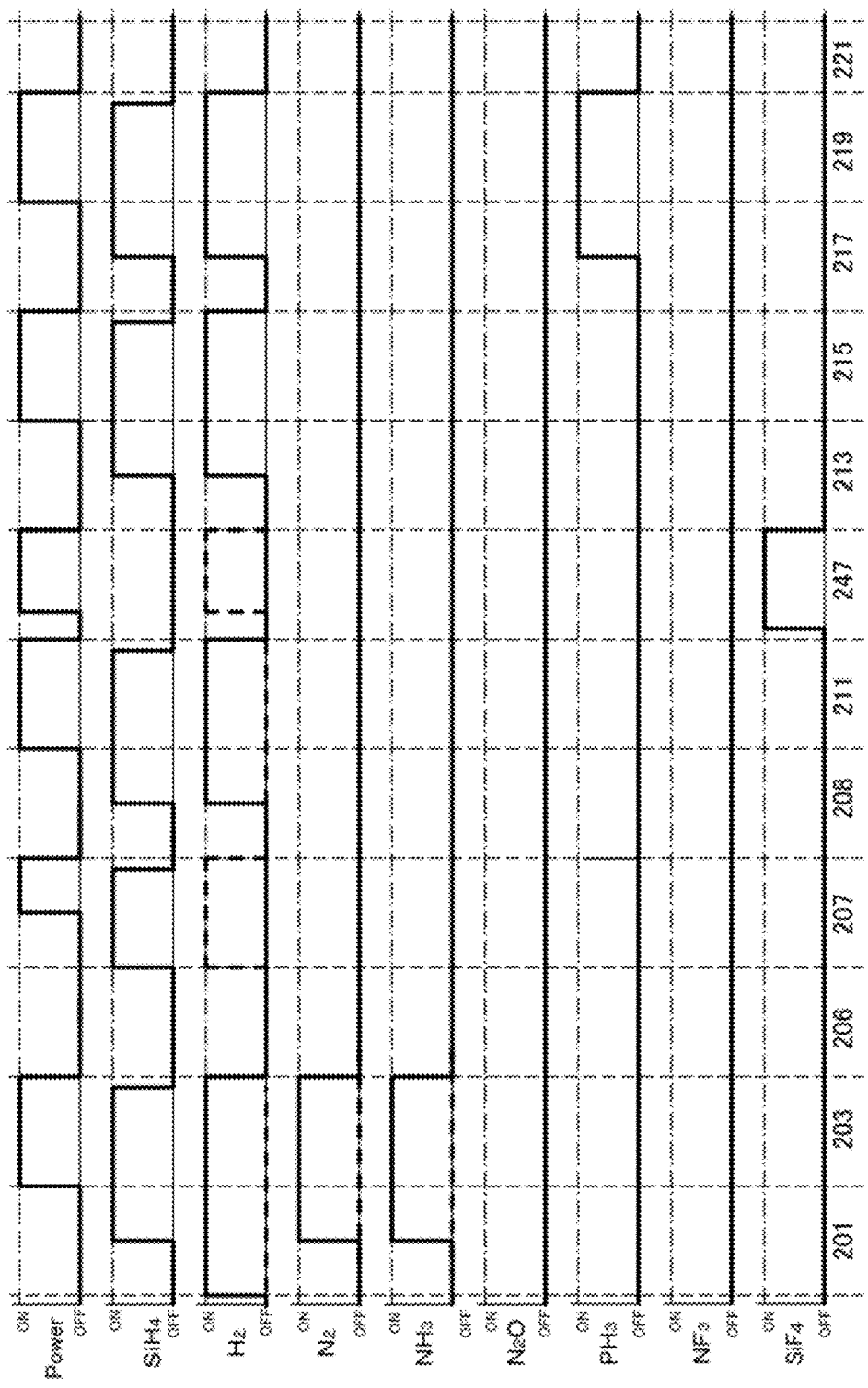

THIN FILM TRANSISTOR

BACKGROUND OF THE INVENTION

1. Field of the Invention

The present invention relates to a thin film transistor and a method for manufacturing the thin film transistor, and a semiconductor device and a display device using the thin film transistor.

2. Description of the Related Art

As a kind of field-effect transistor, a thin film transistor in which a channel formation region is formed in a semiconductor layer formed over a substrate having an insulating surface is known. Techniques in which amorphous silicon, microcrystalline silicon, or polycrystalline silicon is used for the semiconductor layer used in the thin film transistor have been disclosed.

Further, a technique for increasing the amount of current flowing between a source and a drain by forming contact layers in contact with a source electrode layer and a drain electrode layer (also referred to as a source region and a drain region) of a thin film transistor with the use of an n-type microcrystalline silicon has been disclosed (see Patent Document 1).

On the other hand, the size of a transistor has been reduced in order to improve resolution of a display device and increase the aperture ratio in a pixel, and a thin film transistor with a short channel length which is approximately an exposure limit of a light-exposure apparatus (MPA) has been considered. In a thin film transistor with a short channel length, an on current can be increased and a threshold voltage can be reduced.

[Patent Document 1] Japanese Published Patent Application No. H3-185840

SUMMARY OF THE INVENTION

In the case of a conventional microcrystalline semiconductor layer, an amorphous semiconductor layer having poor crystallinity and a lot of defects is deposited due to lattice mismatch with a base film in an early stage of deposition. Therefore, even when an n-type microcrystalline silicon film is formed as a contact layer, a low density layer having low density and a lot of defects is formed at the interface between the base film and the contact layer, which causes a problem that a barrier is formed at the interface between the base film and the contact layer, resistance between a source region and a drain region is increased, and thus the amount of current flowing through the regions is reduced.

Further, in general, in the case where a plasma CVD apparatus has low power in the deposition conditions of the n-type microcrystalline silicon film, formation of an amorphous layer in an early stage of deposition of the n-type microcrystalline silicon film can be suppressed. However, high power is required for crystallization for depositing the n-type microcrystalline silicon film. That is, the level of power for forming the n-type microcrystalline silicon film and the level of power for suppressing formation of the low density layer in an early stage of deposition of the n-type microcrystalline silicon film are contradictory to each other, which makes it difficult to form the microcrystalline silicon film in which the proportion of the low density layer at the interface is reduced.

On the other hand, FIGS. 21A to 21D illustrate structures of inverted-staggered thin film transistors. FIG. 21A is a cross-sectional view of a thin film transistor with a long channel length which is about 100 μm, in which a gate electrode layer 903 is formed over a substrate 901, a gate insulating layer 905 is formed over the gate electrode layer 903, a semiconductor layer 907 including a channel formation region is formed over the gate insulating layer 905, and a source region 909s and a drain region 909d which are paired are formed over the semiconductor layer 907. Further, a source electrode layer 911s and a drain electrode layer 911d are formed over the source region 909s and the drain region 909d, respectively. Further, the channel length of the thin film transistor illustrated in FIG. 21A is denoted by L1.

FIG. 21B illustrates an equivalent circuit of the thin film transistor illustrated in FIG. 21A. The resistance between the source region 909s and the semiconductor layer 907, the resistance of the channel formation region of the semiconductor layer 907, and the resistance between the semiconductor layer 907 and the drain region 909d are denoted by Rs, Rch1, and Rd, respectively.

FIG. 21C is a cross-sectional view of a thin film transistor with a short channel length which is 10 μm or less, preferably 5 μm or less, in which the gate electrode layer 903 is formed over the substrate 901, the gate insulating layer 905 is formed over the gate electrode layer 903, a semiconductor layer 913 including a channel formation region is formed over the gate insulating layer 905, and the source region 909s and the drain region 909d which are paired are formed over the semiconductor layer 913. Further, the source electrode layer 911s and the drain electrode layer 911d are formed over the source region 909s and the drain region 909d, respectively. Further, the channel length of the thin film transistor illustrated in FIG. 21C is denoted by L2 (0<L2<L1).

FIG. 21D illustrates an equivalent circuit of the thin film transistor illustrated in FIG. 21C. The resistance between the source region 909s and the semiconductor layer 913, the resistance of the channel formation region of the semiconductor layer 913, and the resistance between the semiconductor layer 913 and the drain region 909d are denoted by Rs, Rch2, and Rd, respectively.

In the thin film transistor with a long channel length which is about 100 μm in FIGS. 21A and 21B, the resistance Rch1 in the channel formation region is high; thus, influence of the resistance Rs between the source region 909s and the semiconductor layer 907 and the resistance Rd between the semiconductor layer 907 and the drain region 909d is ignorable.

However, in the thin film transistor with a channel length of 10 μm or less, preferably 5 μm or less in FIGS. 21C and 21D, the resistance Rch2 in the channel formation region is low because the channel length L2 is short; thus, influence of the resistance Rs between the source region 909s and the semiconductor layer 913 and the resistance Rd between the semiconductor layer 913 and the drain region 909d is not ignorable.

As a result, in the case where in the thin film transistor with a channel length of 10 μm or less, preferably 5 μm or less, the resistance Rs between the source region 909s and the semiconductor layer 913 and the resistance Rd between the semiconductor layer 913 and the drain region 909d are high, the amount of current flowing through the source region, the semiconductor layer, and the drain region is reduced. Accordingly, an on current and field effect mobility are significantly reduced.

Therefore, an object is to improve electric characteristics of an inverted-staggered thin film transistor.

According to an embodiment of the present invention, a gate electrode layer, a semiconductor layer, a gate insulating layer between the gate electrode layer and the semiconductor layer, source and drain regions in contact with the semiconductor layer, a source electrode layer in contact with the source region, and a drain electrode layer in contact with the drain region are provided over a substrate. Further, the source and drain regions are formed using a microcrystalline semiconductor layer to which an impurity imparting one conductivity type is added, and regions of the semiconductor layer, which are in contact with the source and drain regions, are formed of crystal regions. Further, the crystal regions in the semiconductor layer are not formed in a back channel region and separated from each other; thus, they make a pair. Further, the semiconductor layer includes a semiconductor layer including an amorphous semiconductor.

Since the regions of the semiconductor layer, which are in contact with the source and drain regions, are the pair of crystal regions, crystallinity at the interface between the semiconductor layer and the source and drain regions is improved. Further, since semiconductor materials are in contact with each other at the interface, lattice constants are matched and there are insignificant distortion and few defects. Further, since the source and drain regions are formed using a microcrystalline semiconductor layer to which an impurity imparting one conductivity type is added, resistivity is low. Therefore, the resistance between the semiconductor layer and the source region and the resistance between the semiconductor layer and the drain region can be reduced. Further, the pair of crystal regions are separated by the back channel region. Further, the semiconductor layer including an amorphous semiconductor is in contact with the pair of crystal regions. Therefore, carriers flow in the semiconductor layer including an amorphous semiconductor when the thin film transistor is off, so that an off current can be reduced.

Alternatively, the semiconductor layer may have a three-layer structure in which a microcrystalline semiconductor layer, a semiconductor layer including an amorphous semiconductor, and a pair of crystal regions are formed on the side in contact with the gate insulating layer. The microcrystalline semiconductor layer is formed in a region of the semiconductor layer, which is in contact with the gate insulating layer, so that crystallinity in a region through which carriers flow when the thin film transistor is on is excellent. Therefore, an on current and mobility of the thin film transistor can be increased.

Note that in the crystal regions in contact with the source and drain regions in the semiconductor layer, inverted conical or pyramidal crystal grains are formed. Alternatively, columnar crystal grains extending in the deposition direction are formed. Alternatively, in the crystal regions, crystal grains are randomly formed.

Further, an on current refers to a current flowing between the source region and the drain region, that is, through the channel formation region when the thin film transistor is on (that is, when an appropriate gate voltage is applied to the gate electrode layer in order that a current may flow through the channel formation region). Note that an on state in this case refers to a state in which a gate voltage (the difference between a potential of the gate electrode layer and a potential of the source region) exceeds the threshold voltage of the transistor. Further, an off current refers to a current flowing between the source region and the drain region, that is, through the channel formation region when the thin film transistor is off (that is, when the gate voltage of the thin film transistor is lower than the threshold voltage).

Crystallinity at the interface between the semiconductor layer formed over the gate insulating layer and the microcrystalline semiconductor layer to which an impurity imparting one conductivity type is added is improved, so that field effect mobility and an on current of the thin film transistor can be increased with an off current of the thin film transistor reduced.

BRIEF DESCRIPTION OF THE DRAWINGS

In the accompanying drawings:

FIGS. 6A to 6C are views illustrating an example of a method for manufacturing a thin film transistor according to an embodiment of the present invention;

FIGS. 8A and 8B are diagrams each illustrating an example of a method for manufacturing a thin film transistor according to an embodiment of the present invention;

FIGS. 13A and 13B are views illustrating a method for manufacturing a thin film transistor according to an embodiment of the present invention;

FIG. 16 is a time chart showing an example of a method for manufacturing a thin film transistor according to an embodiment of the present invention;

DETAILED DESCRIPTION OF THE INVENTION

Figure 1A:
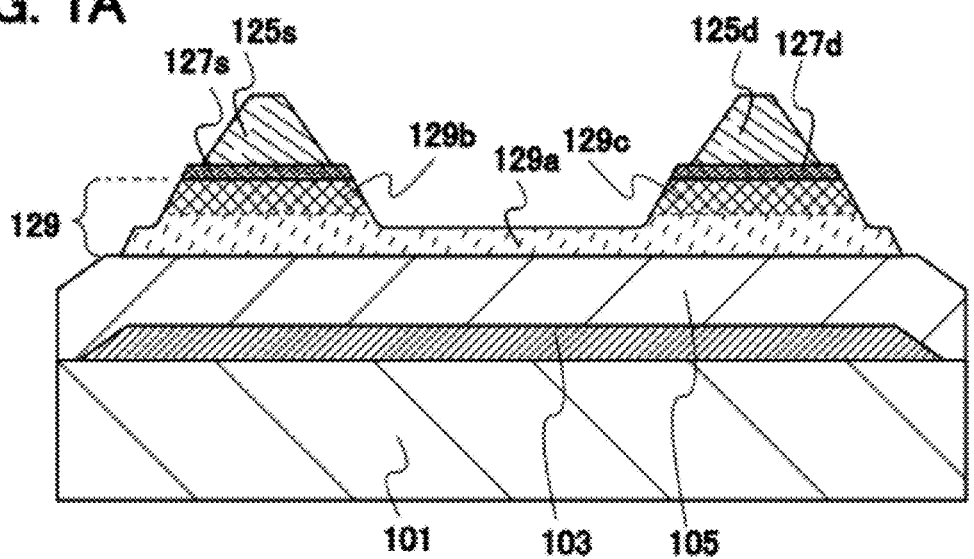
FIGS. 1A and 1B are views each illustrating a structure of a thin film transistor according to an embodiment of the present invention.

The embodiments and examples of the present invention to be disclosed will be described with reference to the drawings. However, the present invention disclosed herein is not limited to the following description because it will be easily understood by those skilled in the art that various changes and modifications can be made to the modes and their details without departing from the spirit and scope of the present invention disclosed herein. Therefore, the present invention disclosed herein should not be construed as being limited to the description in the following embodiments and examples. Note that in describing a structure of the present invention disclosed herein with reference to the drawings, common reference numerals are used for the same parts throughout the drawings. Further, the same hatched patterns are applied to the same parts, and the same parts are not especially denoted by reference numerals in some cases.

Embodiment 1

Figure 1B:
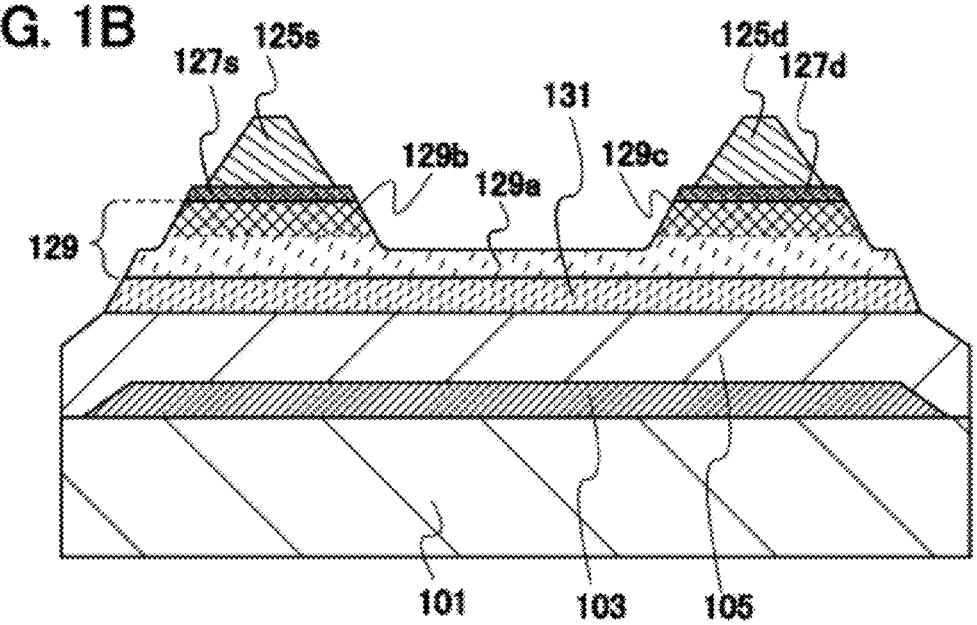

FIGS. 1A and 1B are cross-sectional views each illustrating a thin film transistor according to this embodiment. The thin film transistor illustrated in FIG. 1A includes, over a substrate 101, a gate electrode layer 103, a semiconductor layer 129, a gate insulating layer 105 between the gate electrode layer 103 and the semiconductor layer 129, a source region 127s and a drain region 127d which are in contact with the semiconductor layer 129, a source electrode layer 125s in contact with the source region 127s, and a drain electrode layer 125d in contact with the drain region 127d. The source region 127s and the drain region 127d are formed using a microcrystalline semiconductor layer to which an impurity imparting one conductivity type is added. In the semiconductor layer 129, regions in contact with the source region 127s and the drain region 127d are formed of crystal regions 129b and 129c. Further, the crystal regions 129b and 129c in the semiconductor layer 129 are not formed in a back channel region and separated from each other; thus, they make a pair. Further, the semiconductor layer 129 also includes a semiconductor layer 129a including an amorphous semiconductor.

The semiconductor layer 129 includes the semiconductor layer 129a including an amorphous semiconductor, and the crystal regions 129b and 129c. The semiconductor layer 129a including an amorphous semiconductor is formed on the gate insulating layer 105 side and the crystal regions 129b and 129c are formed on the side of the source region 127s and the drain region 127d. Further, the crystal regions 129b and 129c are separated to form the pair of crystal regions, and the semiconductor layer 129a including an amorphous semiconductor is exposed between the pair of crystal regions 129b and 129c.

Further, the source region 127s and the drain region 127d are formed using a microcrystalline semiconductor to which an impurity imparting one conductivity type is added and are in contact with the crystal regions 129b and 129c. Formation of a low density layer having many defects and low density is suppressed at the interface between the source and drain regions 127s and 127d and the crystal regions 129b and 129c, and thus characteristics of the interface can be improved. Therefore, resistance at the interface between the source and drain regions 127s and 127d and the crystal regions 129b and 129c can be reduced. As a result, the amount of current flowing through the source region, the semiconductor layer, and the drain region of the thin film transistor can be increased and an on current and field effect mobility can be increased.

Further, in the back channel region, since the crystal regions 129b and 129c are separated and the semiconductor layer 129a including an amorphous semiconductor is exposed, an off current flows through the source region 127s, the crystal region 129b, the semiconductor layer 129a including an amorphous semiconductor with low resistivity, the crystal region 129c, and the drain region 127d. Therefore, carriers do not easily flow in the semiconductor layer 129a including an amorphous semiconductor with low resistivity, so that an off current can be reduced.

In the semiconductor layer 129, the semiconductor layer 129a including an amorphous semiconductor can be formed using amorphous silicon, amorphous silicon germanium, amorphous silicon containing nitrogen, amorphous silicon germanium containing nitrogen, or the like. The semiconductor layer 129a including an amorphous semiconductor is formed to a thickness of from 10 nm to 100 nm, preferably from 20 nm to 50 nm.

The crystal regions 129b and 129c included in the semiconductor layer 129 are described with reference to FIGS. 2A to 2D. FIGS. 2A to 2D are enlarged views each illustrating a stack portion of the semiconductor layer 129a including an amorphous semiconductor, the crystal region 129b, and the source region 127s.

Figure 2A:
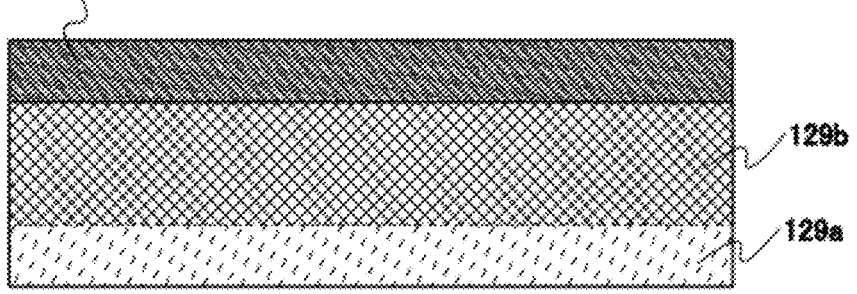
FIGS. 2A to 2D are views each illustrating a structure of a thin film transistor according to an embodiment of the present invention.

As illustrated in FIG. 2A, the interface between the semiconductor layer 129a including an amorphous semiconductor and the crystal region 129b can be substantially plane. To form this structure, a microcrystalline semiconductor may be formed as the crystal region 129b over a surface of the semiconductor layer 129a including an amorphous semiconductor.

Here, a microcrystalline semiconductor is a semiconductor having an intermediate structure between amorphous and crystalline structures (including a single crystal structure and a polycrystalline structure). A microcrystalline semiconductor is a semiconductor having a third state that is stable in terms of free energy and is a crystalline semiconductor having short-range order and lattice distortion, in which columnar or needle-like crystals having a grain size of from 2 nm to 200 nm, preferably from 10 nm to 80 nm, more preferably from 20 nm to 50 nm have grown in a direction normal to the substrate surface. Therefore, a crystal grain boundary is formed at the interface of the columnar or needle-like crystals in some cases (see FIG. 2A).

Further, the concentrations of oxygen and nitrogen contained in the crystal region 129b formed using a microcrystalline semiconductor, which are measured by secondary ion mass spectrometry, are preferably less than $1 \times 10^{18}$ atoms/cm$^3$.

The Raman spectrum of the microcrystalline silicon which is a typical example of a microcrystalline semiconductor is shifted toward lower wavenumber than 520 cm$^{-1}$ which represents the peak of the Raman spectrum of single crystal silicon. That is, a peak of the Raman spectrum of microcrystalline silicon lies between 520 cm$^{-1}$ which represents that of single crystal silicon, and 480 cm$^{-1}$ which represents that of amorphous silicon. The semiconductor contains at least 1 atomic % of hydrogen or halogen to terminate dangling bonds. Further, a rare gas element such as helium, argon, krypton, or neon may be contained to further promote lattice distortion, so that stability is enhanced and a favorable microcrystalline semiconductor can be obtained. Such description about a microcrystalline semiconductor is disclosed in, for example, U.S. Pat. No. 4,409,134.

Figure 2B:
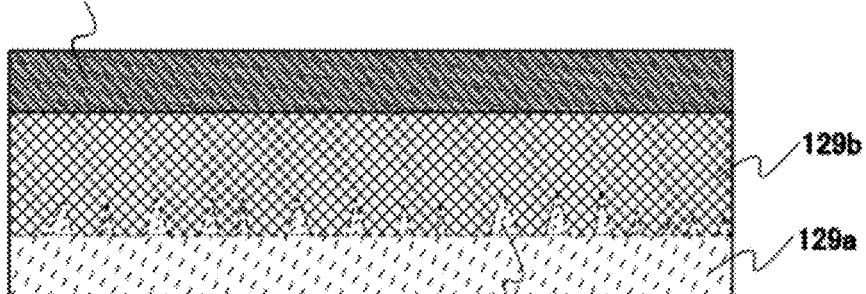

Further, as illustrated in FIG. 2B, a structure can be obtained in which the low density regions 129*d* are formed so that they are dispersed at the interface of the semiconductor layer 129*a* including an amorphous semiconductor and the crystal region 129*b*, and there are the interface at which the semiconductor layer 129*a* including an amorphous semiconductor and the crystal region 129*b* are in contact with each other and the interface at which the low density region 129*d* is formed between the semiconductor layer 129*a* including an amorphous semiconductor and the crystal region 129*b*.

As for the structure illustrated in FIGS. 2A and 2B, when the crystal region 129*b* is formed under the normal condition for depositing a microcrystalline semiconductor, the low density region 129*d* is also formed while the crystal region 129*b* formed using a microcrystalline semiconductor is formed in contact with the semiconductor layer 129*a* including an amorphous semiconductor.

Figure 2C:
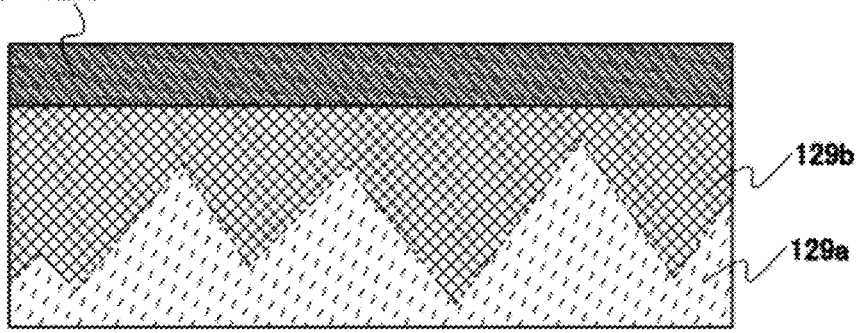

Further, as illustrated in FIG. 2C, the interface between the semiconductor layer 129*a* including an amorphous semiconductor and the crystal region 129*b* can be zigzagged. The microcrystalline semiconductor having an inverted conical or pyramidal shape grows in a thickness direction from a surface of the semiconductor layer 129*a* including an amorphous semiconductor and adjacent crystal grains are in contact with each other on the source region 127*s* side, so that the interface between the semiconductor layer 129*a* including an amorphous semiconductor and the crystal region 129*b* can be zigzagged as illustrated in FIG. 2C. That is to say, the interface between the semiconductor layer 129*a* including an amorphous semiconductor and the crystal region 129*b* becomes uneven.

The semiconductor layer 129*a* including an amorphous semiconductor and the crystal region 129*b* which are illustrated in FIG. 2C are formed by making the semiconductor layer containing silicon, germanium, or silicon germanium as a main component contain nitrogen.

The crystal region 129*b* is a crystal region in which inverted conical or pyramidal crystal grains come in contact with each other. Here, in an inverted-staggered thin film transistor, an inverted conical or pyramidal shape refers to a three-dimensional shape formed of (i) a base including a number of planes and (ii) lines connecting the periphery of the base and a vertex outside the base, in which the vertex is on the substrate 101 side. That is to say, the inverted conical or pyramidal shape is a shape growing in a direction in which the semiconductor layer 129*a* including an amorphous semiconductor and the crystal region 129*b* are deposited in a substantially radial fashion. Each of crystal nuclei formed discretely grows in an orientation of the crystals at the same time as the crystal region is formed, whereby crystal grains grow from crystal nuclei so as to spread in an in-plane direction of a plane perpendicular to a direction in which the crystal region 129*b* is deposited. The adjacent inverted conical or pyramidal crystal grains come in contact with each other, whereby the crystal region is formed. Further, the crystal grain includes a single crystal or a twin crystal.

As for such crystal grains, the nitrogen concentration in the semiconductor layer 129*a* including an amorphous semiconductor is set to from $1\times10^{20}$ cm$^{-3}$ to $1\times10^{21}$ cm$^{-3}$, preferably from $2\times10^{20}$ cm$^{-3}$ to $1\times10^{21}$ cm$^{-3}$, which is gradually reduced in a deposition direction up to from $3\times10^{20}$ cm$^{-3}$ to $1\times10^{21}$ cm$^{-3}$, whereby crystal nuclei are formed on a surface of the semiconductor layer 129*a* including an amorphous semiconductor, and crystal grains grow. Thus, the crystal region 129*b* is formed.

Figure 2D:
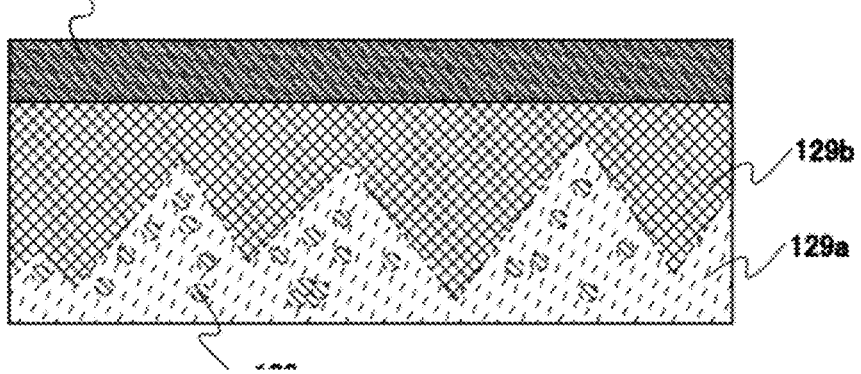

Further, there is also a mode of the semiconductor layer 129*a* including an amorphous semiconductor in which microcrystal grains 129*e* are dispersed as illustrated in FIG. 2D. The microcrystal grains 129*e* are microcrystal grains which cannot become crystal growth nuclei of the inverted conical or pyramidal grains. The microcrystal grains each typically have a size of from 1 nm to 10 nm, preferably from 1 nm to 5 nm. By controlling the nitrogen concentration in the semiconductor layer 129*a* including an amorphous semiconductor, the microcrystal grains can be formed. Further, a large amount of nitrogen is likely to be segregated on the outside of the microcrystal grains, that is, on the side which is in contact with an amorphous structure. Therefore, a large amount of nitrogen exists at the interface between the microcrystal grain and the amorphous structure. Alternatively, a large number of NH groups or NH$_2$ groups may exist at the interface between the microcrystal grain and the amorphous structure.

Note that the microcrystal grains 129*e* may be dispersed in the amorphous structure in the semiconductor layer 129*a* including an amorphous semiconductor. Alternatively, the microcrystal grains may be massed in the semiconductor layer 129*a* including an amorphous semiconductor. Still alternatively, dispersed microcrystal grains and massed microcrystal grains may exist.

Owing to the microcrystal grains, resistance in a vertical direction of the semiconductor layer 129*a* including an amorphous semiconductor, that is, resistance between the semiconductor layer and the source region or the drain region, can be reduced, whereby an on current of the thin film transistor can be increased.

A peak region of spectrum of the semiconductor layer 129*a* including an amorphous semiconductor having any of such shapes illustrated in FIGS. 2C and 2D, which is measured by low temperature photoluminescence spectroscopy, is from 1.31 eV to 1.39 eV. Further, the semiconductor layer 129*a* including an amorphous semiconductor has a steeper band tail slope of a band gap than an amorphous semiconductor typified by amorphous silicon. Therefore, the band gap becomes wide and thus a tunnel current do not easily flow as compared to a conventional amorphous semiconductor layer.

Note that as an impurity element which suppresses generation of crystal nuclei, oxygen and nitrogen can be given, and an impurity element (for example, nitrogen) which is in silicon and does not trap carriers is selected. On the other hand, the concentration of an impurity element (for example, oxygen) which reduces the coordination number of silicon and generates dangling bonds is reduced. Therefore, it is preferable to reduce the oxygen concentration without reducing the nitrogen concentration. Specifically, it is preferable that the oxygen concentration measured by secondary ion mass spectrometry be $5\times10^{18}$ cm$^{-3}$ or less.

Further, the semiconductor layer 129*a* including an amorphous semiconductor and the crystal region 129*b* contain NH groups or NH$_2$ groups in some cases. When NH groups are coupled to dangling bonds of different silicon atoms on the outside of the inverted conical or pyramidal microcrystal semiconductor, that is, at the interface between the inverted conical or pyramidal crystal grain and the amorphous structure, at the interface between the microcrystal grain and the amorphous structure, or in the dangling bond of an amorphous semiconductor, defects are reduced, and carriers easily flow. Accordingly, a bonding which facilitates the carrier transfer is formed in a crystal grain boundary or a defect, whereby the mobility of the silicon layer is increased. Accordingly, it is understood that the mobility of the thin film transistor is increased. Note that as density of the microcrystal grains is increased, crystallinity of the semiconductor layer is increased; however, the crystal grain boundaries interrupting carrier transfer are also increased. However, when the silicon layer contains the NH group, and the dangling bond of a different Si is cross-linked, the bonding becomes a path for carriers at the crystal grain boundary, whereby the carrier transfer is not interrupted.

Further, when the dangling bond of the silicon atom is terminated by $NH_2$ groups on the outside of the inverted conical or pyramidal microcrystal semiconductor, that is, at the interface between the inverted conical or pyramidal crystal grain and the amorphous structure, at the interface between the microcrystal grain and the amorphous structure, in the dangling bond of an amorphous semiconductor, generation of defect levels can be prevented. If there is a defect level, electrons and holes are generated and recombined by thermal excitation through the defect level, whereby a Shockley-Read-Hall current flows. However, when there is no defect level, the current can be reduced. Thus, by providing the semiconductor layer 129a including an amorphous semiconductor containing an $NH_2$ group in a region where an off current flows, the off current can be reduced.

Further, by reducing the oxygen concentration in the semiconductor layer, bonding which interrupts the carrier transfer in defects at the interface between the microcrystal grain and the amorphous structure and at the interface between the microcrystal grains can be reduced.

For the source region 127s and the drain region 127d, a microcrystalline semiconductor layer to which an impurity element imparting one conductivity type is added is formed. In the case of forming an n-channel thin film transistor, phosphorus may be used as an impurity element imparting one conductivity type. The thin film transistor is typically formed using a microcrystalline silicon layer which contains phosphorus. In the case of forming a p-channel thin film transistor, boron may be used as an impurity element imparting one conductivity type. The thin film transistor is typically formed using a microcrystalline silicon layer which contains boron.

By setting the concentration of an impurity element imparting one conductivity type, here, phosphorus or boron, to from $1×10^{19}$ cm$^{-3}$ to $1×10^{21}$ cm$^{-3}$, an ohmic contact with a source electrode layer 125s and a drain electrode layer 125d can be obtained. Further, since the source region 127s and the drain region 127d are formed using a microcrystalline semiconductor layer, resistance of the source region 127s and the drain region 127d can be reduced.

The source region 127s and the drain region 127d are formed to have a thickness of from 5 nm to 50 nm, preferably, from 10 nm to 30 nm. By reducing the thickness of the source region 127s and the drain region 127d, throughput can be increased. Further, by reducing the thickness of the source region 127s and the drain region 127d, stress can be reduced; thus, peeling at the source region 127s and the drain region 127d can be prevented.

Further, as illustrated in FIG. 1B, a microcrystalline semiconductor layer 131 may be formed between the gate insulating layer 105 and the semiconductor layer 129, that is, between the gate insulating layer 105 and the semiconductor layer 129a including an amorphous semiconductor.

Note that in the case of forming the semiconductor layer 129a including an amorphous semiconductor over the microcrystalline semiconductor layer 131, there is a case where in an early stage of deposition, crystals grow to have conical or pyramidal shapes by using the microcrystalline semiconductor layer 131 as a seed crystal, so that a surface of the microcrystalline semiconductor layer 131 becomes uneven. That is to say, when the interface between the microcrystalline semiconductor layer 131 and the semiconductor layer 129a including an amorphous semiconductor is uneven, the barrier at the interface between the microcrystalline semiconductor layer 131 and the semiconductor layer 129a including an amorphous semiconductor can be low and thus, an on current and field effect mobility can be increased.

In the thin film transistor, an on current flows in a semiconductor layer in contact with the gate insulating layer 105 and in the vicinity of the gate insulating layer 105. Therefore, by forming the microcrystalline semiconductor layer 131 over the gate insulating layer 105, crystallinity can be improved and resistivity can be reduced as compared to the semiconductor layer 129a including an amorphous semiconductor, so that an on current easily flows. Accordingly, an on current and field effect mobility of the thin film transistor can be further increased.

As the substrate 101, a glass substrate, a ceramic substrate, or a plastic substrate or the like with heat resistance which can withstand a process temperature in this manufacturing process can be used. In the case where the substrate does not need a light-transmitting property, a substrate obtained by providing an insulating layer on a surface of a substrate of a metal such as a stainless steel alloy may be used. As a glass substrate, for example, an alkali-free glass substrate of barium borosilicate glass, aluminoborosilicate glass, aluminosilicate glass, or the like may be used.

The gate electrode layer 103 can be formed to have a single-layer structure or a layered structure using a metal material such as molybdenum, titanium, chromium, tantalum, tungsten, aluminum, copper, neodymium, or scandium or an alloy material which contains any of these materials as its main component. Alternatively, a semiconductor layer typified by polycrystalline silicon doped with an impurity element such as phosphorus, or an AgPdCu alloy may be used.

For example, as a two-layer structure of the gate electrode layer 103, a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable. When a metal layer serving as a barrier layer is stacked over a layer with low electric resistance, a metal element can be prevented from diffusing from the layer with low electric resistance into the semiconductor layer.

The gate insulating layer 105 can be formed to have a single-layer structure or a layered structure using any of a silicon oxide layer, a silicon nitride layer, a silicon oxynitride layer, and a silicon nitride oxide layer by a CVD method, a sputtering method, or the like. By forming the gate insulating layer 105 using a silicon oxide layer or a silicon oxynitride layer, in the case of forming the microcrystalline semiconductor layer 131 over the gate insulating layer 105 as illustrated in FIG. 1B, fluctuation in threshold voltage of the thin film transistor can be reduced.

Note that in this specification, silicon oxynitride contains more oxygen than nitrogen and, in the case where measurements are performed using Rutherford backscattering spectrometry (RBS) and hydrogen forward scattering (HFS), contains oxygen, nitrogen, silicon, and hydrogen at concentrations of 50 to 70 at. %, 0.5 to 15 at. %, 25 to 35 at. %, and 0.1 to 10 at. %, respectively. Further, silicon nitride oxide contains more nitrogen than oxygen and, in the case where measurements are performed using RBS and HFS, contains oxygen, nitrogen, silicon, and hydrogen at concentrations of 5 to 30 at. %, 20 to 55 at. %, 25 to 35 at. %, and 10 to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The source electrode layer 125s and the drain electrode layer 125d can be formed to have a single-layer structure or a layered structure using any of aluminum, copper, titanium, neodymium, scandium, molybdenum, chromium, tantalum, tungsten, and the like. Alternatively, an aluminum alloy to which an element to prevent a hillock is added (for example, an aluminum-neodymium alloy which can be used for the gate electrode layer 103) may be used. Alternatively, a crystalline silicon layer to which an impurity element serving as a donor is added may be used. The source electrode layer 125s and the drain electrode layer 125d may have a layered structure in which a layer on the side in contact with the crystalline silicon layer to which an impurity element serving as a donor is added is formed using titanium, tantalum, molybdenum, tungsten, or a nitride of any of these elements and aluminum or an aluminum alloy is formed thereover. Alternatively, another layered structure may be employed in which a top surface and a bottom surface of a layer of aluminum or an aluminum alloy are sandwiched between titanium, tantalum, molybdenum, tungsten, or a nitride of any of these elements. For example, the source electrode layer 125s and the drain electrode layer 125d preferably have a three-layer structure in which an aluminum layer is sandwiched between molybdenum layers.

According to this embodiment, field effect mobility and an on current of the thin film transistor can be increased with an off current of the thin film transistor reduced. In particular, in the thin film transistor in which a channel length is 10 μm or less, typically, from 2 μm to 5 μm, resistance between the semiconductor layer and the source and drain regions 127s and 127d can be reduced, so that an on current and mobility of the thin film transistor can be increased.

Embodiment 2

This embodiment will describe a structure of a semiconductor layer in which crystallinity of the interface between the semiconductor layer 129a including an amorphous semiconductor and the crystal regions 129b and 129c can be improved with reference to FIGS. 3A and 3B and 4A and 4B.

Figure 3A:
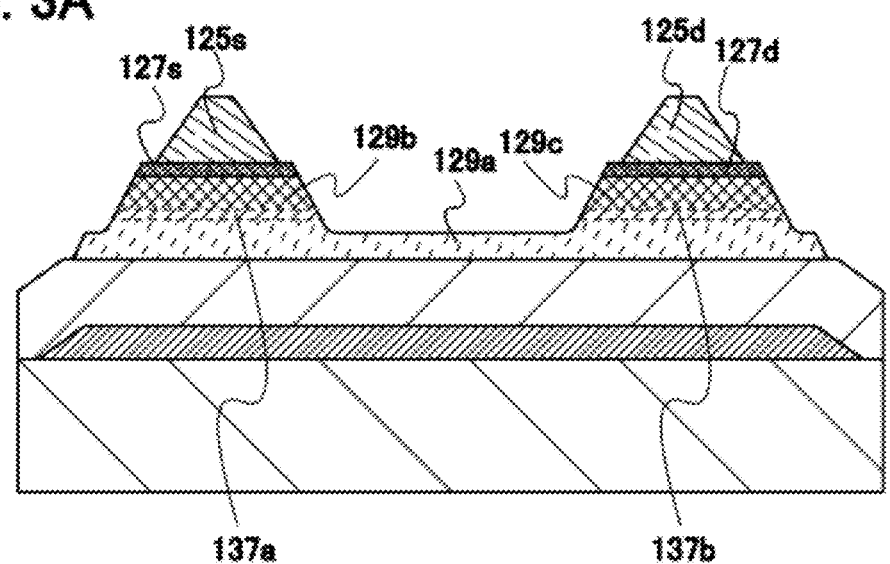
FIGS. 3A and 3B are views each illustrating a structure of a thin film transistor according to an embodiment of the present invention.

FIG. 3A illustrates the thin film transistor in FIG. 1A described in Embodiment 1 in which semiconductor layers 137a and 137b each containing a halogen element are additionally provided at the interface between the semiconductor layer 129a including an amorphous semiconductor and the crystal regions 129b and 129c.

The semiconductor layers 137a and 137b each containing a halogen element are formed using microcrystalline silicon containing fluorine or chlorine or microcrystalline silicon germanium containing fluorine or chlorine.

Figure 4A:
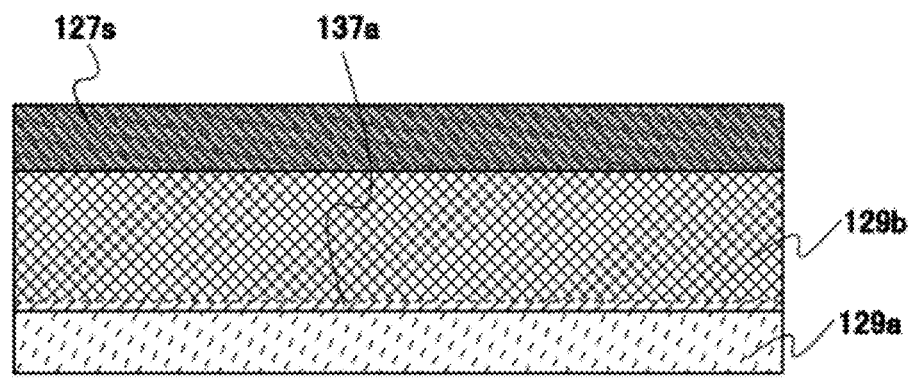
FIGS. 4A and 4B are views each illustrating a structure of a thin film transistor according to an embodiment of the present invention.
Figure 4B:
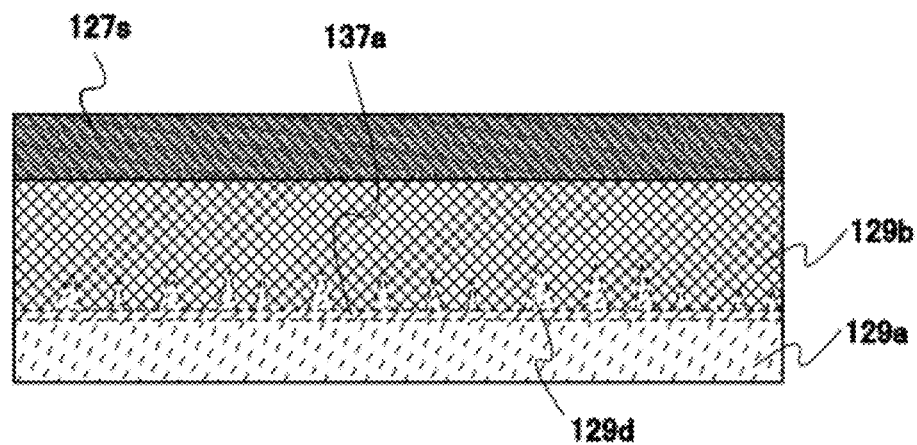

FIGS. 4A and 4B are enlarged views each illustrating a stack portion of the semiconductor layer 129a including an amorphous semiconductor, the semiconductor layer 137a containing a halogen element, the crystal region 129b, and the source region 127s.

As illustrated in FIG. 4A, the interfaces between the semiconductor layer 129a including an amorphous semiconductor and the semiconductor layer 137a containing a halogen element and between the semiconductor layer 137a containing a halogen element and the crystal region 129b can be substantially plane. To form this structure, a microcrystalline semiconductor may be formed as the crystal region 129b on a surface of the semiconductor layer 137a containing a halogen element.

Further, as illustrated in FIG. 4B, a structure can be obtained in which the low density regions 129d are formed to be separated at the interface between the semiconductor layer 137a containing a halogen element and the crystal region 129b, and there are the interface at which the semiconductor layer 137a containing a halogen element and the crystal region 129b are in contact with each other and the interface at which the low density region 129d is formed between the semiconductor layer 137a containing a halogen element and the crystal region 129b.

In the case of forming a semiconductor layer over the semiconductor layers 137a and 137b each containing a halogen element, the semiconductor layer can be formed to include a small amount of amorphous semiconductor and have excellent crystallinity owing to the semiconductor layers 137a and 137b each containing a halogen element. Accordingly, by using the semiconductor layers 137a and 137b each containing a halogen element as seed crystals, the crystal regions 129b and 129c are formed without including a low density layer at the interface between the semiconductor layers 137a and 137b each containing a halogen element. Further, by using the crystal regions 129b and 129c as seed crystals, a microcrystalline semiconductor layer to which an impurity element imparting one conductivity type is added is formed.

Since the proportion of the low density layer with high resistivity is reduced at the interface between the source and drain regions 127s and 127d and the crystal regions 129b and 129c, resistance in the regions can be reduced. Accordingly, the amount of current flowing through the source region, the semiconductor layer, and the drain region of the thin film transistor can be increased and an on current and field effect mobility can be increased.

Figure 3B:
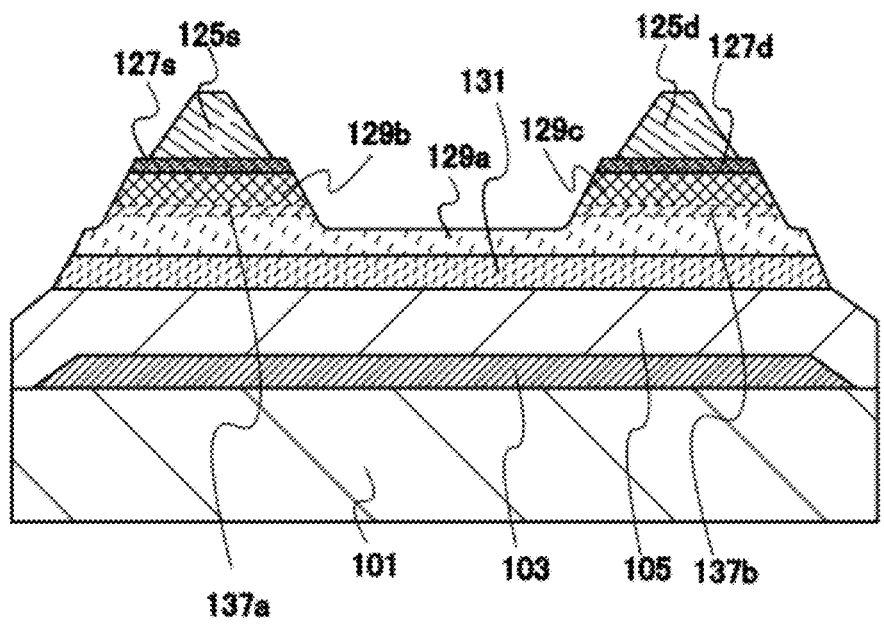

Further, as illustrated in FIG. 3B, the microcrystalline semiconductor layer 131 may be formed between the gate insulating layer 105 and the semiconductor layer 129, that is, between the gate insulating layer 105 and the semiconductor layer 129a including an amorphous semiconductor in a manner similar to that of FIG. 1B.

In the thin film transistor, an on current flows in a semiconductor layer in contact with the gate insulating layer 105 and in the vicinity of the gate insulating layer 105. Therefore, by forming the microcrystalline semiconductor layer 131 over the gate insulating layer 105, crystallinity can be improved and resistivity can be reduced as compared to the semiconductor layer 129a including an amorphous semiconductor, so that an on current easily flows. Accordingly, an on current and field effect mobility of the thin film transistor can be further increased.

Embodiment 3

Figure 5:
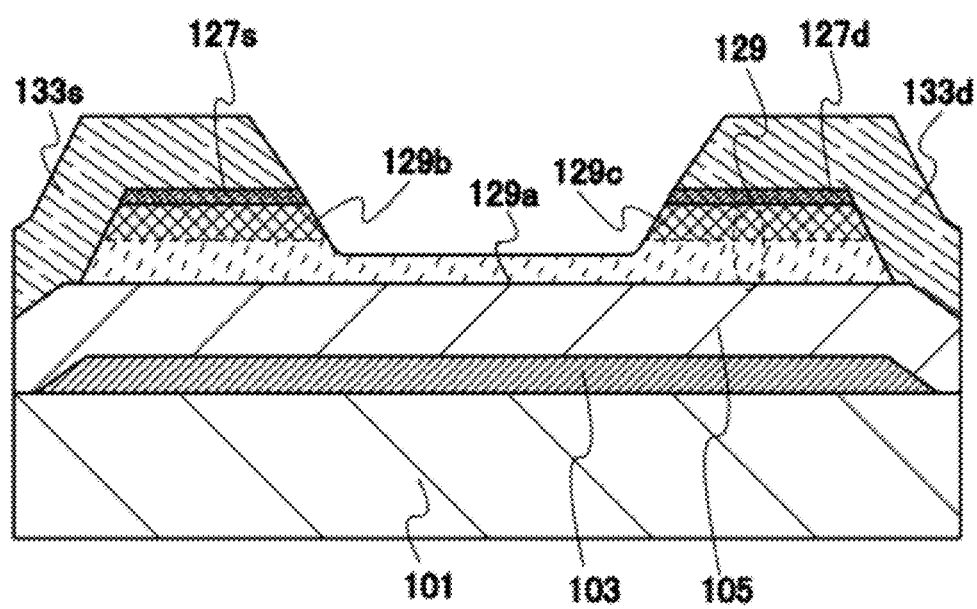
FIG. 5 is a view illustrating a structure of a thin film transistor according to an embodiment of the present invention.

This embodiment will describe a structure applicable to Embodiments 1 and 2 with reference to FIG. 5.

Embodiments 1 and 2 describe the thin film transistor in which the source electrode layer 125s and the drain electrode layer 125d are in contact with the source region 127s and the drain region 127d, respectively, but are not in contact with the semiconductor layer 129. The thin film transistor in this embodiment includes a source electrode layer 133s in contact with the source region 127s, the semiconductor layer 129a including an amorphous semiconductor, and the crystal region 129b and a drain electrode layer 133d in contact with the drain region 127d, the semiconductor layer 129a including an amorphous semiconductor, and the crystal region 129c, instead of the source electrode layer 125s and the drain electrode layer 125d.

Note that in FIG. 5, end portions of the source electrode layer 133s and the drain electrode layer 133d and end portions of the source region 127s and the drain region 127d are aligned respectively; however, the present invention is not limited thereto. The end portions of the source electrode layer 133s and the source region 127s may be misaligned and the source region 127s may be exposed. Similarly, the end portions of the drain electrode layer 133d and the drain region 127d may be misaligned and the drain region 127d may be exposed.

Embodiment 4

This embodiment will describe a method for manufacturing a thin film transistor described in Embodiment 1 with reference to FIGS. 6A to 6C and 7A and 7B. An n-channel thin film transistor has higher carrier mobility than a p-channel thin film transistor, and it is preferable that all thin film transistors formed over the same substrate have the same polarity because the number of manufacturing steps can be reduced. Therefore, in this embodiment, a method for manufacturing an n-channel thin film transistor will be described.

The gate electrode layer 103 is formed over the substrate 101. Then, the gate insulating layer 105, a semiconductor layer 107, a microcrystalline semiconductor layer 109 to which an impurity imparting one conductivity type is added, and a conductive layer 111 are formed so as to cover the gate electrode layer 103. After that, a resist mask 113 is formed over the conductive layer 111 (see FIG. 6A).

As the substrate 101, the substrate 101 described in Embodiment 1 can be used as appropriate.

The gate electrode layer 103 is formed using a material used for the gate electrode layer 103 described in Embodiment 1 as appropriate. The gate electrode layer 103 can be formed in such a manner that a conductive layer is formed over the substrate 101 with the use of the above material by a sputtering method or a vacuum evaporation method, a mask is formed over the conductive layer by a photolithography method, an ink-jet method, or the like, and the conductive layer is etched using the mask. Alternatively, the gate electrode layer 103 can be formed by discharging a conductive nanopaste of silver, gold, copper, or the like over the substrate by an ink-jet method and baking the conductive nanopaste. Note that a nitride layer of any of the above metal materials may be provided between the substrate 101 and the gate electrode layer 103 as barrier metal in order to increase adhesion between the gate electrode layer 103 and the substrate 101. Here, a conductive layer is formed over the substrate 101 and then etched using a resist mask formed using a photomask.

Note that it is preferable that side surfaces of the gate electrode layer 103 have tapered shapes so that disconnection of the semiconductor layer and the wiring layer formed over the gate electrode layer 103 in the later step at a step portion can be prevented. In order to form the side surfaces of the gate electrode layer 103 to have tapered shapes, etching may be performed while the resist mask is made to recede.

Through the step of forming the gate electrode layer 103, a gate wiring (a scan line) and the capacitor wiring can also be formed at the same time. Note that a "scan line" means a wiring which selects a pixel, while a "capacitor wiring" means a wiring which is connected to one of electrodes of a storage capacitor in a pixel. However, without limitation thereto, the gate electrode layer 103 and one or both of a gate wiring and a capacitor wiring may be formed separately.

The gate insulating layer 105 can be formed using any of the materials for the gate insulating layer 105 described in Embodiment 1 as appropriate. The gate insulating layer 105 can be formed by a CVD method, a sputtering method, or the like. Further, the gate insulating layer 105 may be formed using a microwave plasma CVD apparatus with a high frequency (1 GHz or more). By forming the gate insulating layer 105 by a microwave plasma CVD apparatus with a high frequency, the withstand voltage between a gate electrode layer and source and drain electrode layers can be improved; therefore, a highly reliable thin film transistor can be obtained. Further, by forming a silicon oxide layer as the gate insulating layer 105 by a CVD method using an organosilane gas, the amount of hydrogen contained in the gate insulating layer can be reduced and fluctuation in threshold voltage of the thin film transistor can be reduced. As the organosilane gas, a silicon-containing compound such as tetraethoxysilane (TEOS) (chemical formula: $Si(OC_2H_5)_4$), tetramethylsilane (TMS) (chemical formula. $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

For the semiconductor layer 107, a semiconductor layer 107a including an amorphous semiconductor and a crystal region 107b are formed. The semiconductor layer 107a including an amorphous semiconductor is formed using amorphous silicon, amorphous silicon germanium, or the like. The semiconductor layer 107a including an amorphous semiconductor is formed to a thickness of from 10 nm to 100 nm, preferably from 20 nm to 50 nm.

In a treatment chamber of a plasma CVD apparatus, a deposition gas containing silicon or germanium is introduced and an amorphous semiconductor layer is formed by glow discharge plasma as the semiconductor layer 107a including an amorphous semiconductor. Alternatively, a deposition gas containing silicon or germanium is diluted with one or plural kinds of rare gas elements selected from helium, argon, krypton, and neon, and an amorphous semiconductor layer is formed by glow discharge plasma. Still alternatively, a deposition gas containing silicon or germanium and hydrogen with a flow rate of 1 to 10 times, preferably 1 to 5 times as high as that of the deposition gas are mixed, and an amorphous semiconductor layer is formed by glow discharge plasma. Note that a halogen such as fluorine or chlorine, nitrogen, or the like may be added to the semiconductor layer 107a including an amorphous semiconductor.

As typical examples of the deposition gas containing silicon or germanium, $SiH_4$, $Si_2H_6$, $GeH_4$, and $Ge_2H_6$ are given.

Note that before the semiconductor layer 107a including an amorphous semiconductor is formed, impurity elements in the treatment chamber of the CVD apparatus are removed by introducing a deposition gas containing silicon or germanium with the air in the treatment chamber exhausted, so that impurities at the interface between the gate insulating layer 105 and the semiconductor layer 107a including an amorphous semiconductor of the thin film transistor to be formed later can be reduced and thus, electric characteristics of the thin film transistor can be improved.

The crystal region 107b is formed using microcrystalline silicon, microcrystalline silicon germanium, or the like. The crystal region 107b is formed to a thickness of from 10 nm to 100 nm, preferably from 30 nm to 50 nm. In the treatment chamber of the plasma CVD apparatus, a deposition gas containing silicon or germanium is mixed with hydrogen, and the crystal region 107b is formed by glow discharge plasma. The microcrystalline silicon, the microcrystalline silicon germanium, or the like is formed using a mixture of the deposition gas containing silicon or germanium and hydrogen, which is obtained by diluting the deposition gas with hydrogen whose flow rate is 10 to 2000 times, preferably 50 to 200 times that of the deposition gas.

The microcrystalline semiconductor layer 109 to which an impurity imparting one conductivity type is added is formed using microcrystalline silicon to which phosphorus is added, microcrystalline silicon germanium to which phosphorus is added, microcrystalline germanium to which phosphorus is added, or the like. The microcrystalline semiconductor layer 109 to which an impurity imparting one conductivity type is added is formed to a thickness of from 5 nm to 50 nm, preferably from 10 nm to 30 nm. In the treatment chamber of the plasma CVD apparatus, a deposition gas containing silicon or germanium, hydrogen, and phosphine (diluted with hydrogen or silane) are mixed and the microcrystalline semiconductor layer 109 to which an impurity imparting one conductivity type is added is formed by glow discharge plasma. The microcrystalline silicon to which phosphorus is added, the microcrystalline silicon germanium to which phosphorus is added, the microcrystalline germanium to which phosphorus is added, or the like is formed using a mixture of the deposition gas containing silicon or germanium and hydrogen, which is obtained by diluting the deposition gas with hydrogen with a flow rate of 10 to 2000 times, preferably 50 to 200 times as high as that of the deposition gas.

Further, in the case of forming a p-channel thin film transistor, the microcrystalline semiconductor layer 109 to which an impurity imparting one conductivity type is added is formed by a plasma CVD method using a deposition gas containing silicon or germanium, diborane, and hydrogen.

In the steps for forming the semiconductor layer 107a including an amorphous semiconductor, the crystal region 107b, and the microcrystalline semiconductor layer 109 to which an impurity imparting one conductivity type is added, glow discharge plasma is generated by applying high-frequency power with a frequency of 3 MHz to 30 MHz, typically 13.56 MHz or 27.12 MHz, or high-frequency power with a frequency in the VHF band of over 30 MHz up to about 300 MHz, typically 60 MHz.

Figure 9:
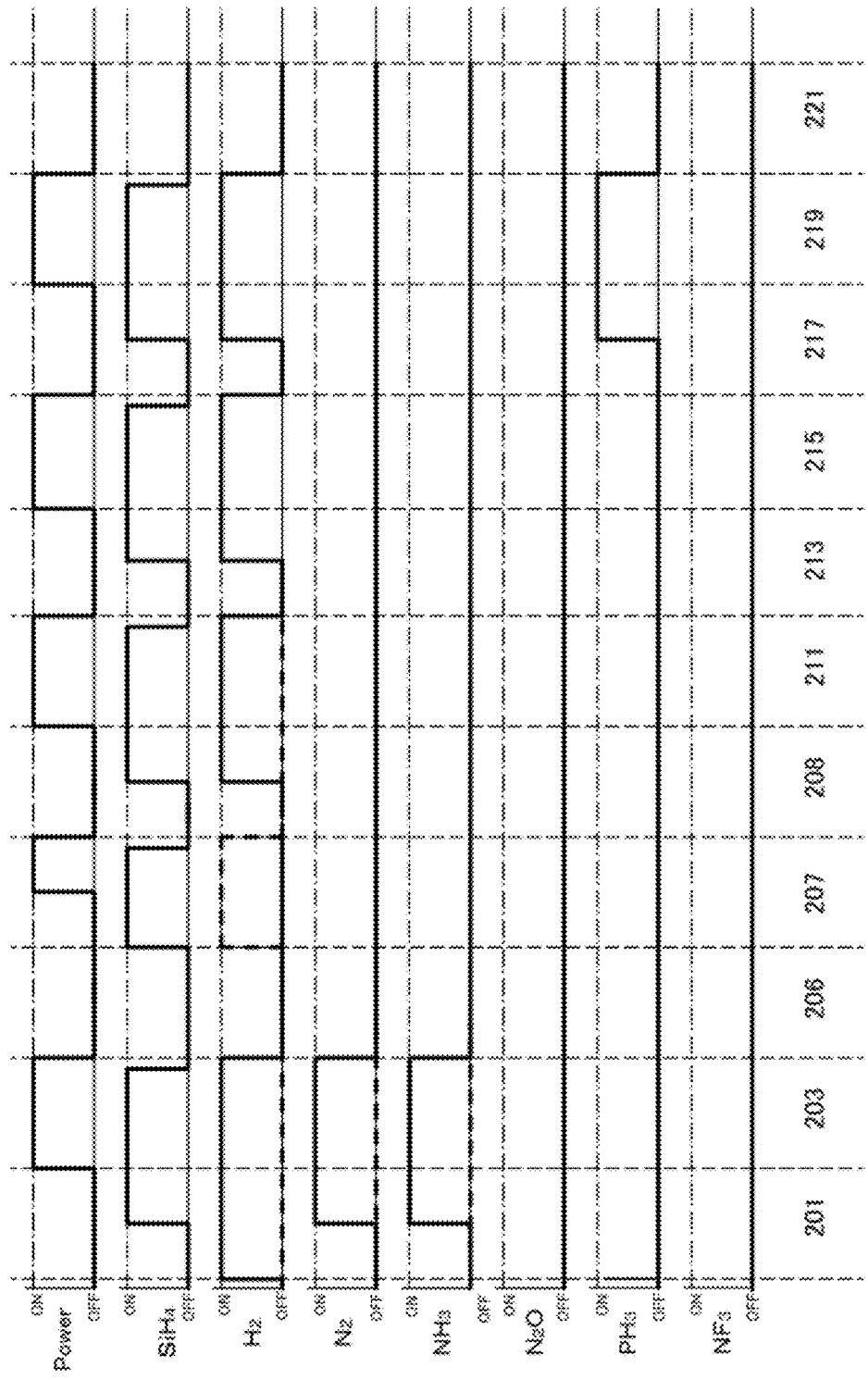
FIG. 9 is a time chart showing an example of a method for manufacturing a thin film transistor according to an embodiment of the present invention.

First, the substrate 101 over which the gate electrode layer 103 is formed is heated in the treatment chamber of the CVD apparatus, and in order to form a silicon nitride layer as the gate insulating layer 105, source gases for forming the silicon nitride layer are introduced into the treatment chamber (pretreatment 201 in FIG. 9). Here, for example, a silicon nitride layer with a thickness of about 110 nm is formed in such a manner that the source gases are introduced and stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge with an output of 370 W is performed, where the pressure in the treatment chamber is 100 Pa and the temperature of the substrate is 280° C. After that, only the supply of $SiH_4$ is stopped, and after several seconds, the plasma discharge is stopped (formation of SiN 203 in FIG. 9). This is because if plasma discharge is stopped in a state where $SiH_4$ is present in the treatment chamber, grains or particles containing silicon as the main component are formed, which causes reduction in yield.

Through the above steps, the gate insulating layer 105 can be formed. After the gate insulating layer 105 is formed, the source gases used for depositing the silicon nitride layer are exhausted, and the substrate 101 is carried out of the treatment chamber (unload 206 in FIG. 9).

Next, a source gas for forming an amorphous silicon layer as a protective layer is introduced into the treatment chamber and treatment for forming the amorphous silicon layer in the treatment chamber is performed (precoating treatment 207 in FIG. 9). By coating the inner wall of treatment chamber with the amorphous silicon layer, it is possible to prevent an impurity attached to the inner wall of the treatment chamber, an element for forming the inner wall of the treatment chamber, or the silicon nitride layer formed as the gate insulating layer from being mixed into the semiconductor layer 107a including an amorphous semiconductor to be formed later. Although the amorphous silicon layer is formed using only $SiH_4$ here in order to increase the deposition rate of the amorphous silicon layer, hydrogen may also be introduced into the treatment chamber as shown by a dashed line of the precoating treatment 207 in FIG. 9.

After that, the substrate 101 is carried into the treatment chamber, and source gases for depositing an amorphous silicon layer as the semiconductor layer 107a including an amorphous semiconductor is introduced into the treatment chamber (load 208 in FIG. 9).

Next, an amorphous silicon layer is formed as the semiconductor layer 107a including an amorphous semiconductor over an entire surface of the gate insulating layer 105. First, source gases for forming the amorphous silicon layer as the semiconductor layer 107a including an amorphous semiconductor are introduced into the treatment chamber. Here, for example, an amorphous silicon layer with a thickness of about 50 nm is formed in such a manner that the source gases are introduced and stabilized, where the flow rate of $SiH_4$ is 280 sccm and the flow rate of $H_2$ is 300 sccm, and plasma discharge with an output of 60 W is performed, where the pressure in the treatment chamber is 170 Pa and the temperature of the substrate is 280° C. After that, in a manner similar to that of formation of the silicon nitride layer described above, only the supply of $SiH_4$ is stopped, and after several seconds, the plasma discharge is stopped (formation of a-Si 211 in FIG. 9).

Next, a microcrystalline silicon layer is formed as the crystal region 107b over an entire surface of the semiconductor layer 107a including an amorphous semiconductor. First, source gases for forming the microcrystalline silicon layer as the crystal region 107b are introduced into the treatment chamber. Here, for example, a microcrystalline silicon layer with a thickness of about 50 nm is formed in such a manner that the source gases are introduced and stabilized, where the flow rate of $SiH_4$ is 10 sccm and the flow rate of $H_2$ is 1500 sccm, and plasma discharge with an output of 50 W is performed, where the pressure in the treatment chamber is 280 Pa and the temperature of the substrate is 280° C. After that, in a manner similar to that of formation of the silicon nitride layer or the like described above, only the supply of $SiH_4$ is stopped, and after several seconds, the plasma discharge is stopped (formation of crystal region 215 in FIG. 9).

Next, the microcrystalline semiconductor layer 109 to which an impurity imparting one conductivity type is added is formed over an entire surface of the crystal region 107b. First, source gases for forming a microcrystalline silicon layer to which phosphorus is added as the microcrystalline semiconductor layer 109 to which an impurity imparting one conductivity type is added are introduced into the treatment chamber. Here, for example, a semiconductor layer with a thickness of about 50 nm is formed in such a manner that the source gases are introduced and stabilized, where the flow rate of $SiH_4$ is 10 sccm, the flow rate of a mixed gas in which $PH_3$ is diluted with $H_2$ to 0.5 vol % is 30 sccm, and the flow rate of hydrogen is 1500 sccm, and plasma discharge with an output of 300 W is performed, where the pressure in the treatment chamber is 280 Pa and the temperature of the substrate is 280° C. After that, in a manner similar to that of formation of the silicon nitride layer or the like described above, only the supply of $SiH_4$ is stopped, and after several seconds, the plasma discharge is stopped (formation of impurity semiconductor layer 219 in FIG. 9). After that, these gases are exhausted (exhaust 221 in FIG. 9).

As described above, layers from the gate insulating layer 105 to the microcrystalline semiconductor layer 109 to which an impurity imparting one conductivity type is added can be formed (see FIG. 6A).

In this embodiment, since the microcrystalline semiconductor layer 109 to which an impurity imparting one conductivity type is added is formed over the crystal region 107b, crystal growth of the microcrystalline semiconductor layer 109 to which an impurity imparting one conductivity type is added occurs using the crystals of the surface of the crystal region 107b as seed crystals. Therefore, formation of a low density layer in an early stage of the deposition can be suppressed.

The conductive layer 111 can be formed using a material and a layered structure of the source electrode layer 125s and the drain electrode layer 125d described in Embodiment 1 as appropriate. The conductive layer 111 is formed by a CVD method, a sputtering method, or a vacuum evaporation method. Alternatively, the conductive layer 111 may be formed by discharging a conductive nanopaste of silver, gold, copper, or the like by a screen printing method, an ink-jet method, or the like and baking the conductive nanopaste. After that a second resist mask is formed over the conductive layer 111.

The resist mask 113 has two regions with different thicknesses and can be formed using a multi-tone mask. The multi-tone mask is used, so that the number of photomasks to be used and the number of manufacturing steps are reduced, which is preferable. In this embodiment, the multi-tone mask can be used in a step of forming a pattern of the semiconductor layer and a step of separating the semiconductor layer into a source region and a drain region.

A multi-tone mask is a mask capable of light exposure with multi-level amount of light, and typically, light exposure is performed with three levels of light amount to provide an exposed region, a half-exposed region, and an unexposed region. When the multi-tone mask is used, one-time light exposure and development process allow a resist mask with plural thicknesses (typically, two kinds of thicknesses) to be formed. Therefore, by using a multi-tone mask, the number of photomasks can be reduced.

FIGS. 8A-1 and 8B-1 are cross-sectional views of typical multi-tone masks. FIG. 8A-1 illustrates a gray-tone mask 180 and FIG. 8B-1 illustrates a half-tone mask 185.

The gray-tone mask 180 illustrated in FIG. 8A-1 includes a light-blocking portion 182 formed using a light-blocking layer on a substrate 181 having a light-transmitting property, and a diffraction grating portion 183 provided with a pattern of the light-blocking layer.

The diffraction grating portion 183 has slits, dots, mesh, or the like that is provided at intervals which are less than or equal to the resolution limit of light used for the exposure, whereby the light transmittance can be controlled. Note that the slits, dots, or mesh provided at the diffraction grating portion 183 may be provided periodically or non-periodically.

As the substrate 181 having a light-transmitting property, a quartz substrate or the like can be used. The light-blocking layer for forming the light-blocking portion 182 and the diffraction grating portion 183 may be formed using metal, preferably, chromium, chromium oxide, or the like.

In the case where the gray-tone mask 180 is irradiated with light for light exposure, as illustrated in FIG. 8A-2, the transmittance in the region overlapping with the light-blocking portion 182 is 0%, and the transmittance in the region where both the light-blocking portion 182 and the diffraction grating portion 183 are not provided is 100%. Further, the transmittance at the diffraction grating portion 183 is approximately in the range of 10 to 70%, which can be adjusted by the interval of slits, dots, or mesh of the diffraction grating, or the like.

The half-tone mask 185 illustrated in FIG. 8B-1 includes a semi-light-transmitting portion 187 which is formed on a substrate 186 having a light-transmitting property, using a semi-light-transmitting layer, and a light-blocking portion 188 formed using a light-blocking layer.

The semi-light-transmitting portion 187 can be formed using a layer of MoSiN, MoSi, MoSiO, MoSiON, CrSi, or the like. The light-blocking portion 188 may be formed using metal similar to that used for the light-blocking layer of the gray-tone mask, preferably, chromium, chromium oxide, or the like.

In the case where the half-tone mask 185 is irradiated with light for light exposure, as illustrated in FIG. 8B-2, the transmittance in the region overlapping with the light-blocking portion 188 is 0%, and the transmittance in the region where both the light-blocking portion 188 and the semi-light-transmitting portion 187 are not provided is 100%. Further, the transmittance in the semi-light-transmitting portion 187 is approximately in the range of 10 to 70%, which can be adjusted by the kind, the thickness, or the like of the material to be used.

By light exposure using the multi-tone mask and development, a resist mask which has regions having different thicknesses can be formed.

Next, with the use of the resist mask 113, the semiconductor layer 107, the microcrystalline semiconductor layer 109 to which an impurity imparting one conductivity type is added, and the conductive layer 111 are etched. Through this step, the semiconductor layer 107, the microcrystalline semiconductor layer 109 to which an impurity imparting one conductivity type is added, and the conductive layer 111 are separated for each element to form a semiconductor layer 115, the microcrystalline semiconductor layer 117 to which an impurity imparting one conductivity type is added, and the conductive layer 119 (FIG. 6B).

Next, the resist mask 113 is made to recede to form a separated resist masks 123. Ashing using oxygen plasma may be performed in order that the resist mask may be made to recede. Here, ashing is performed on the resist mask 113 so that the resist mask 113 is separated over the gate electrode layer. As a result, the resist masks 123 can be formed (FIG. 6C).

Figure 7A:
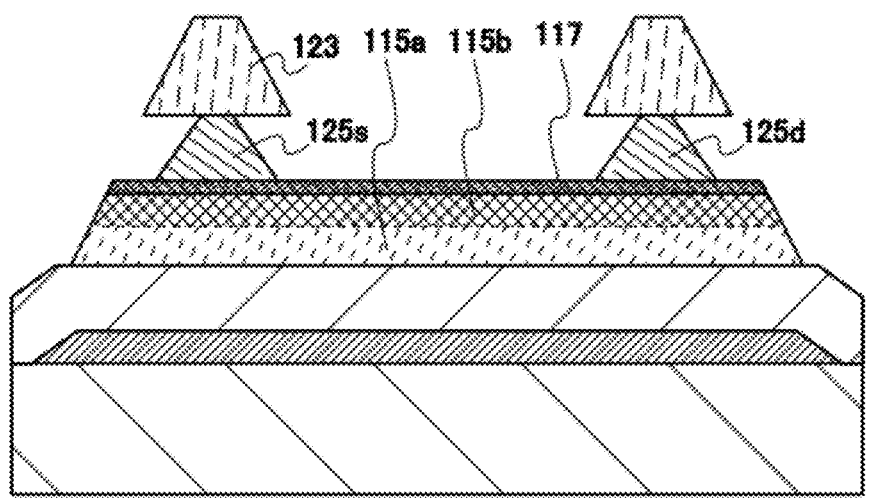
FIGS. 7A and 7B are views illustrating an example of a method for manufacturing a thin film transistor according to an embodiment of the present invention.

Next, with the use of the resist masks 123, the conductive layer 119 is etched to form the source electrode layer 125s and the drain electrode layer 125d (see FIG. 7A). The conductive layer 119 is preferably etched by wet etching. By wet etching, the conductive layer is etched isotropically. As a result, the conductive layer recedes so that it is on an inner side than the resist mask 123, and thus the source electrode layer 125s and the drain electrode layer 125d are formed. The source electrode layer 125s and the drain electrode layer 125d serve not only as a source electrode layer and a drain electrode layer but also as signal lines. However, without limitation thereto, signal lines may be provided separately from the source electrode layer 125s and the drain electrode layer 125d.

Next, with the use of the resist mask 123, a semiconductor layer 115a including an amorphous semiconductor, a crystal region 115b, and a microcrystalline semiconductor layer 117 to which an impurity imparting one conductivity type is added are partly etched. Here, dry etching is employed. The semiconductor layer 129a including an amorphous semiconductor, the crystal regions 129b and 129c, the source region 127s, and the drain region 127d are formed through the process up to this step. After that, the resist mask 123 is removed (see FIG. 7B).

Note that here, the conductive layer 119 is wet-etched and the semiconductor layer 115a including an amorphous semiconductor, the crystal region 115b, and the microcrystalline semiconductor layer 117 to which an impurity imparting one conductivity type is added are partly dry-etched. Accordingly, the conductive layer 119 is isotropically etched, and side surfaces of the source electrode layer 125s and the drain electrode layer 125d are not aligned with side surfaces of the source region 127s and the drain region 127d, so that the side surfaces of the source region 127s and the drain region 127d are on outer sides than the side surfaces of the source electrode layer 125s and the drain electrode layer 125d.

Next, dry etching is preferably performed after the resist mask 123 is removed. A condition of dry etching is set so that the exposed region of the semiconductor layer 129a including an amorphous semiconductor is not damaged and the etching rate with respect to the semiconductor layer 129a including an amorphous semiconductor is low. In other words, a condition which gives almost no damages to the exposed surface of the semiconductor layer 129a including an amorphous semiconductor and hardly reduces the thickness of the exposed region of the semiconductor layer 129a including an amorphous semiconductor is applied. As an etching gas, a chlorine-based gas, typically, $Cl_2$, $CF_4$, $N_2$, or the like is used. There is no particular limitation on an etching method and an inductively coupled plasma (ICP) method, a capacitively coupled plasma (CCP) method, an electron cyclotron resonance (ECR) method, or a reactive ion etching (RIE) method, or the like can be used.

Next, the surface of the semiconductor layer 129a including an amorphous semiconductor may be irradiated with water plasma, ammonia plasma, nitrogen plasma, or the like.

Water plasma treatment can be performed in such a manner that a gas containing water as its main component typified by water vapor ($H_2O$ vapor) is introduced into a reaction space to generate plasma.

As described above, after the source region 127s and the drain region 127d are formed, dry etching is further performed under such a condition that the semiconductor layer 129a including an amorphous semiconductor is not damaged, whereby an impurity element such as a residue existing on the exposed region of the semiconductor layer 129a including an amorphous semiconductor can be removed. Further, after dry etching, water plasma treatment is performed, whereby a residue of the resist mask can also be removed. By water plasma treatment, insulation between the source region and the drain region can be secured, and thus, in a thin film transistor which is completed, an off current can be reduced, and variation in electric characteristics can be reduced.

Through the above process, a thin film transistor with high field effect mobility, a large on current, and a small off current can be manufactured by using a small number of masks.

Embodiment 5

This embodiment will describe a formation method which can be employed instead of the method for forming the gate insulating layer 105, the semiconductor layer 107a including an amorphous semiconductor, and the crystal region 107b in Embodiment 4.

Figure 10:
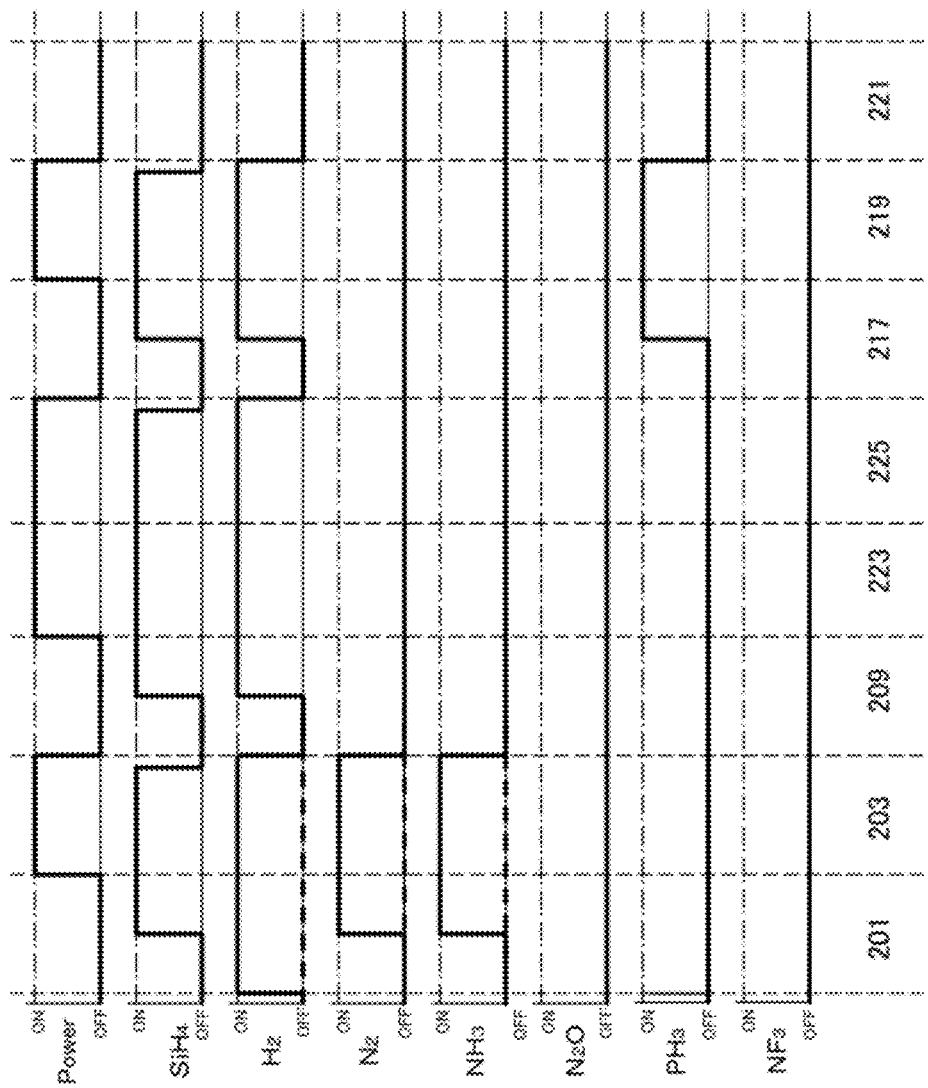
FIG. 10 is a time chart showing an example of a method for manufacturing a thin film transistor according to an embodiment of the present invention.

Here, a process for forming a silicon nitride layer as the gate insulating layer 105, an amorphous silicon layer containing nitrogen as the semiconductor layer 107a including an amorphous semiconductor, an inverted conical or pyramidal microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 10.

First, the substrate 101 over which the gate electrode layer 103 is formed is heated in a treatment chamber of a CVD apparatus, and in order to form a silicon nitride layer as the gate insulating layer 105, source gases used for depositing a silicon nitride layer are introduced into the treatment chamber (pretreatment 201 in FIG. 10). Here, a silicon nitride layer with a thickness of about 110 nm is formed in a manner similar to that of formation of SiN 203 described in Embodiment 4. After that, only the supply of $SiH_4$ is stopped, and after several seconds, the plasma discharge is stopped (formation of SiN 203 in FIG. 10). Through the above steps, the gate insulating layer 105 can be formed.

Next, the source gases used for depositing the silicon nitride layer are exhausted and source gases used for forming the semiconductor layer 107a including an amorphous semiconductor are introduced into the treatment chamber (replacement of gases 209 in FIG. 10).

Next, the semiconductor layer 107a including an amorphous semiconductor and the crystal region 107b are formed over an entire surface of the gate insulating layer 105. Here, for example, a semiconductor layer including the semiconductor layer 107a including an amorphous semiconductor and the crystal region 107b with a total thickness of about 50 nm is formed in such a manner that the source gases are introduced and stabilized, where the flow rate of $SiH_4$ is 10 sccm and the flow rate of $H_2$ is 1500 sccm, and plasma discharge with an output of 50 W is performed, where the pressure in the treatment chamber is 280 Pa and the temperature of the substrate is 280° C. After that, only the supply of $SiH_4$ is stopped, and after several seconds, the plasma discharge is stopped (formation of a-Si 223 and formation of crystal region 225 in FIG. 10). After that, these gases are exhausted and gases for depositing the microcrystalline semiconductor layer 109 to which an impurity imparting one conductivity type is added are introduced (replacement of gases 217 in FIG. 10).

In the above example, with regard to the source gases for forming the semiconductor layer 107a including an amorphous semiconductor and the crystal region 107b, the flow rate of $H_2$ is 150 times that of $SiH_4$; therefore, the silicon layer is deposited gradually.

Since at least the uppermost layer of the gate insulating layer 105, which is in contact with the semiconductor layer 107a including an amorphous semiconductor, is formed using a silicon nitride layer in this embodiment, a large amount of nitrogen exists on the surface of the gate insulating layer 105. As described above, nitrogen suppresses generation of silicon crystal nuclei. Therefore, as described above, even when deposition is performed under the condition that the surface of the gate insulating layer 105 is supplied with nitrogen to form a microcrystalline silicon layer, the semiconductor layer 107a including an amorphous semiconductor is formed. The semiconductor layer 107a including an amorphous semiconductor is formed while the nitrogen concentration in the semiconductor layer 107a including an amorphous semiconductor is reduced. When the nitrogen concentration is a constant value or less, crystal nuclei are generated. After that, the crystal nuclei grow, so that the crystal grains are formed and come in contact with each other and the crystal region 107b is formed. Note that here, in a generation position of the crystal nucleus, from which the crystal region 107b starts to grow, the nitrogen concentration measured by secondary ion mass spectrometry is from $1 \times 10^{20}$ cm$^{-3}$ to $1 \times 10^{21}$ cm$^{-3}$, preferably from $2 \times 10^{20}$ cm$^{-3}$ to $1 \times 10^{20}$ cm$^{-3}$, more preferably from $2 \times 10^{20}$ cm$^{-3}$ to $7 \times 10^{20}$ cm$^{-3}$.

Note that, as an impurity element suppressing generation of a crystal nucleus, an impurity element which does not generate a carrier trap in silicon (for example, nitrogen) is selected. On the other hand, the concentration of an impurity element which reduces the coordination number of silicon and generates a dangling bond (for example, oxygen) is reduced. Accordingly, an oxygen concentration is preferably reduced without reduction of the nitrogen concentration. In specific, the oxygen concentration measured by secondary ion mass spectrometry is preferably set to $5 \times 10^{18}$ cm$^{-3}$ or less.

As for the profile of SIMS (secondary ion mass spectrometry) of nitrogen in the gate insulating layer, the layer including an amorphous semiconductor, and the crystal region described in this embodiment, the nitrogen concentration has a peak in the gate insulating layer and the layer including an amorphous semiconductor and is gradually reduced as the distance from the bottom of the gate insulating layer in a direction in which the layer including an amorphous semiconductor, the crystal region, and the source and drain regions are formed increases.

Next, the microcrystalline semiconductor layer 109 to which an impurity imparting one conductivity type is added is formed over an entire surface of the crystal region 107b. Here, a microcrystalline silicon layer containing phosphorus with a thickness of about 30 nm is formed in a manner similar to that of formation of impurity semiconductor layer 219 in Embodiment 4. After that, only the supply of $SiH_4$ is stopped, and after several seconds, the plasma discharge is stopped (formation of impurity semiconductor layer 219 in FIG. 10). After that, these gases are exhausted (exhaust 221 in FIG. 10).

As described above, by forming at least the gate insulating layer in contact with the layer including an amorphous semiconductor with the use of a silicon nitride layer, the oxygen concentration can be suppressed and can be lower than the nitrogen concentration, whereby the layer including an amorphous semiconductor and the crystal region including an inverted conical or pyramidal microcrystalline semiconductor can be formed. Further, since the microcrystalline semiconductor layer to which an impurity imparting one conductivity type is added is formed over the crystal region including an inverted conical or pyramidal microcrystalline semiconductor, crystal growth of the microcrystalline semiconductor layer to which an impurity imparting one conductivity type is added occurs using the crystals of the surface of the crystal region as seed crystals. Therefore, formation of a low density layer in an early stage of the deposition can be suppressed.

Embodiment 6

This embodiment will describe a formation method which can be employed instead of the method for forming the gate insulating layer 105, the semiconductor layer 107a including an amorphous semiconductor, and the crystal region 107b in Embodiment 5.

Figure 11:
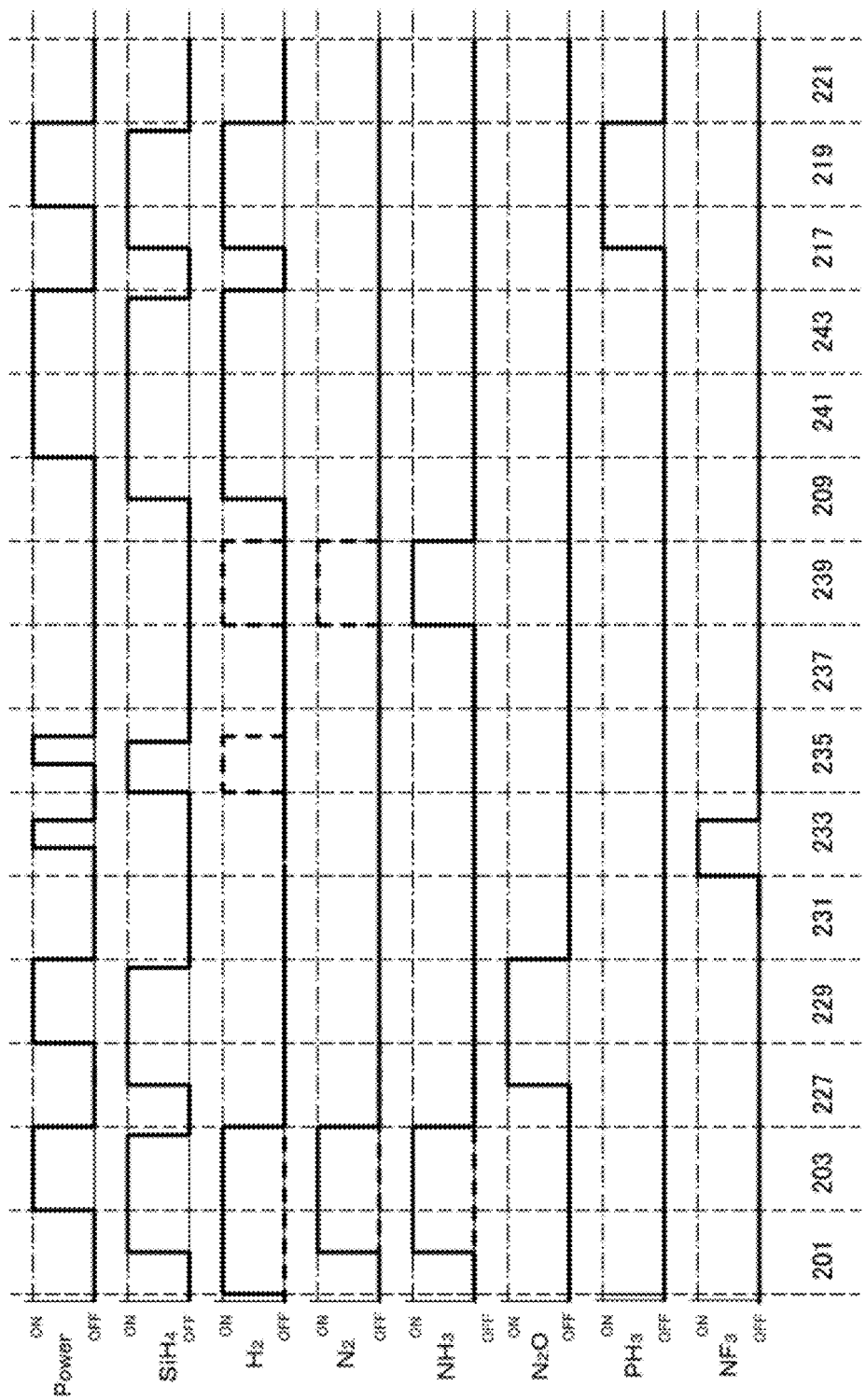
FIG. 11 is a time chart showing an example of a method for manufacturing a thin film transistor according to an embodiment of the present invention.

Here, a process for forming a silicon nitride layer and a silicon oxynitride layer as the gate insulating layer 105, an amorphous silicon layer containing nitrogen as the semiconductor layer 107a including an amorphous semiconductor, an inverted conical or pyramidal microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 11.

First, the substrate 101 over which the gate electrode layer 103 is formed is heated in a treatment chamber of the CVD apparatus. Then, in order to form a silicon nitride layer as the gate insulating layer 105, source gases used for depositing the silicon nitride layer are introduced into the treatment chamber (pretreatment 201 in FIG. 11). Here, a silicon nitride layer with a thickness of about 110 nm is formed in a manner similar to that of formation of SiN 203 described in Embodiment 4. After that only the supply of $SiH_4$ is stopped, and after several seconds, the plasma discharge is stopped (formation of SiN 203 in FIG. 1).

Next, the source gases used for depositing the silicon nitride layer are exhausted and source gases used for depositing the silicon oxynitride layer are introduced into the treatment chamber (replacement of gases 227 in FIG. 11). Here, for example, a silicon oxynitride layer with a thickness of about 110 nm is formed in such a manner that the source gases are introduced and stabilized, where the flow rate of $SiH_4$ is 30 sccm and the flow rate of $N_2O$ is 1200 sccm, and plasma discharge with an output of 50 W is performed, where the pressure in the treatment chamber is 40 Pa and the temperature of the substrate is 280° C. After that in a manner similar to that of formation of the silicon nitride layer, only the supply of $SiH_4$ is stopped, and after several seconds, the plasma discharge is stopped (formation of SiON 229 in FIG. 11).

Through the above steps, the gate insulating layer 105 can be formed. After the gate insulating layer 105 is formed, the substrate 101 is carried out of the treatment chamber (unload 231 in FIG. 11).

After the substrate 101 is carried out of the treatment chamber, for example, an $NF_3$ gas is introduced into the treatment chamber and the inside of the treatment chamber is cleaned (cleaning treatment 233 in FIG. 11). After that, treatment for forming an amorphous silicon layer as a protective layer in the treatment chamber is performed (precoating treatment 235 in FIG. 11). Here, an amorphous silicon layer is formed in a manner similar to that of precoating treatment 207 in Embodiment 4. Only the supply of $SiH_4$ is stopped, and after several seconds, the plasma discharge is stopped. After that, these gases are exhausted. After that, the substrate 101 is carried into the treatment chamber (load 237 in FIG. 11).

Next, nitrogen is adsorbed onto the surface of the gate insulating layer 105. Here, by exposing the surface of the gate insulating layer 105 to an ammonia gas, nitrogen is supplied (flush treatment 239 in FIG. 11). Further, hydrogen may be contained in the ammonia gas. Here, for example, preferably, the pressure in the treatment chamber is about 20 to 30 Pa, the substrate temperature is 280° C., and the treatment time is 60 seconds. Note that in the treatment of this step, the substrate 101 is only exposed to an ammonia gas; however, plasma treatment may also be performed. After that, these gases are exhausted.

Next, the semiconductor layer 107a including an amorphous semiconductor is formed over an entire surface of the gate insulating layer 105 onto which nitrogen is adsorbed. First, source gases for depositing the semiconductor layer 107a including an amorphous semiconductor and the crystal region 107b are introduced into the treatment chamber (replacement of gases 209 in FIG. 11). Here, for example the semiconductor layer including the semiconductor layer 107a including an amorphous semiconductor and the crystal region 107b with a total thickness of about 50 nm is formed in such a manner that the source gases are introduced and stabilized, where the flow rate of $SiH_4$ is 10 sccm and the flow rate of $H_2$ is 1500 sccm, and plasma discharge with an output of 50 W is performed, where the pressure in the treatment chamber is 280 Pa and the temperature of the substrate is 280° C. After that, only the supply of $SiH_4$ is stopped, and after several seconds, the plasma discharge is stopped (formation of a-Si 241 and formation of crystal region 243 in FIG. 11). After that, these gases are exhausted and gases for depositing the microcrystalline semiconductor layer 109 to which an impurity imparting one conductivity type is added are introduced (replacement of gases 217 in FIG. 11).

In the above example, with regard to the source gases for forming the semiconductor layer 107a including an amorphous semiconductor and the crystal region 107b, the flow rate of $H_2$ is 150 times that of $SiH_4$; therefore, the silicon layer is deposited gradually.

Nitrogen is supplied to the surface of the gate insulating layer 105 in this embodiment. As described above, nitrogen suppresses generation of silicon crystal nuclei. Therefore, silicon crystal nuclei are not generated in an early stage of the deposition, and even when deposition is performed under the condition that a microcrystalline silicon layer is formed over the surface of the gate insulating layer 105, the semiconductor layer 107a including an amorphous semiconductor is formed. The semiconductor layer 107a including an amorphous semiconductor is formed while the nitrogen concentration in the semiconductor layer 107a including an amorphous semiconductor is reduced. When the nitrogen concentration is a constant value or less, crystal nuclei are generated. After that, the crystal nuclei grow, so that the crystal grains are formed and come in contact with each other and the crystal region 107b is formed. Note that here, in a generation position of the crystal nucleus, from which the crystal region 107b starts to grow, the nitrogen concentration measured by secondary ion mass spectrometry is from $1 \times 10^{20}$ $cm^{-3}$ to $1 \times 10^{21}$ $cm^{-3}$, preferably from $2 \times 10^{20}$ $cm^{-3}$ to $1 \times 10^{20}$ $cm^{-3}$, more preferably from $2 \times 10^{20}$ $cm^{-3}$ to $7 \times 10^{20}$ $cm^{-3}$.

As for the profile of SIMS (secondary ion mass spectrometry) of nitrogen in the gate insulating layer, the layer including an amorphous semiconductor, and the crystal region described in this embodiment, the nitrogen concentration has a peak in the gate insulating layer and the layer including an amorphous semiconductor and is gradually reduced as the distance from the bottom of the gate insulating layer in a direction in which the layer including an amorphous semiconductor, the crystal region, and the source and drain regions are formed increases.

Next, the microcrystalline semiconductor layer 109 to which an impurity imparting one conductivity type is added is formed over an entire surface of the crystal region 107b. Here, for example, a microcrystalline silicon layer containing phosphorus with a thickness of about 30 nm is formed in a manner similar to that of formation of impurity semiconductor layer 219 in Embodiment 4. After that, only the supply of $SiH_4$ is stopped, and after several seconds, the plasma discharge is stopped (formation of impurity semiconductor layer 219 in FIG. 11). After that, these gases are exhausted (exhaust 221 in FIG. 11).

As described above, by supplying nitrogen and, additionally, hydrogen to the surface of the gate insulating layer at least before forming the layer including an amorphous semiconductor, the oxygen concentration can be suppressed and can be made to be lower than the nitrogen concentration, whereby the layer including an amorphous semiconductor and the crystal region including an inverted conical or pyramidal microcrystalline semiconductor can be formed. Further, since the microcrystalline semiconductor layer to which an impurity imparting one conductivity type is added is formed over the crystal region including an inverted conical or pyramidal microcrystalline semiconductor, crystal growth of the microcrystalline semiconductor layer to which an impurity imparting one conductivity type is added occurs using the crystals of the surface of the crystal region as seed crystals. Therefore, formation of a low density layer in an early stage of the deposition can be suppressed.

Embodiment 7

This embodiment will describe a formation method which can be employed instead of the method for forming the gate insulating layer 105, the semiconductor layer 107a including an amorphous semiconductor, and the crystal region 107b in Embodiment 5.

Figure 12:
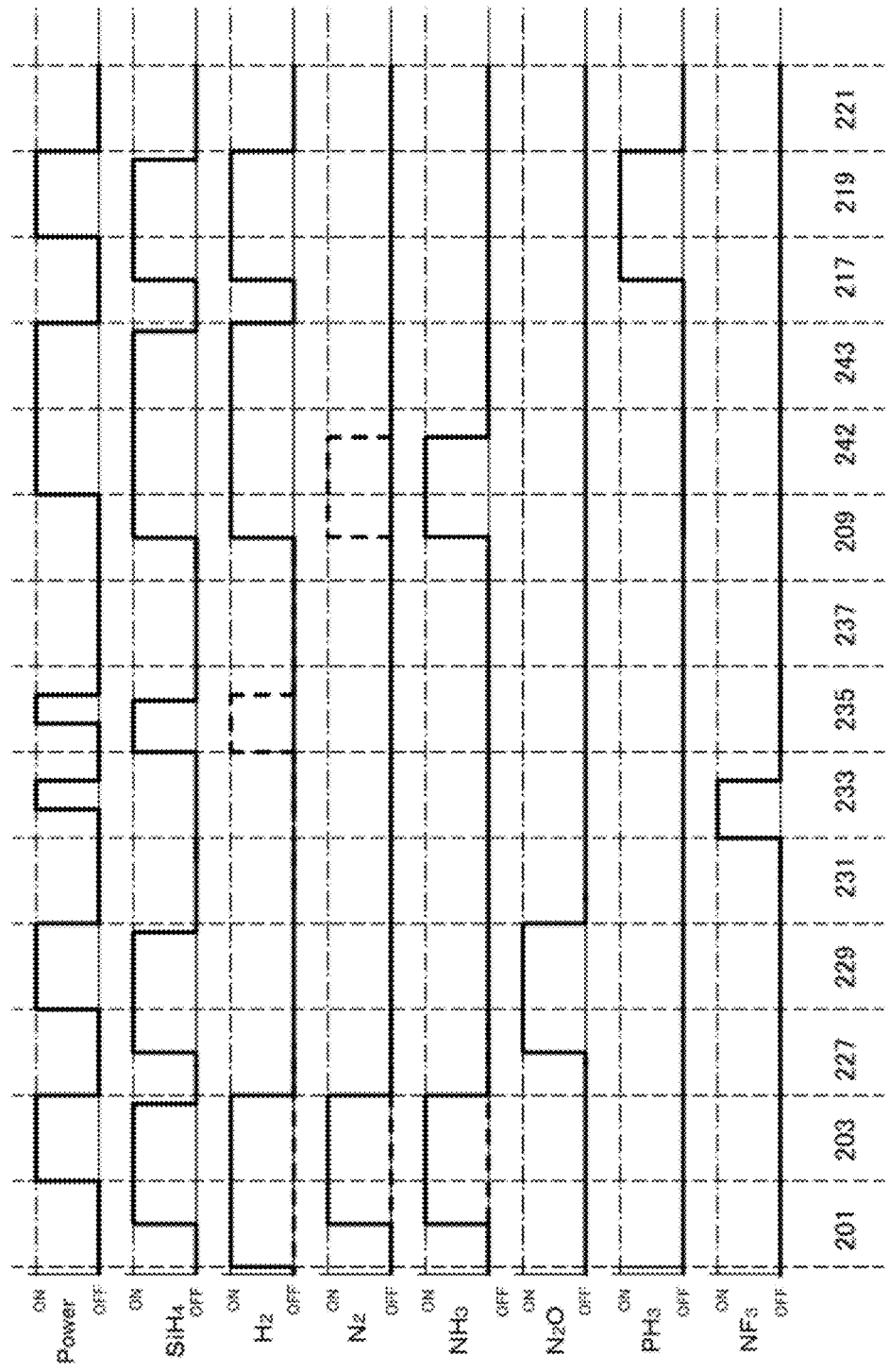
FIG. 12 is a time chart showing an example of a method for manufacturing a thin film transistor according to an embodiment of the present invention.

Here, a process for forming a silicon nitride layer and a silicon oxynitride layer as the gate insulating layer 105, an amorphous silicon layer containing nitrogen as the semiconductor layer 107a including an amorphous semiconductor, an inverted conical or pyramidal microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 12.

First, the substrate 101 over which the gate electrode layer 103 is formed is heated in a treatment chamber of the CVD apparatus. Then, in order to form a silicon nitride layer as the gate insulating layer 105, source gases used for depositing the silicon nitride layer are introduced into the treatment chamber (pretreatment 201 in FIG. 12). Here, a silicon nitride layer with a thickness of about 110 nm is formed in a manner similar to that of formation of SiN 203 described in Embodiment 4. After that, only the supply of $SiH_4$ is stopped, and after several seconds, the plasma discharge is stopped (formation of SiN 203 in FIG. 12).

Next, the source gases used for depositing the silicon nitride layer are exhausted and source gases for depositing the silicon oxynitride layer are introduced into the treatment chamber (replacement of gases 227 in FIG. 12). Here, a silicon oxynitride layer with a thickness of about 110 nm is formed in a manner similar to that of formation of SiON 229 in Embodiment 6. After that, in a manner similar to that of formation of the silicon nitride layer, only the supply of SiH$_4$ is stopped, and after several seconds, the plasma discharge is stopped (formation of SiON 229 in FIG. 12).

Through the above steps, the gate insulating layer 105 can be formed. After the gate insulating layer 105 is formed, the substrate 101 is carried out of the treatment chamber (unload 231 in FIG. 12).

After the substrate 101 is carried out of the treatment chamber, for example, an NF$_3$ gas is introduced into the treatment chamber and the inside of the treatment chamber is cleaned (cleaning treatment 233 in FIG. 12). After that, treatment for forming an amorphous silicon layer as a protective layer in the treatment chamber is performed (precoating treatment 235 in FIG. 12). Here, an amorphous silicon layer is formed as a protective layer in a manner similar to that of precoating treatment 207 in Embodiment 4. Only the supply of SiH$_4$ is stopped, and after several seconds, the plasma discharge is stopped. After that these gases are exhausted. After that, the substrate 101 is carried into the treatment chamber (load 237 in FIG. 12).

Next, source gases for depositing the semiconductor layer 107a including an amorphous semiconductor are introduced into the treatment chamber (replacement of gases 209 in FIG. 12). Then, the semiconductor layer 107a including an amorphous semiconductor is formed while nitrogen and hydrogen are supplied to the entire surface of the gate insulating layer 105. Here, for example, the semiconductor layer 107a including an amorphous semiconductor with a thickness of about 50 nm is formed in such a manner that the source gases are introduced and stabilized, where the flow rate of SiH$_4$ is 20 sccm, the flow rate of H$_2$ is 1250 sccm, and the flow rate of 100 ppm of NH$_3$ (diluted with hydrogen) is 250 sccm, and plasma discharge with an output of 50 W is performed, where the pressure in the treatment chamber is 280 Pa and the temperature of the substrate is 280° C. (formation of a-Si 242 in FIG. 12). Note that instead of NH$_3$, N$_2$ may be introduced into the treatment chamber as shown by a dashed line.

Next, by stopping the introduction of the gas for supplying nitrogen, here, NH$_3$, the nitrogen concentration in the treatment chamber is reduced, so that generation of crystal nuclei is facilitated, crystals grow from the crystal nuclei, and the crystal region 107b is formed (formation of crystal region 243 in FIG. 12). After that, only the supply of SiH$_4$ is stopped, and after several seconds, the plasma discharge is stopped. After that, these gases are exhausted.

In the above example, with regard to the source gases for forming the semiconductor layer 107a including an amorphous semiconductor and the crystal region 107b, the flow rate of H$_2$ is 150 times that of SiH$_4$; therefore, the silicon layer is deposited gradually.

The layer including an amorphous semiconductor is formed while nitrogen and, additionally, hydrogen are supplied in this embodiment. As described above, nitrogen suppresses generation of silicon crystal nuclei. Therefore, while nitrogen is supplied, silicon crystal nuclei are not generated even if deposition is performed under the condition that a microcrystalline silicon layer is formed. This layer formed under the condition is the semiconductor layer 107a including an amorphous semiconductor illustrated in FIG. 6A. At the time of formation of the semiconductor layer 107a including an amorphous semiconductor, the supply of nitrogen is stopped so that the nitrogen concentration in the semiconductor layer 107a including an amorphous semiconductor is reduced. When the nitrogen concentration is a constant value or less, crystal nuclei are generated. After that, the crystal nuclei grow, so that the crystal grains are formed and come in contact with each other and the crystal region 107b is formed. Note that here, in a generation position of the crystal nucleus, from which the crystal region 107b starts to grow, the nitrogen concentration measured by secondary ion mass spectrometry is from $1\times10^{20}$ cm$^{-3}$ to $1\times10^{21}$ cm$^{-3}$, preferably from $2\times10^{20}$ cm$^{-3}$ to $1\times10^{20}$ cm$^{-3}$, more preferably from $2\times10^{20}$ cm$^{-3}$ to $7\times10^{20}$ cm$^{-3}$.

As for the profile of SIMS of nitrogen in the gate insulating layer, the layer including an amorphous semiconductor, and the crystal region described in this embodiment the nitrogen concentration is substantially even in the gate insulating layer and the layer including an amorphous semiconductor and is gradually reduced as the distance from the interface between the layer including an amorphous semiconductor and the crystal region in a direction in which the source and drain regions are formed increases.

Next, the microcrystalline semiconductor layer 109 to which an impurity imparting one conductivity type is added is formed over an entire surface of the crystal region 107b. Here, for example, a microcrystalline silicon layer containing phosphorus with a thickness of about 30 nm is formed in a manner similar to that of formation of impurity semiconductor layer 219 in Embodiment 4. After that, only the supply of SiH$_4$ is stopped, and after several seconds, the plasma discharge is stopped (formation of impurity semiconductor layer 219 in FIG. 12). After that, these gases are exhausted (exhaust 221 in FIG. 12).

As described above, by supplying nitrogen and, additionally, hydrogen at the time of forming the layer including an amorphous semiconductor, the oxygen concentration can be suppressed and can be made to be lower than the nitrogen concentration, whereby the layer including an amorphous semiconductor and the crystal region including an inverted conical or pyramidal microcrystalline semiconductor can be formed. Further, since the microcrystalline semiconductor layer to which an impurity imparting one conductivity type is added is formed over the crystal region including an inverted conical or pyramidal microcrystalline semiconductor, crystal growth of the microcrystalline semiconductor layer to which an impurity imparting one conductivity type is added occurs using the crystals of the surface of the crystal region as seed crystals. Therefore, formation of a low density layer in an early stage of the deposition can be suppressed.

Embodiment 8

This embodiment will describe a manufacturing process of the thin film transistor in FIG. 1B described in Embodiment 1 with reference to FIGS. 13A and 13B.

In a manner similar to that of Embodiment 4, the gate electrode layer 103 is formed over the substrate 101. Then, the gate insulating layer 105 is formed so as to cover the gate electrode layer 103. Then, a microcrystalline semiconductor layer 139 is formed over the gate insulating layer 105. Then, the semiconductor layer 107, the microcrystalline semiconductor layer 109 to which an impurity imparting one conductivity type is added, and the conductive layer 111 are formed over the microcrystalline semiconductor layer 139. After that, the resist mask 113 having regions with different thicknesses is formed over the conductive layer 111 (see FIG. 13A).

The microcrystalline semiconductor layer 139 can be formed in a similar manner to the crystal region 107b described in Embodiment 4.

Figure 14:
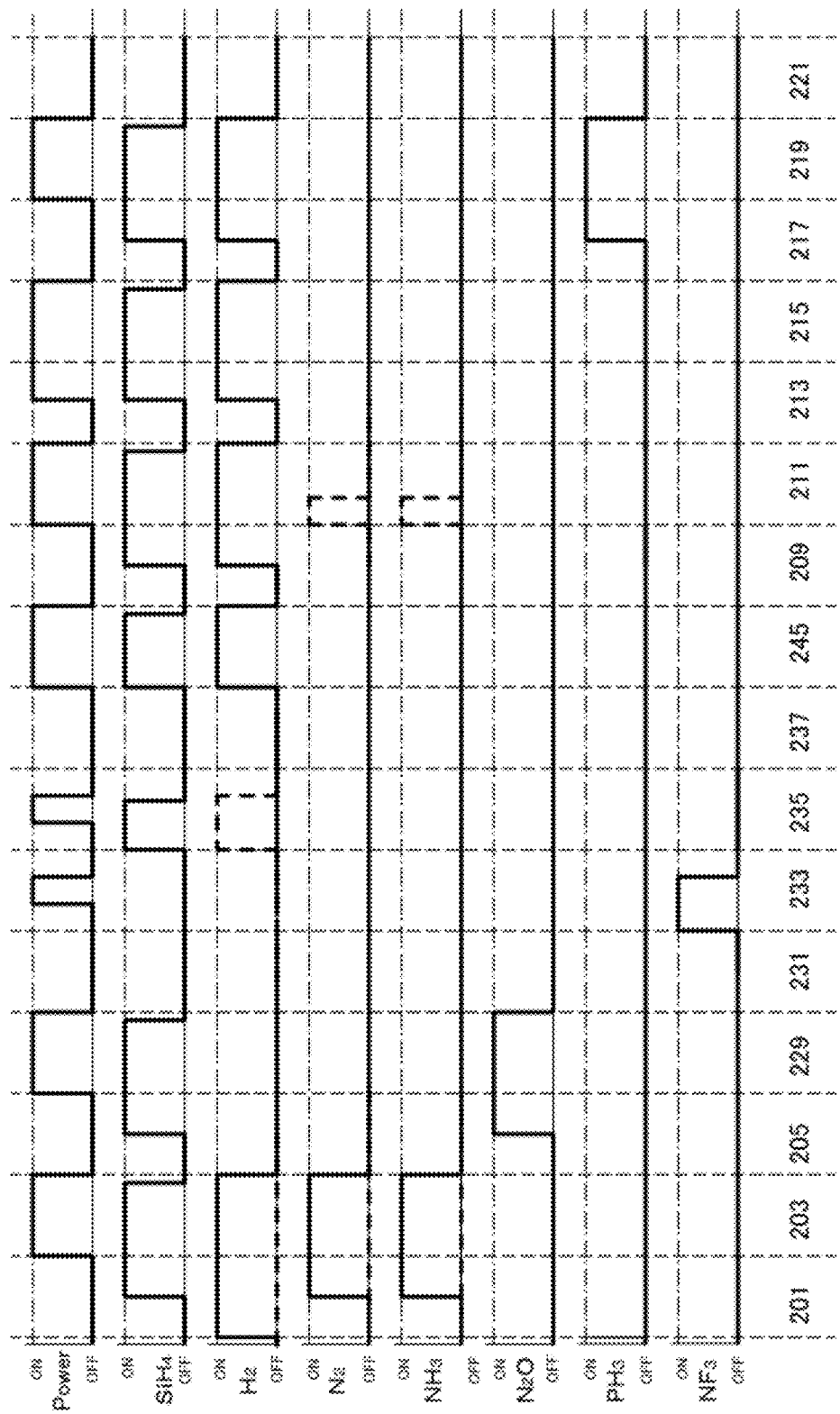
FIG. 14 is a time chart showing an example of a method for manufacturing a thin film transistor according to an embodiment of the present invention.

Here, a process for forming a silicon nitride layer and a silicon oxynitride layer as the gate insulating layer 105, a microcrystalline silicon layer as the microcrystalline semiconductor layer 139, an amorphous silicon layer as the semiconductor layer 107a including an amorphous semiconductor, an inverted conical or pyramidal microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 14. Note that in the case where the microcrystalline semiconductor layer 139 is in contact with the gate insulating layer 105, an uppermost surface of the gate insulating layer 105 is preferably a silicon oxide layer or a silicon oxynitride layer. Therefore, a silicon nitride layer and a silicon oxynitride layer are stacked as the gate insulating layer 105 here.

First, the substrate 101 over which the gate electrode layer 103 is formed is heated in a treatment chamber of the CVD apparatus. Then, in order to form a silicon nitride layer as the gate insulating layer 105, source gases for depositing the silicon nitride layer are introduced into the treatment chamber (pretreatment 201 in FIG. 14). Here, a silicon nitride layer with a thickness of about 110 nm is formed in a manner similar to that of formation of SiN 203 described in Embodiment 4. After that, only the supply of SiH$_4$ is stopped, and after several seconds, the plasma discharge is stopped (formation of SiN 203 in FIG. 14).

Next, the source gases used for depositing the silicon nitride layer are exhausted and source gases for depositing the silicon oxynitride layer are introduced into the treatment chamber (replacement of gases 205 in FIG. 14). Here, for example, a silicon oxynitride layer with a thickness of about 110 nm is formed in a manner similar to that of formation of SiON 229 in Embodiment 6. After that, in a manner similar to that of formation of the silicon nitride layer, only the supply of SiH$_4$ is stopped, and after several seconds, the plasma discharge is stopped (formation of SiON 229 in FIG. 14).

Through the above steps, the gate insulating layer 105 can be formed. After the gate insulating layer 105 is formed, the substrate 101 is carried out of the treatment chamber (unload 231 in FIG. 14).

After the substrate 101 is carried out of the treatment chamber, for example, an NF$_3$ gas is introduced into the treatment chamber and the inside of the treatment chamber is cleaned (cleaning treatment 233 in FIG. 14). After that, treatment for forming an amorphous silicon layer as a protective layer in the treatment chamber is performed (precoating treatment 235 in FIG. 14). Here, an amorphous silicon layer is formed as a protective layer in a manner similar to that of precoating treatment 207 in Embodiment 4. Only the supply of SiH$_4$ is stopped, and after several seconds, the plasma discharge is stopped. After that, these gases are exhausted. After that, the substrate 101 is carried into the treatment chamber (load 237 in FIG. 14).

Next, the microcrystalline silicon layer is formed as the microcrystalline semiconductor layer 139 over an entire surface of the gate insulating layer 105. First, source gases for forming the microcrystalline silicon layer as the microcrystalline semiconductor layer 139 are introduced into the treatment chamber. Here, a microcrystalline silicon layer with a thickness of from 2 nm to 100 nm, preferably from 5 nm to 50 nm is formed in a manner similar to that of formation of µc-Si 245 in Embodiment 4. After that, only the supply of SiH$_4$ is stopped, and after several seconds, the plasma discharge is stopped. After that, these gases are exhausted (formation of µc-Si 245 in FIG. 14).

After that, replacement of gases 209, and in a manner similar to that of Embodiment 4, formation of a layer including an amorphous semiconductor (formation of a-Si 211), replacement of gases 213, formation of a crystal region (formation of crystal region 215), replacement of gases 217, formation of a microcrystalline semiconductor layer to which an impurity imparting one conductivity type is added (formation of impurity semiconductor layer 219), and exhaust 221 are performed. Note that at the time of formation of the layer including an amorphous semiconductor (formation of a-Si 211), crystal growth is likely to occur using the microcrystalline semiconductor layer 139 as a seed crystal. Therefore, a gas containing nitrogen, such as N$_2$ or NH$_3$, is introduced into the treatment chamber in an early stage of the deposition as shown by a dashed line, which facilitates amorphization and thus the layer including an amorphous semiconductor is easily formed over the microcrystalline semiconductor layer 139.

Next, the microcrystalline semiconductor layer 139, the semiconductor layer 107, the microcrystalline semiconductor layer 109 to which an impurity imparting one conductivity type is added, and the conductive layer 111 are etched with the use of the resist mask 113. Through this step, the microcrystalline semiconductor layer 139, the semiconductor layer 107, the microcrystalline semiconductor layer 109 to which an impurity imparting one conductivity type is added, and the conductive layer 111 are separated for each element, so that the microcrystalline semiconductor layer 131, the semiconductor layer 115, the microcrystalline semiconductor layer 117 to which an impurity imparting one conductivity type is added, and the conductive layer 119 are formed (see FIG. 13B).

Figure 7B:
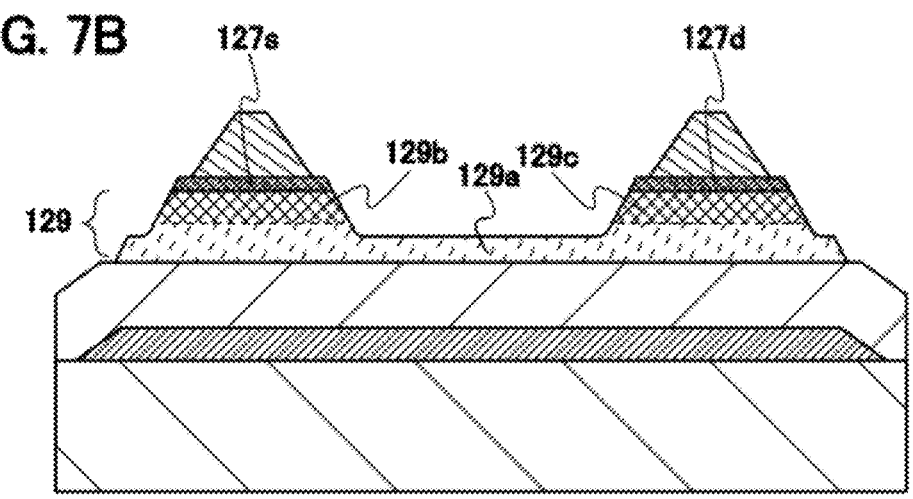

After that, through the steps in FIG. 6C and FIGS. 7A and 7B in a manner similar to that of Embodiment 4, a thin film transistor in which an on current and field effect mobility are further increased can be manufactured as illustrated in FIG. 1B.

Note that although the thin film transistor illustrated in FIG. 1B is used as an example in this embodiment the process can be applied to a method for manufacturing the thin film transistor illustrated in FIG. 3B as appropriate.

Embodiment 9

Figure 15A:
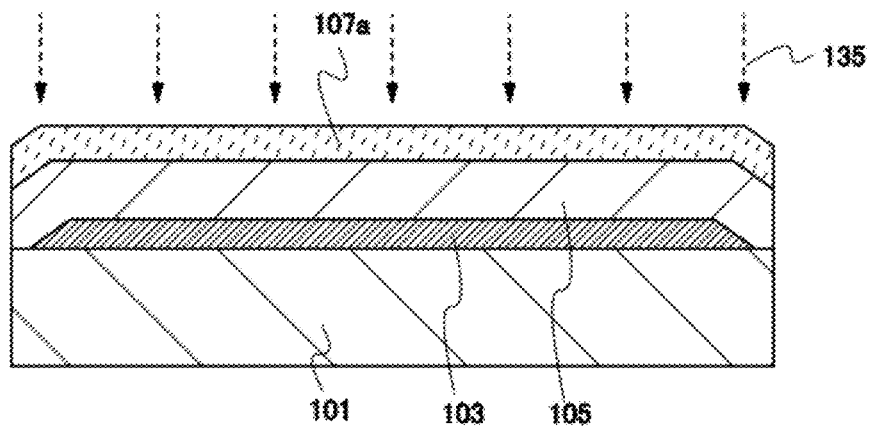
FIGS. 15A to 15C are views illustrating an example of a method for manufacturing a thin film transistor according to an embodiment of the present invention.
Figure 15B:
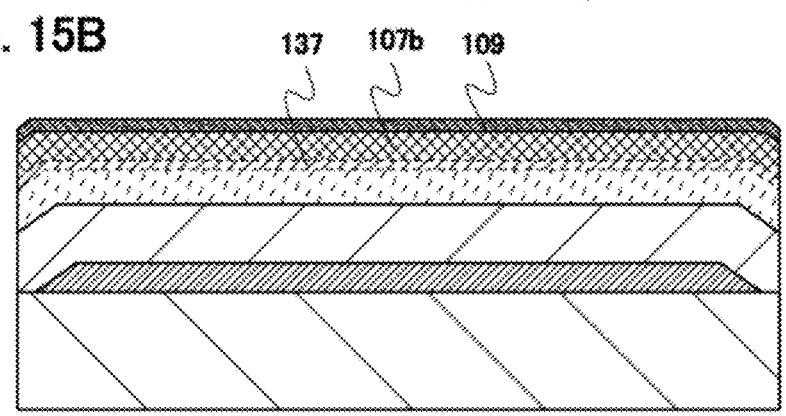
Figure 15C:
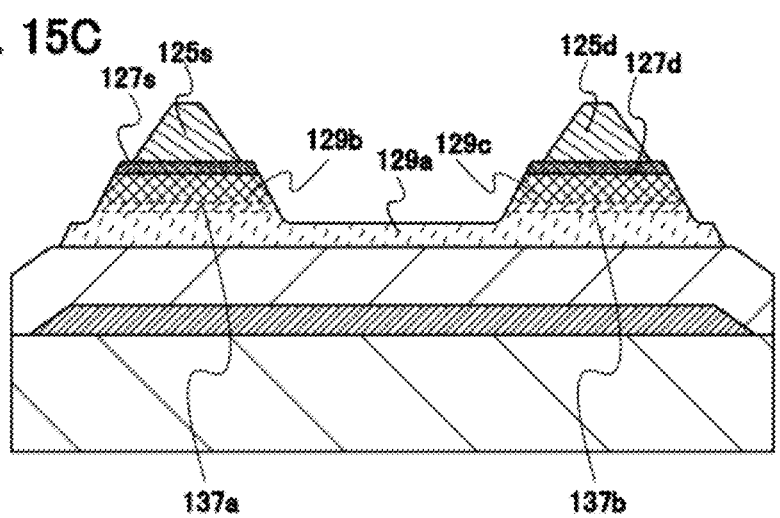

This embodiment will describe a manufacturing process of the thin film transistor in FIG. 3A described in Embodiment 1 with reference to FIGS. 15A to 15C.

In a manner similar to that of Embodiment 4, the gate electrode layer 103 is formed over the substrate 101. Then, the gate insulating layer 105 is formed so as to cover the gate electrode layer 103. Then, the semiconductor layer 107a including an amorphous semiconductor is formed over the gate insulating layer 105. Then, the surface of the semiconductor layer 107a including an amorphous semiconductor is exposed to plasma 135.

Here, the plasma 135 is generated in an atmosphere of halogen such as fluorine or chlorine or an atmosphere of a halide such as hydrogen fluoride, silane fluoride, germanium fluoride, nitrogen trifluoride, chlorine fluoride, bromine fluoride, or iodine fluoride, and the surface of the semiconductor layer 107a including an amorphous semiconductor is exposed to the plasma 135. Alternatively, after the plasma 135 is generated in an atmosphere of halogen such as fluorine or chlorine or an atmosphere of a halide such as hydrogen fluoride, silane fluoride, germanium fluoride, nitrogen trifluoride, chlorine fluoride, bromine fluoride, or iodine fluoride, and the surface of the semiconductor layer 107a including an amorphous semiconductor is exposed to the plasma 135, plasma may be generated in a hydrogen atmosphere or a rare gas atmosphere, and the surface of the semiconductor layer 107a including an amorphous semiconductor may be exposed to the plasma. Note that plasma may be generated by introducing hydrogen, a rare gas, and the like at the same time in an atmosphere of halogen and an atmosphere of a halide (see FIG. 15A).

As a result, the semiconductor layer 137 containing a halogen element can be formed over the surface of the semiconductor layer 107a including an amorphous semiconductor. Since the plasma 135 has a large etching effect, a dangling bond is exposed while an amorphous portion of the surface of the semiconductor layer 107a including an amorphous semiconductor is etched. As a result, a low density layer is not formed in an early stage of the deposition of the crystal region 107b to be formed later and thus the crystal region 107b with excellent crystallinity can be formed.

Next, the crystal region 107b is formed over the semiconductor layer 137 containing a halogen element and the microcrystalline semiconductor layer 109 to which an impurity imparting one conductivity type is added is formed over the crystal region 107b (see FIG. 15B). Since as for the crystal region 107b, crystal growth occurs using the semiconductor layer 137 containing a halogen element as a seed crystal, the crystal region 107b has excellent crystallinity. Thus, the proportion of the low density layer at the interface can be reduced. Further, since in the case of the microcrystalline semiconductor layer to which an impurity imparting one conductivity type is added, similarly, crystal growth occurs using the crystal region 107b as a seed crystal, the microcrystalline semiconductor layer to which an impurity imparting one conductivity type is added has excellent crystallinity. Thus, the proportion of the low density layer at the interface can be reduced.

Here, a process for forming a silicon nitride layer as the gate insulating layer 105, an amorphous silicon layer as the semiconductor layer 107a including an amorphous semiconductor, a microcrystalline silicon layer containing fluorine as the semiconductor layer 137 containing a halogen element, a microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 16.

First, the substrate 101 over which the gate electrode layer 103 is formed is heated in a treatment chamber of the CVD apparatus. Then, in order to form a silicon nitride layer as the gate insulating layer 105, source gases for depositing a silicon nitride layer are introduced into the treatment chamber (pretreatment 201 in FIG. 16). Here, a silicon nitride layer with a thickness of about 110 nm is formed in a manner similar to that of formation of SiN 203 described in Embodiment 4. After that, only the supply of SiH$_4$ is stopped, and after several seconds, the plasma discharge is stopped (formation of SiN 203 in FIG. 16).

Through the above steps, the gate insulating layer 105 can be formed. After the gate insulating layer 105 is formed, the source gases used for depositing the silicon nitride layer are exhausted, and the substrate 101 is carried out of the treatment chamber (unload 206 in FIG. 16).

Next, a source gas for depositing an amorphous silicon layer as a protective layer is introduced into the treatment chamber and treatment for forming the amorphous silicon layer in the treatment chamber is performed (precoating treatment 207 in FIG. 16). By coating the inner wall of treatment chamber with the amorphous silicon layer, it is possible to prevent an impurity attached to the inner wall of the treatment chamber, an element included in the inner wall of the treatment chamber, or the silicon nitride layer formed as the gate insulating layer from being mixed into a layer including an amorphous semiconductor to be formed later. After that, the substrate 101 is carried into the treatment chamber, and source gases for depositing the amorphous silicon layer as the semiconductor layer 107a including an amorphous semiconductor are introduced into the treatment chamber (load 208 in FIG. 16).

Next, the amorphous silicon layer is formed as the semiconductor layer 107a including an amorphous semiconductor over an entire surface of the gate insulating layer 105. First, an amorphous silicon layer with a thickness of about 50 nm is formed through a process similar to that of formation of a-Si 211 in Embodiment 4. After that, only the supply of SiH$_4$ is stopped, and after several seconds, the plasma discharge is stopped (formation of a-Si 211 in FIG. 16).

Next, after silane fluoride is introduced into the treatment chamber, plasma is generated, and the surface of the semiconductor layer 107a including an amorphous semiconductor is exposed to the silane fluoride plasma. Thus, a microcrystalline silicon layer containing fluorine is formed as the semiconductor layer 137 containing a halogen element (SiF$_4$ treatment 247 in FIG. 16). Note that at that time, hydrogen and/or a rare gas may be introduced into the treatment chamber. Since a halogen element typified by a fluorine radical has high reactivity, an amorphous semiconductor component in deposition is etched by fluorine radicals. Accordingly, the microcrystalline silicon layer containing fluorine with excellent crystallinity can be formed. After that silane fluoride is exhausted (replacement of gases 213 in FIG. 16).

Next, a microcrystalline silicon layer is formed as the crystal region 107b over an entire surface of the semiconductor layer 137 containing a halogen element. First, source gases for depositing the crystal region 107b are introduced into the treatment chamber. Here, for example, a microcrystalline silicon layer with a thickness of about 50 nm can be formed in a manner similar to that of formation of crystal region 215 described in Embodiment 4. After that, only the supply of SiH$_4$ is stopped, and after several seconds, the plasma discharge is stopped (formation of crystal region 215 in FIG. 16).

After that, replacement of gases 217, formation of a microcrystalline semiconductor layer to which an impurity imparting one conductivity type is added (formation of impurity semiconductor layer 219), and exhaust 221 are performed.

After that, through the steps in FIGS. 6A to 6C and FIGS. 7A and 7B in a manner similar to that of Embodiment 4, a thin film transistor in which an on current and field effect mobility are increased can be manufactured as illustrated in FIG. 3A and FIG. 15C.

The microcrystalline semiconductor layer is formed over the gate insulating layer 105 and the semiconductor layer 107a including an amorphous semiconductor is formed over the microcrystalline semiconductor layer as in Embodiment 8, and the semiconductor layer 137 containing a halogen element is formed over the semiconductor layer 107a including an amorphous semiconductor as in this embodiment, so that a thin film transistor in which an on current and field effect mobility are increased can be manufactured as illustrated in FIG. 3B.

Embodiment 10

Figure 17:
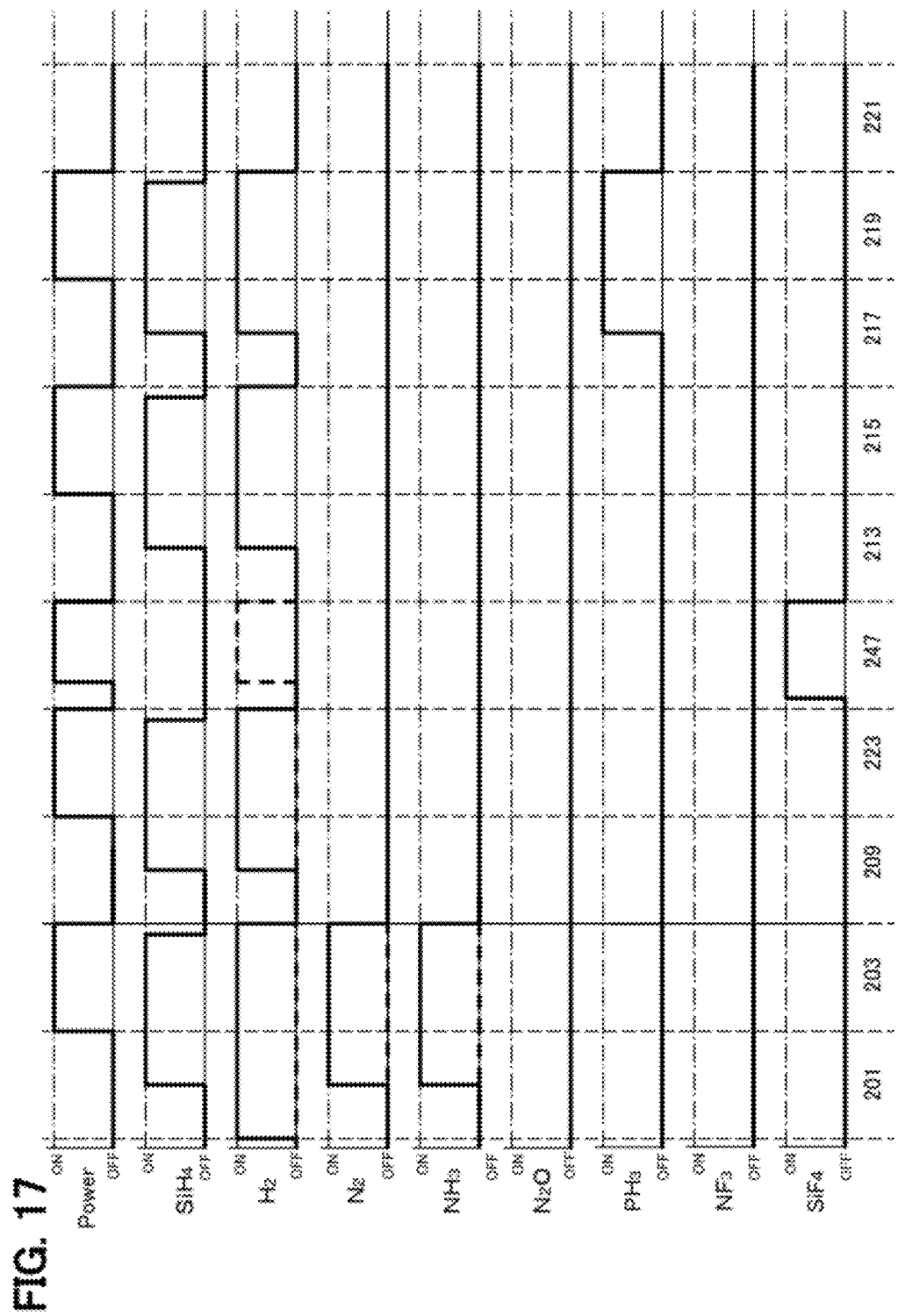
FIG. 17 is a time chart showing an example of a method for manufacturing a thin film transistor according to an embodiment of the present invention.

This embodiment will describe a manufacturing process of the thin film transistor in FIG. 3A described in Embodiment 1, which is different from the manufacturing process of Embodiment 8, with reference to FIG. 17.

Here, for a method for forming the semiconductor layer 107a including an amorphous semiconductor and the crystal region 107b, any of Embodiments 5 to 7 is used. Although Embodiment 5 is used for description as a typical example here, Embodiments 6 and 7 can be used as appropriate.

Here, a process for forming a silicon nitride layer as the gate insulating layer 105, an amorphous silicon layer containing nitrogen as the semiconductor layer 107a including an amorphous semiconductor, a microcrystalline silicon layer containing fluorine as the semiconductor layer 137 containing a halogen element, a microcrystalline silicon layer as the crystal region 107b, and a microcrystalline silicon layer containing phosphorus as the microcrystalline semiconductor layer 109 to which an impurity imparting one conductivity type is added will be described with reference to a time chart shown in FIG. 17.

First, the substrate 101 over which the gate electrode layer 103 is formed is heated in a treatment chamber of the CVD apparatus. Then, in order to form a silicon nitride layer as the gate insulating layer 105, source gases for depositing the silicon nitride layer are introduced into the treatment chamber (pretreatment 201 in FIG. 17). Here, a silicon nitride layer with a thickness of about 110 nm is formed in a manner similar to that of formation of SiN 203 described in Embodiment 4. After that, only the supply of $SiH_4$ is stopped, and after several seconds, the plasma discharge is stopped (formation of SiN 203 in FIG. 17).

Through the above steps, the gate insulating layer 105 can be formed. After the gate insulating layer 105 is formed, the source gases used for depositing the silicon nitride layer are exhausted.

Next, the semiconductor layer 107a including an amorphous semiconductor is formed over an entire surface of the gate insulating layer 105. First, source gases for depositing the semiconductor layer 107a including an amorphous semiconductor are introduced into the treatment chamber (replacement of gases 209 in FIG. 17). Here, an amorphous silicon layer containing nitrogen is formed in a manner similar to that of formation of a-Si 223 in Embodiment 5. At that time, since the nitrogen concentration in the treatment chamber is reduced by increasing film thickness, an inverted conical or pyramidal microcrystalline silicon layer may be formed over the amorphous silicon layer containing nitrogen. After that, only the supply of $SiH_4$ is stopped, and after several seconds, the plasma discharge is stopped (formation of a-Si 223 in FIG. 17). After that, these gases are exhausted.

In the above example, with regard to the source gases for forming the semiconductor layer 107a including an amorphous semiconductor, the flow rate of $H_2$ is 150 times that of $SiH_4$; therefore, the silicon layer is deposited gradually.

Next, after silane fluoride is introduced into the treatment chamber, plasma is generated, and the surface of the semiconductor layer 107a including an amorphous semiconductor is exposed to the silane fluoride plasma. Thus, a microcrystalline silicon layer containing fluorine is formed as the semiconductor layer 137 containing a halogen element. Note that at that time, hydrogen and/or a rare gas may be introduced into the treatment chamber. Since a halogen element typified by a fluorine radical has high reactivity, an amorphous semiconductor component in deposition is etched by fluorine radicals. Accordingly, the microcrystalline silicon layer containing fluorine with excellent crystallinity can be formed. After that, silane fluoride is exhausted ($SiF_4$ treatment 247 in FIG. 17).

Next, a microcrystalline silicon layer is formed as the crystal region 107b over an entire surface of the semiconductor layer 137 containing a halogen element. First, source gases for depositing the crystal region 107b are introduced into the treatment chamber (replacement of gases 213 in FIG. 17). Here, for example, a microcrystalline silicon layer with a thickness of about 50 nm can be formed in a manner similar to that of formation of crystal region 215 described in Embodiment 4. After that, only the supply of $SiH_4$ is stopped, and after several seconds, the plasma discharge is stopped (formation of crystal region 215 in FIG. 17).

After that, replacement of gases 217, formation of a microcrystalline semiconductor layer to which an impurity imparting one conductivity type is added (formation of impurity semiconductor layer 219), and exhaust 221 are performed.

After that, through the steps in FIGS. 6A to 6C and FIGS. 7A and 7B in a manner similar to that of Embodiment 4, a thin film transistor in which an on current and field effect mobility are increased can be manufactured as illustrated in FIG. 3A.

The microcrystalline semiconductor layer is formed over the gate insulating layer 105 and the semiconductor layer 107a including an amorphous semiconductor is formed over the microcrystalline semiconductor layer as in Embodiment 8, and the semiconductor layer 137 containing a halogen element is formed over the semiconductor layer 107a including an amorphous semiconductor as in this embodiment, so that a thin film transistor in which an on current and field effect mobility are increased can be manufactured as illustrated in FIG. 3B.

Embodiment 11

This embodiment will describe a manufacturing process of the thin film transistor in FIG. 5 described in Embodiment 1 with reference to FIGS. 18A to 18C and FIGS. 19A and 19B.

In a manner similar to that of Embodiment 4, the gate electrode layer 103 is formed over the substrate 101. Then, the gate insulating layer 105, the semiconductor layer 107, and the microcrystalline semiconductor layer 109 to which an impurity imparting one conductivity type is added are formed so as to cover the gate electrode layer 103. After that, a resist mask (not shown) is formed over the microcrystalline semiconductor layer 109 to which an impurity imparting one conductivity type is added (see FIG. 18A).

Next, the semiconductor layer 107 and the microcrystalline semiconductor layer 109 to which an impurity imparting one conductivity type is added are etched with the use of the resist mask. Through this step, the semiconductor layer 107 and the microcrystalline semiconductor layer 109 to which an impurity imparting one conductivity type is added are separated for each element, so that the semiconductor layer 115 (the semiconductor layer 115a including an amorphous semiconductor and the crystal region 115b), and the microcrystalline semiconductor layer 117 to which an impurity imparting one conductivity type is added are formed (see FIG. 18B).

Figure 18A:
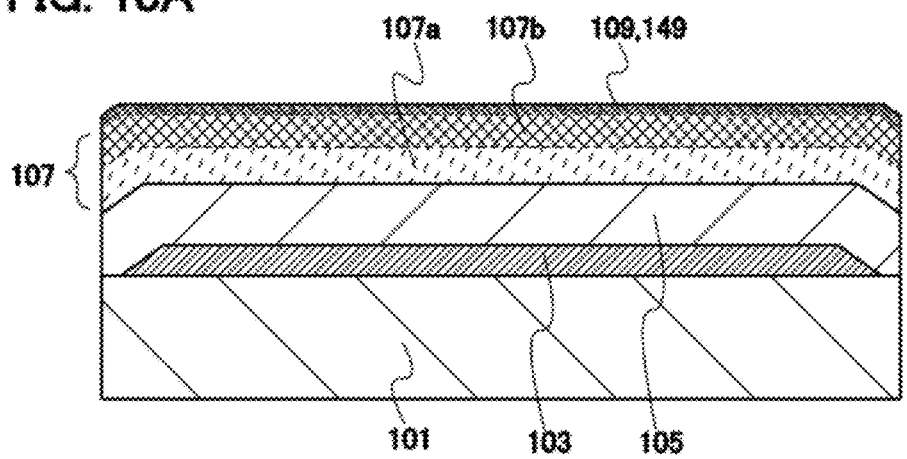
FIGS. 18A to 18C are views illustrating an example of a method for manufacturing a thin film transistor according to an embodiment of the present invention.
Figure 18B:
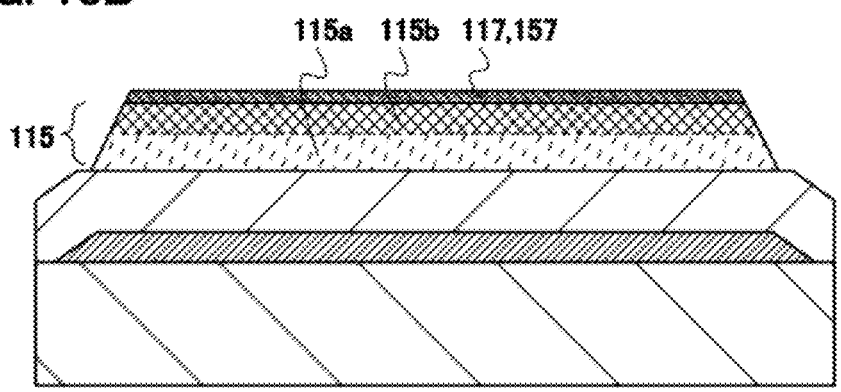
Figure 18C:
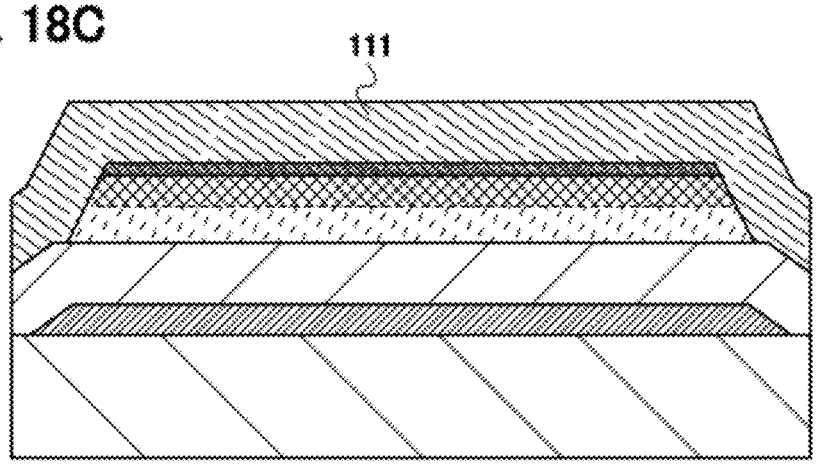

Next, the conductive layer 111 is formed over the gate insulating layer 105, the semiconductor layer 115 (the semiconductor layer 115a including an amorphous semiconductor and the crystal region 115b), and the microcrystalline semiconductor layer 117 to which an impurity imparting one conductivity type is added (see FIG. 18C).

Next, a resist mask (not shown) is formed over the conductive layer 111, and the conductive layer 111 is etched with the use of the resist mask, so that the source electrode layer 133s and the drain electrode layer 133d are formed. After that, the resist mask is removed.

Next, the microcrystalline semiconductor layer 117 to which an impurity imparting one conductivity type is added is etched by using the source electrode layer 133s and the drain electrode layer 133d as masks, so that the source region 127s and the drain region 127d are formed. Further, the crystal region 115b is etched, so that the crystal regions 129b and 129c are formed. Further, part of the semiconductor layer 115a including an amorphous semiconductor is etched, so that the semiconductor layer 129a including an amorphous semiconductor is formed.

Through the above steps, the thin film transistor illustrated in FIG. 5 can be manufactured.

Note that although the resist mask is removed after the source electrode layer 133s and the drain electrode layer 133d are formed in this embodiment, the microcrystalline semiconductor layer 117 to which an impurity imparting one conductivity type is added, the crystal region 115b, and part of the semiconductor layer 115a including an amorphous semiconductor may be etched without removing the resist mask. By the etching, the microcrystalline semiconductor layer 117 to which an impurity imparting one conductivity type is added is etched with the use of the resist mask; thus, an end portion of the source electrode layer 133s and an end portion of the source region 127s are misaligned and the source region 127s is exposed. Accordingly, a thin film transistor in which an end portion of the source electrode layer 133d and the drain region 127d are misaligned and the drain region 127d is exposed can be manufactured.

Note that a method for forming a source electrode layer and a drain electrode layer, which is described in this embodiment, can be applied to any of Embodiments 5 to 10 as appropriate.

Embodiment 12

This embodiment will describe a structure of a thin film transistor in which a threshold voltage can be controlled.

Figure 20:
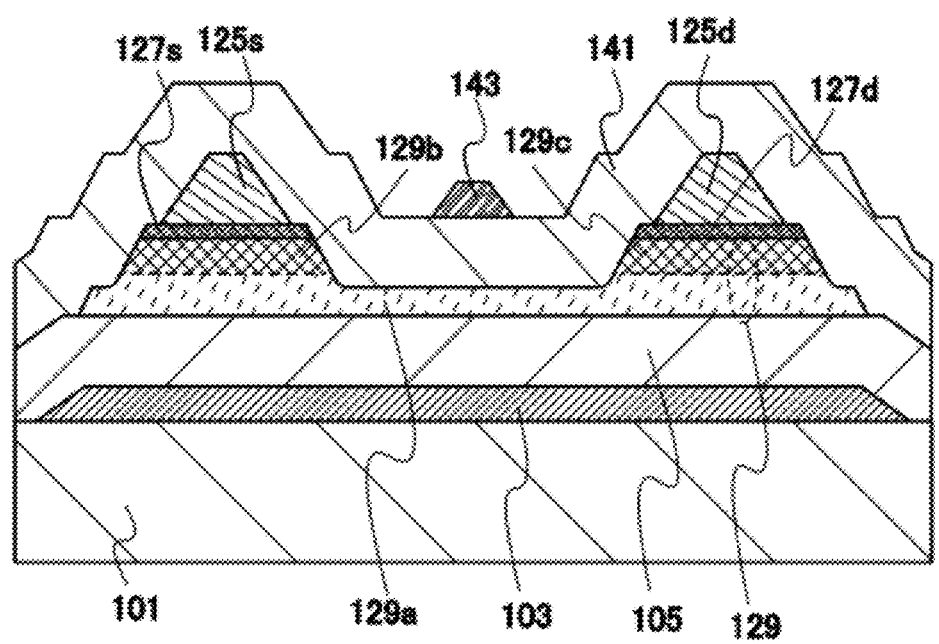
FIG. 20 is a view illustrating an example of a manufacturing method of a thin film transistor according to an embodiment of the present invention.
Figure 21A:
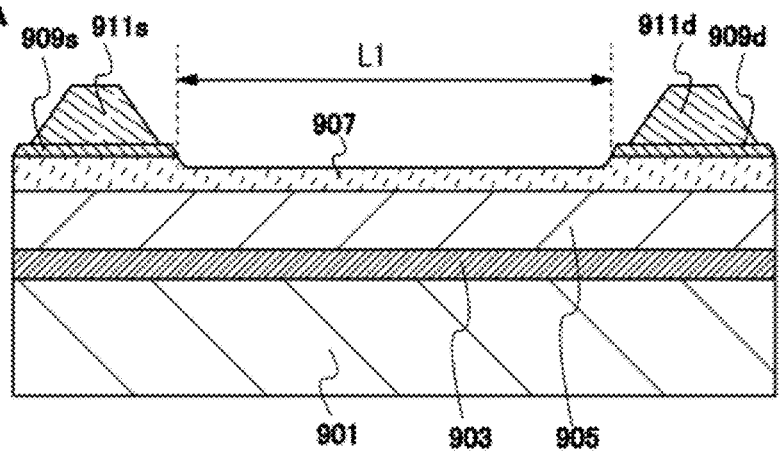
FIGS. 21A and 21C are views each illustrating a structure of a conventional thin film transistor and FIGS. 21B and 21D are diagrams each illustrating an equivalent circuit thereof.
Figure 21B:
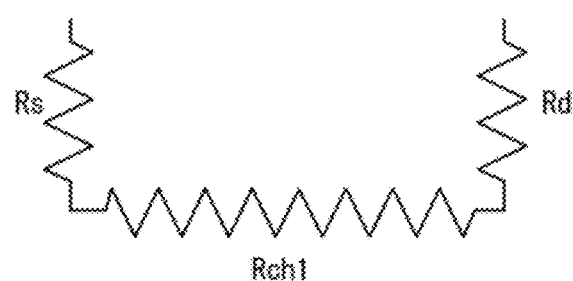
Figure 21C:
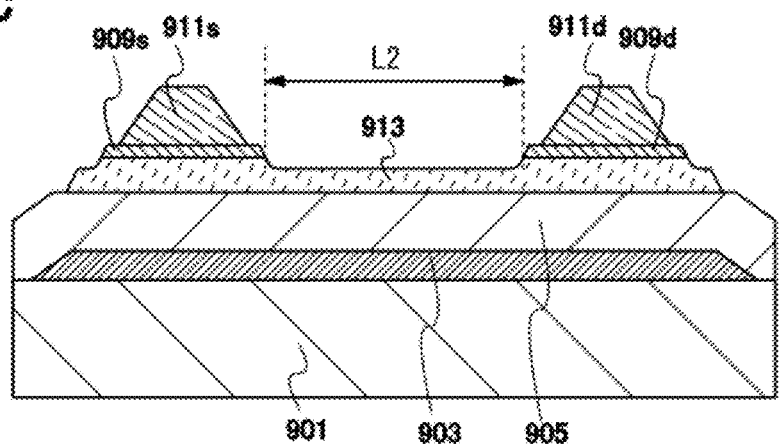
Figure 21D:
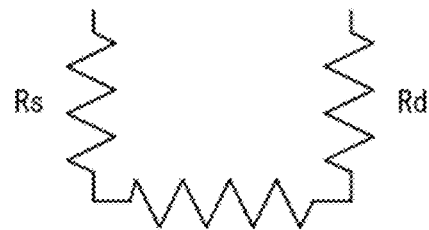

FIG. 20 illustrates an example of a thin film transistor according to this embodiment. The thin film transistor illustrated in FIG. 20 includes, over the substrate 101, the gate electrode layer 103, the semiconductor layer 129, the gate insulating layer 105 between the gate electrode layer 103 and the semiconductor layer 129, the source region 127s and the drain region 127d which are in contact with the semiconductor layer 129, the source electrode layer 125s in contact with the source region 127s, and the drain electrode layer 125d in contact with a drain region 127d. The source region 127s and the drain region 127d are formed using a microcrystalline semiconductor layer to which an impurity imparting one conductivity type is added. In the semiconductor layer 129, regions in contact with the source region 127s and the drain region 127d are formed of crystal regions 129b and 129c. Further, the crystal regions 129b and 129c in the semiconductor layer 129 are not formed in a back channel region and separated from each other; thus, they make a pair. Further, the semiconductor layer 129 includes the semiconductor layer 129a including an amorphous semiconductor. Further, a gate insulating layer 141 provided so as to cover at least the back channel portion of the semiconductor layer 129a including an amorphous semiconductor is provided in a region which is not overlapped with the source electrode layer 125s and the drain electrode layer 125d. A gate electrode layer 143 overlapping the back channel portion of the semiconductor layer 129a including an amorphous semiconductor is provided over the gate insulating layer 141.

The gate insulating layer 141 can be formed to have a single-layer structure or a layered structure using any of a silicon nitride layer, a silicon oxynitride layer, and a silicon nitride oxide layer in a manner similar to that of the gate insulating layer 105. The gate insulating layer 141 is formed to a thickness of from 50 nm to 550 nm, preferably from 50 nm to 300 nm in a manner similar to that of the gate insulating layer 105.

The gate electrode layer 143 can be formed using a material similar to that of the gate electrode layer 103 and the source and drain electrode layers 125s and 125d. By providing the gate electrode layer 143 and controlling a voltage applied to the gate electrode layer 143, a threshold voltage of the thin film transistor can be controlled. Therefore, with the structure described in this embodiment, formed is a thin film transistor in which an on current and field effect mobility are increased while an off current is reduced, and the threshold voltage is not likely to be shifted.

Further, a potential of the gate electrode layer 143 at the time when the thin film transistor described in this embodiment is on is preferably equal to that of the gate electrode layer 103, and a potential of the gate electrode layer 143 at the time when the thin film transistor is off is preferably held at a certain potential. By thus performing driving, an on current can be increased and an off current can be reduced, so that a thin film transistor with excellent switching characteristics can be obtained.

Embodiment 13

In this embodiment, an element substrate and a display device including the element substrate to which any of the thin film transistors described in Embodiments 1 to 12 can be applied will be described below. As a display device, a liquid crystal display device, a light-emitting display device, electronic paper, and the like are given. The thin film transistor described in any of the above embodiments can also be used for an element substrate of any other display device. Here, a liquid crystal display device including the thin film transistor described in Embodiment 1, typically, a vertical alignment (VA) mode liquid crystal display device will be described with reference to FIGS. 24 and 25.

Figure 24:
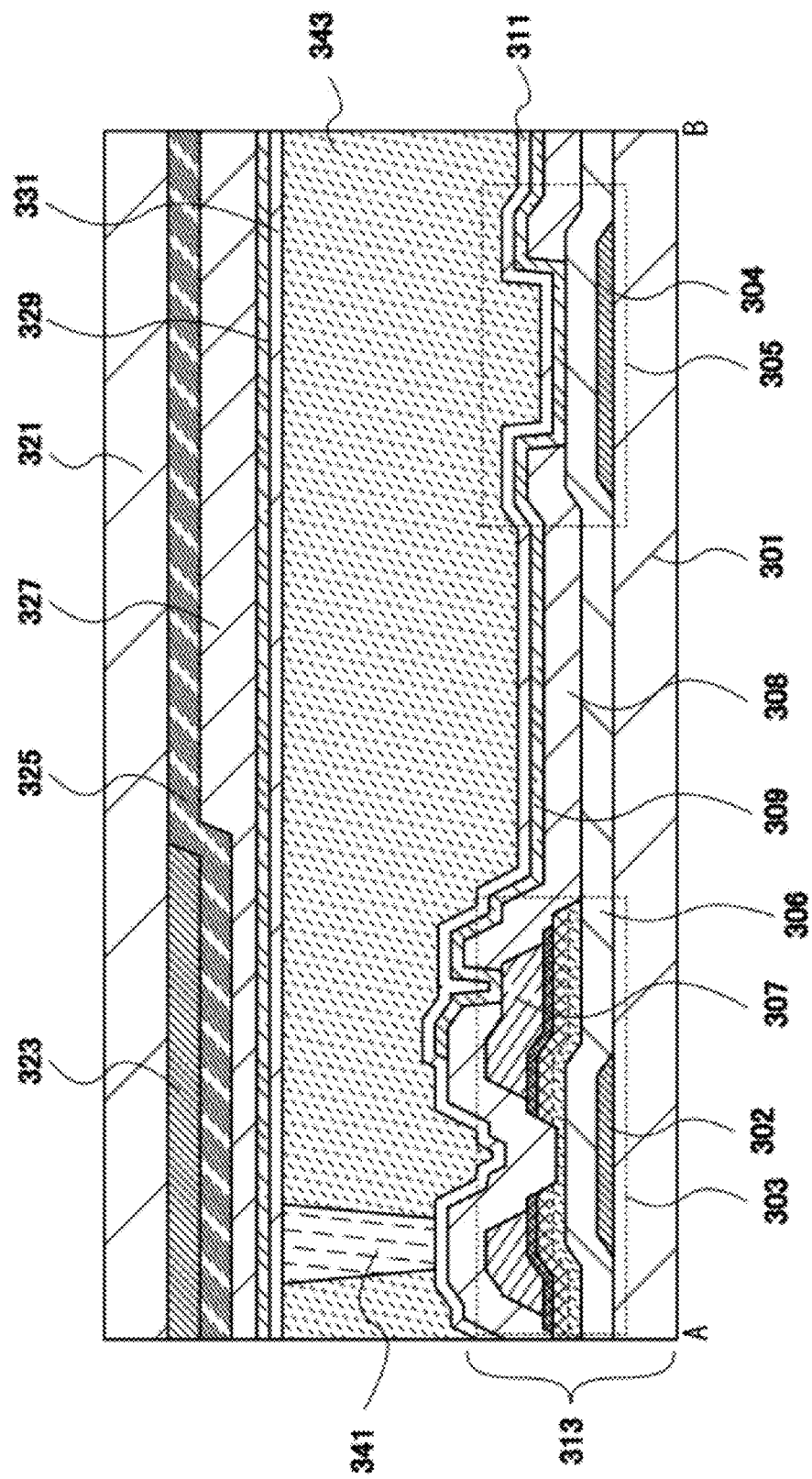
FIG. 24 is a view illustrating an example of a display device including a thin film transistor according to an embodiment of the present invention.

FIG. 24 illustrates a cross-sectional structure of a pixel portion of a liquid crystal display device. A thin film transistor 303 and a capacitor 305 described in this embodiment are formed over a substrate 301. Further, a pixel electrode layer 309 is formed over an insulating layer 308 formed over the thin film transistor 303. A source or drain electrode 307 and the pixel electrode layer 309 of the thin film transistor 303 are connected to each other in an opening formed in the insulating layer 308. An alignment film 311 is formed over the pixel electrode layer 309.

The capacitor 305 includes a capacitor wiring 304 formed at the same time as a gate electrode layer 302 of the thin film transistor 303, a gate insulating layer 306, and the pixel electrode layer 309.

A stack body including components from the substrate 301 to the alignment film 311 is referred to as an element substrate 313.

A counter substrate 321 is provided with a coloring layer 325 and a light-blocking layer 323 for blocking incidence of light into the thin film transistor 303. In addition, a planarizing layer 327 is formed over the light-blocking layer 323 and the coloring layer 325. A counter electrode layer 329 is formed over the planarizing layer 327, and an alignment film 331 is formed over the counter electrode layer 329.

Note that the light-blocking layer 323, the coloring layer 325, and the planarizing layer 327 over the counter substrate 321 function as a color filter. Note that either or both the light-blocking layer 323 and the planarizing layer 327 are not necessarily formed over the counter substrate 321.

The coloring layer has a function of preferentially transmitting light of a predetermined wavelength range, among light of the wavelength range of visible light. In general, a coloring layer which preferentially transmits light of a wavelength range of red light, a coloring layer which preferentially transmits light of a wavelength range of blue light, and a coloring layer which preferentially transmits light of a wavelength range of green light are combined to be used for a color filter. However, the combination of the coloring layers is not limited to the above combination.

The substrate 301 and the counter substrate 321 are fixed by a sealing material (not shown), and a liquid crystal layer 343 fills on an inner side than the substrate 301, the counter substrate 321, and the sealing material. Further, a spacer 341 is provided to keep a distance between the substrate 301 and the counter substrate 321.

The pixel electrode layer 309, the liquid crystal layer 343, and the counter electrode layer 329 are overlapped with each other so that a liquid crystal element is formed.

Figure 25:
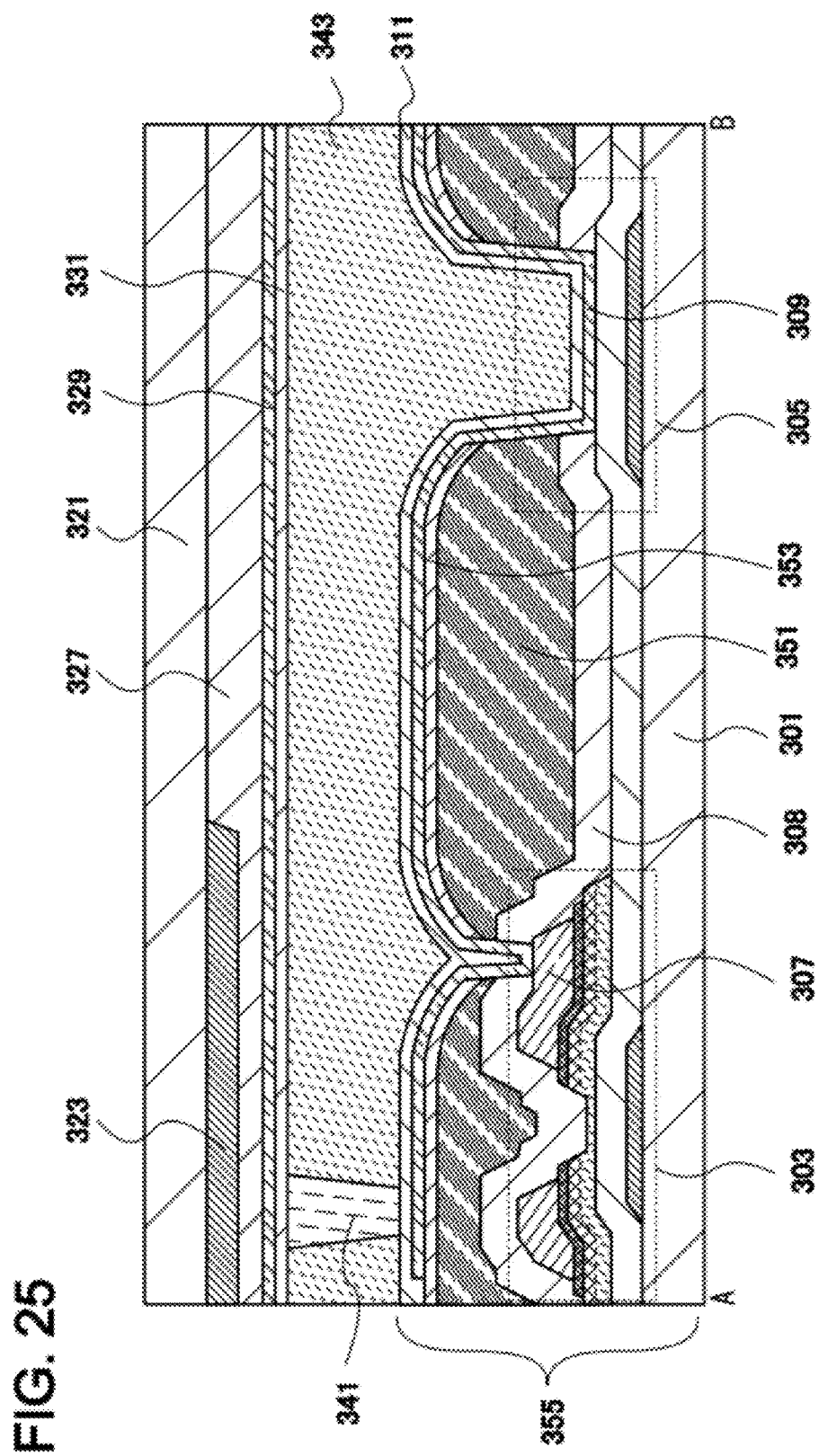
FIG. 25 is a view illustrating an example of a display device including a thin film transistor according to an embodiment of the present invention.

FIG. 25 illustrates a liquid crystal display device different from that in FIG. 24. Here, a coloring layer is formed not on the side of the counter substrate 321 but on the side of the substrate 301 provided with the thin film transistor 303.

FIG. 25 illustrates a cross-sectional structure of a pixel portion of a liquid crystal display device. The thin film transistor 303 and the capacitor 305 described in this embodiment are formed over the substrate 301.

Further, a coloring layer 351 is formed over the insulating layer 308 formed over the thin film transistor 303. Further, a protective layer 353 is formed over the coloring layer 351 in order to prevent an impurity contained in the coloring layer 351 from being mixed into the liquid crystal layer 343. The pixel electrode layer 309 is formed over the coloring layer 351 and the protective layer 353. As the coloring layer 351, a layer which preferentially transmits light of a predetermined wavelength range (red light, blue light, or green light) may be formed for each pixel. Further, since the coloring layer 351 also functions as a planarizing layer, uneven alignment of the liquid crystal layer 343 can be suppressed.

The source or drain electrode 307 and the pixel electrode layer 309 of the thin film transistor 303 are connected to each other in an opening formed in the insulating layer 308, the coloring layer 351, and the protective layer 353. The alignment film 311 is formed over the pixel electrode layer 309.

The capacitor 305 includes the capacitor wiring 304 formed at the same time as the gate electrode layer 302 of the thin film transistor 303, the gate insulating layer 306, and the pixel electrode layer 309.

A stack body including components from the substrate 301 to the alignment film 311 is referred to as an element substrate 355.

The counter substrate 321 is provided with the light-blocking layer 323 for blocking incidence of light into the thin film transistor 303 and the planarizing layer 327 covering the light-blocking layer 323 and the counter substrate 321. The counter electrode layer 329 is formed over the planarizing layer 327, and the alignment film 331 is formed over the counter electrode layer 329.

The pixel electrode layer 309, the liquid crystal layer 343, and the counter electrode layer 329 are overlapped with each other so that a liquid crystal element is formed.

Note that although the VA liquid crystal display device is described here as a liquid crystal display device, this embodiment is not limited thereto. In other words, the element substrate which is formed using the thin film transistor described in Embodiment 12 can be used for an FFS liquid crystal display device, an IPS liquid crystal display device, a TN liquid crystal display device, or any other liquid crystal display device.

Since the thin film transistor with a large on current, high field effect mobility, and a small off current is used as a pixel transistor in the liquid crystal display device of this embodiment, image quality of the liquid crystal display device can be improved. Further, electric characteristics of the thin film transistor is not degraded even when the thin film transistor is downsized; therefore, by reducing the area of the thin film transistor, the aperture ratio of the liquid crystal display device can be increased. Alternatively, the area of a pixel can be reduced, so that resolution of the liquid crystal display device can be improved.

Further, in the liquid crystal display device illustrated in FIG. 25, the light-blocking layer 323 and the coloring layer 351 are not formed over the same substrate. Therefore, it is not necessary to increase the area of the light-blocking layer 323 in order to prevent misalignment of a mask in formation of the coloring layer 351, which can increase the aperture ratio of a pixel.

Embodiment 14

By being provided with a light-emitting element instead of the alignment film 311, the element substrate 313 described in Embodiment 13 can be used for a light-emitting display device or a light-emitting device. As for a light-emitting display device or a light-emitting device, a light-emitting element utilizing electroluminescence is typically given as a light-emitting element. Light-emitting elements utilizing electroluminescence are roughly classified according to whether a light-emitting material is an organic compound or an inorganic compound. In general, the former is referred to as organic EL elements and the latter is referred to as inorganic EL elements.

In the light-emitting display device or the light-emitting device of this embodiment, a thin film transistor with a large on current, high field effect mobility, and a small off current is used as a pixel transistor; therefore, the light-emitting display device or the light-emitting device can have favorable image quality (for example, high contrast) and low power consumption.

Embodiment 15

A semiconductor device including the thin film transistor according to any of the above embodiments can be applied to a variety of electronic appliances (including an amusement machine). Examples of electronic appliances are a television set (also referred to as a television or a television receiver), a monitor of a computer or the like, electronic paper, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like. In particular, a liquid crystal display device, a light-emitting device, an electrophoretic display device, or the like to which the thin film transistor according to any of the above embodiments is applied as described in Embodiments 13 and 14 can be used for a display portion of an electronic appliance. Specific examples will be described below.

A semiconductor device including the thin film transistor according to any of the above embodiments can be applied to electronic paper. Electronic paper can be used for electronic appliances of a variety of fields as long as they can display data. For example, electronic paper can be applied to an electronic book (e-book), a poster, a transportation advertisement in a vehicle such as a trains displays of various cards such as a credit card, and the like. Examples of the electronic appliances are illustrated in FIGS. 26A to 26D.

Figure 26A:
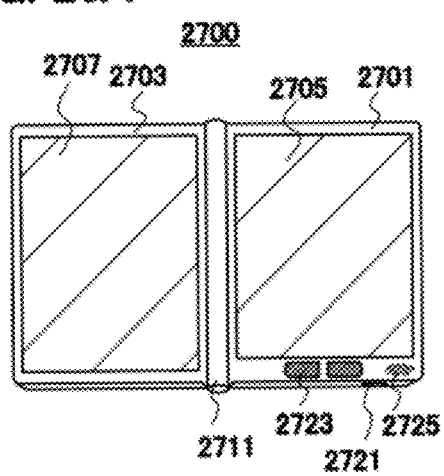
FIGS. 26A to 26D are diagrams each illustrating an electronic appliance.

FIG. 26A illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed with the hinge 2711 as an axis. With such a structure, the electronic book 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 26A) can display text and a display portion on the left side (the display portion 2707 in FIG. 26A) can display graphics.

FIG. 26A illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book 2700 may have a function of an electronic dictionary.

The electronic book 2700 may transmit and receive data wirelessly. The structure may be employed in which a desired book data or the like is purchased and downloaded from an electronic book server wirelessly.

Figure 26B:
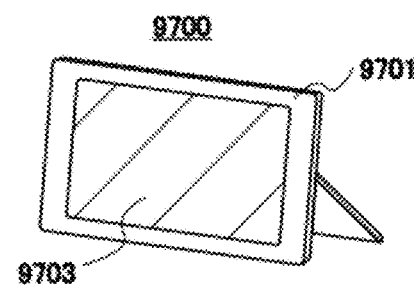
Figure 26C:
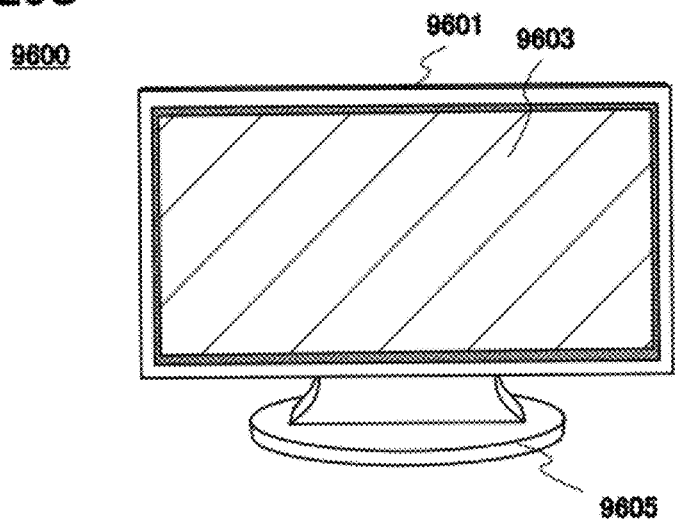

FIG. 26C illustrates an example of a television set 9600. In the television set 9600, a display portion 9603 is incorporated in a housing 9601. The display portion 9603 can display an image. Further, the housing 9601 is supported by a stand 9605 here. Any of the display devices described in Embodiments 13 and 14 can be applied to the display portion 9603.

The television set 9600 can be operated by an operation switch of the housing 9601 or a separate remote controller. Channels and volume can be controlled by an operation key of the remote controller so that an image displayed on the display portion 9603 can be controlled. Further, the remote controller may be provided with a display portion for displaying data output from the remote controller.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

FIG. 26B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 26D:
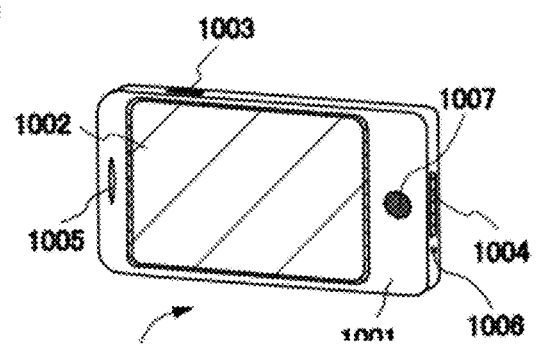

FIG. 26D illustrates an example of a mobile phone handset 1000. The mobile phone handset 1000 is provided with a display portion 1002 incorporated in a housing 1001, operation buttons 1003 and 1007, an external connection port 1004, a speaker 1005, a microphone 1006, and the like. Any of the display devices described in Embodiments 13 and 14 can be applied to the display portion 1002.

The display portion 1002 of the mobile phone handset 1000 illustrated in FIG. 26D is a touchscreen. When the display portion 1002 is touched with a finger or the like, contents displayed on the display portion 1002 can be controlled. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In that case, it is preferable to display a keyboard or number buttons on a large area of the screen of the display portion 1002.

When a detection device including a sensor for detecting inclination, such as a gyroscope or an acceleration sensor, is provided inside the mobile phone handset 1000, display of the display portion 1002 can be automatically switched by determining the direction of the mobile phone handset 1000 (whether the mobile phone handset 1000 is placed horizontally or vertically for a landscape mode or a portrait mode).

The screen modes are switched by touching the display portion 1002 or operating the operation button 1007 of the housing 1001. Alternatively, the screen modes may be switched depending on the kind of the image displayed on the display portion 1002. For example, when a signal of an image displayed on the display portion is the one of moving image data, the screen mode can be switched to the display mode. When the signal is the one of text data, the screen mode can be switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by an image sensor when the display portion 1002 is touched with the palm or the finger, whereby personal authentication can be performed. Further, by providing a backlight or sensing light source emitting a near-infrared light for the display portion, an image of a finger vein, a palm vein, or the like can be taken.

This embodiment can be combined with any of the structures described in the other embodiments as appropriate.

EXAMPLE 1

Figure 22A:
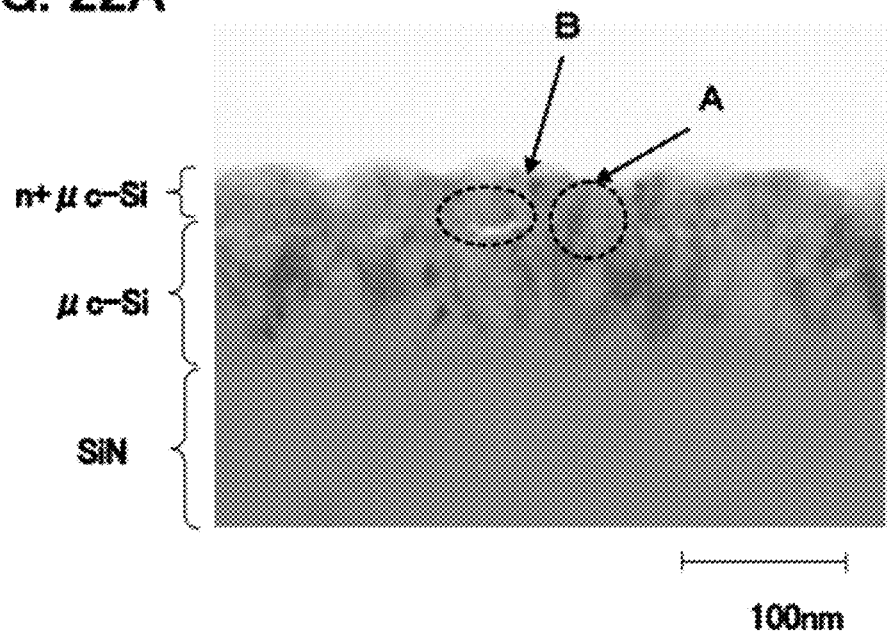
FIGS. 22A and 22B are views each illustrating a structure of a thin film transistor manufactured in Example 1.
Figure 22B:
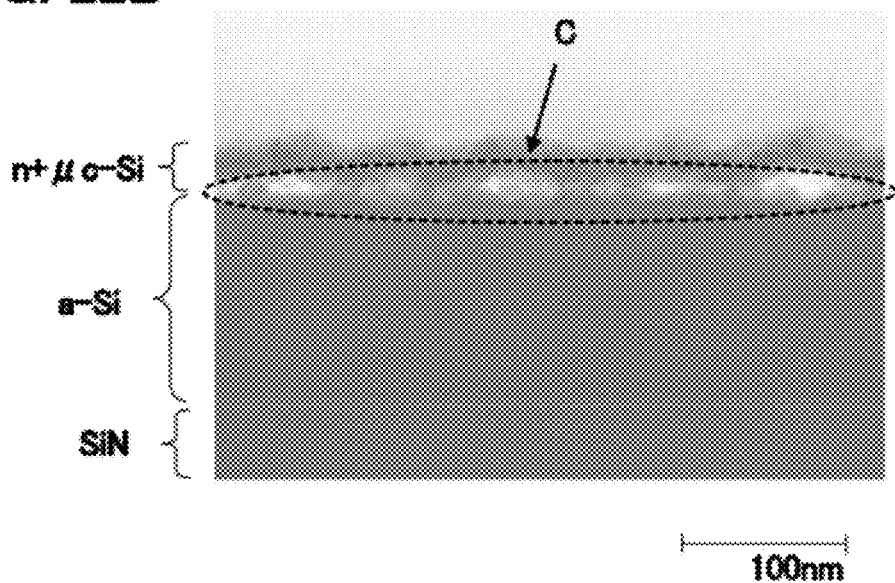

This example will describe a change in proportion of a low density layer at the interface between a base layer and a microcrystalline silicon layer to which phosphorus is added that functions as source and drain regions with reference to FIGS. 22A and 22B.

FIG. 22A shows an image of a cross section of a sample (sample A) obtained by forming a microcrystalline silicon layer to which phosphorus is added over a microcrystalline silicon layer, which is observed by a scanning transmission electron microscope (STEM). FIG. 22B shows an image of a cross section of a sample (sample B) obtained by forming a microcrystalline silicon layer to which phosphorus is added over an amorphous silicon layer, which is observed by a STEM.

A method for forming the sample A will be described below.

A silicon nitride layer (SiN) with a thickness of 100 nm is formed over a glass substrate (EAGLE2000 manufactured by Corning Incorporated) by a plasma CVD method. The deposition conditions at this time are as follows: the source gases are introduced and stabilized, where the flow rate of $SiH_4$ is 40 sccm, the flow rate of $H_2$ is 500 sccm, the flow rate of $N_2$ is 550 sccm, and the flow rate of $NH_3$ is 140 sccm, and plasma discharge with an RF power frequency of 13.56 MHz and an RE power of 370 W is performed, where the pressure in the treatment chamber is 100 Pa and the temperature of the substrate is 280° C.

Next, a silicon layer containing nitrogen (μc-Si) with a thickness of 80 nm is formed over the silicon nitride layer (SiN). The deposition conditions at this time are as follows: the source gases are introduced and stabilized, where the flow rate of $SiH_4$ is 10 sccm and the flow rate of $H_2$ is 1500 sccm, and plasma discharge with an RF power frequency of 13.56 MHz and an RF power of 50 W is performed, where the pressure in the treatment chamber is 280 Pa and the temperature of the substrate is 280° C.

Here, since a silicon layer comes to contain nitrogen in the silicon nitride layer (SiN) while being formed, an amorphous silicon layer is formed at a portion of around 0 nm to 5 nm from the bottom of the silicon layer containing nitrogen (μc-Si); however, crystal nuclei grow at a portion of 5 nm to 15 nm from the bottom of the silicon layer containing nitrogen (μc-Si), and a microcrystalline silicon region where inverted conical or pyramidal crystal grains are in contact with each other is formed at a portion of 15 nm to 80 nm from the bottom of the silicon layer containing nitrogen (μc-Si).

Next, a microcrystalline silicon layer to which phosphorus is added (μc-Si) is formed over the silicon layer containing nitrogen (μc-Si). The deposition conditions at this time are as follows: the source gases are introduced and stabilized, where the flow rate of $SiH_4$ is 10 sccm, the flow rate of a mixed gas in which $PH_3$ is diluted with $H_2$ to 0.5 vol % is 30 sccm, and the flow rate of hydrogen is 1500 sccm, and plasma discharge with an RF power frequency of 13.56 MHz and an RF power of 300 W is performed, where the pressure in the treatment chamber is 280 Pa and the temperature of the substrate is 280° C.

Next, a method for forming the sample B will be described.

Under conditions similar to those of the sample A, a silicon nitride layer (SiN) with a thickness of 100 nm is formed over a glass substrate by a plasma CVD method.

Next, an amorphous silicon layer (a-Si) with a thickness of 150 nm is formed over the silicon nitride layer (SiN). The deposition conditions at this time are as follows: the source gases are introduced and stabilized, where the flow rate of $SiH_4$ is 280 sccm and the flow rate of $H_2$ is 300 sccm, and plasma discharge with an RF power frequency of 13.56 MHz and an RF power of 370 W is performed, where the pressure in the treatment chamber is 170 Pa and the temperature of the substrate is 280° C.

Next, under conditions similar to those of the sample A, a microcrystalline silicon layer to which phosphorus is added ($n^+$μc-Si) with a thickness of 50 nm is formed over the amorphous silicon layer (a-Si).

In FIG. 22A, a region A surrounded by a dashed line is a region in which a low density layer is not formed at the interface between the silicon layer containing nitrogen (μc-Si) and the microcrystalline silicon layer to which phosphorus is added ($n^+$μc-Si). A white region in a region B surrounded by a dashed line is a region in which a low density layer is formed at the interface between the silicon layer containing nitrogen (μc-Si) and the microcrystalline silicon layer to which phosphorus is added ($n^+$μc-Si).

In FIG. 22B, a white region in a region C surrounded by a dashed line is a region in which a low density layer is formed at the interface between the amorphous silicon layer (a-Si) and the microcrystalline silicon layer to which phosphorus is added ($n^+$μc-Si).

It can be observed that in the sample of FIG. 22A, a low density layer is reduced as compared to in the sample of FIG. 22B. According to this, it can be understood that by forming a microcrystalline semiconductor layer to which an impurity imparting one conductivity type is added, here, the microcrystalline silicon layer to which phosphorus is added ($n^+$μc-Si) over a crystal region, here, the microcrystalline silicon region where inverted conical or pyramidal crystal grains are in contact with each other, the proportion of the low density layer at the interface between the microcrystalline silicon region where inverted conical or pyramidal crystal grains are in contact with each other and the microcrystalline silicon layer to which phosphorus is added ($n^+$μc-Si) can be reduced.

EXAMPLE 2

This example will describe a change in field effect mobility at the time when a channel length is changed in a thin film transistor having the structure according to any of the above embodiments with reference to FIGS. 18A to 18C, FIGS. 19A and 19B, and FIG. 23.

First, a process for manufacturing a thin film transistor will be described with reference to FIGS. 18A to 18C, and FIGS. 19A and 19B.

The gate electrode layer 103 is formed over the substrate 101.

Here, a glass substrate (EAGLE2000 manufactured by Corning Incorporated) with a thickness of 0.7 mm is used as the substrate 101.

A molybdenum target is sputtered onto the substrate with argon ions with a flow rate of 50 sccm, so that a molybdenum layer with a thickness of 150 nm is formed over the substrate. Next, after the molybdenum layer is coated with a resist, exposure is performed using a first photomask. After that, development is performed, so that a resist mask is formed.

Next, the molybdenum layer is etched with the use of the resist mask, so that the gate electrode layer 103 is formed. Here, the etching is performed using an ICP etching apparatus under the condition that the ICP power is 800 W, the bias power is 100 W, the pressure is 1.5 Pa, and carbon fluoride with a flow rate of 25 sccm, chlorine with a flow rate of 25 sccm, and oxygen with a flow rate of 10 sccm are used as etching gases.

After that, the resist mask is removed.

Next, in samples 1 to 3, the gate insulating layer 105, the semiconductor layer 107, and the microcrystalline semiconductor layer 109 to which an impurity imparting one conductivity type is added are successively formed over the gate electrode layer 103 and the substrate 101.

Further, in samples 4 to 6, the gate insulating layer 105, the semiconductor layer 107, and an amorphous semiconductor layer 149 to which an impurity imparting one conductivity type is added are successively formed over the gate electrode layer 103 and the substrate 101.

Here, under conditions similar to those of the silicon nitride layer of Example 1, a silicon nitride layer with a thickness of 300 nm is formed as the gate insulating layer 105. Further, under conditions similar to those of the silicon layer containing nitrogen (μc-Si) of Example 1, a silicon layer containing nitrogen with a thickness of 80 nm is formed as the semiconductor layer 107.

In the samples 1 to 3, under conditions similar to those of the microcrystalline silicon layer to which phosphorus is added ($n^+$μc-Si) in Example 1, a microcrystalline silicon layer to which phosphorus is added with a thickness of 80 nm is formed as the microcrystalline semiconductor layer 109 to which an impurity imparting one conductivity type is added.

In the samples 4 to 6, an amorphous silicon layer to which phosphorus is added is formed as the amorphous semiconductor layer 149 to which an impurity imparting one conductivity type is added under the condition that the RF power frequency is 13.56 MHz, the RF power is 60 W, the deposition temperature is 280° C., the flow rate of silane is 100 sccm, the flow rate of 0.5% phosphine (diluted with hydrogen) is 170 sccm, and the pressure is 170 Pa.

Next, after the microcrystalline semiconductor layer 109 to which an impurity imparting one conductivity type is added or the amorphous semiconductor layer 149 to which an impurity imparting one conductivity type is added is coated with a resist, exposure is performed using a second photomask. After that, development is performed, so that a resist mask is formed. Next, the semiconductor layer 107 and the microcrystalline semiconductor layer 109 to which an impurity imparting one conductivity type is added or the amorphous semiconductor layer 149 to which an impurity imparting one conductivity type is added are etched using the resist mask, so that the semiconductor layer 115 and the microcrystalline semiconductor layer 117 to which an impurity imparting one conductivity type is added or an amorphous semiconductor layer 157 to which an impurity imparting one conductivity type is added are formed (see FIG. 18B). Here, the etching is performed using an ICP etching apparatus under the condition that the ICP power is 150 W, the bias power is 40 W, the pressure is 1.0 Pa, chlorine with a flow rate of 100 sccm is used as an etching gas, and etching time is 82 seconds.

Next, as illustrated in FIG. 18C, the conductive layer 111 which covers the gate insulating layer 105, the semiconductor layer 115, the microcrystalline semiconductor layer 117 to which an impurity imparting one conductivity type is added or the amorphous semiconductor layer 157 to which an impurity imparting one conductivity type is added is formed. Here, a molybdenum target is sputtered with argon ions with a flow rate of 50 sccm, so that a molybdenum layer with a thickness of 300 nm is formed.

Figure 19A:
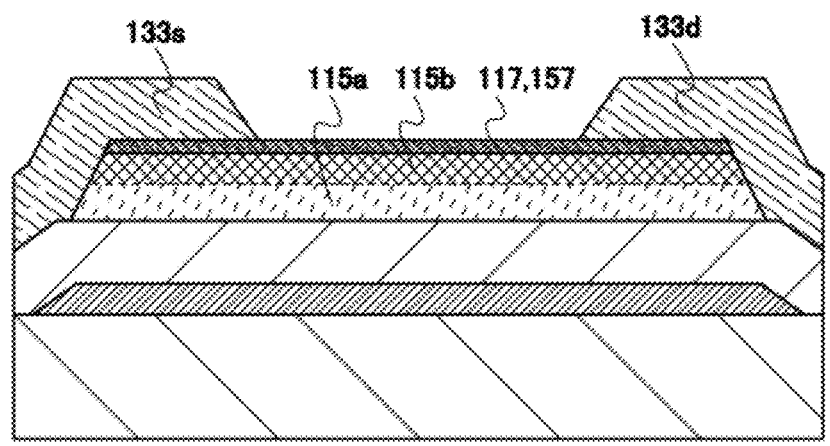
FIGS. 19A and 19B are views illustrating an example of a method for manufacturing a thin film transistor according to an embodiment of the present invention.
Figure 19B:
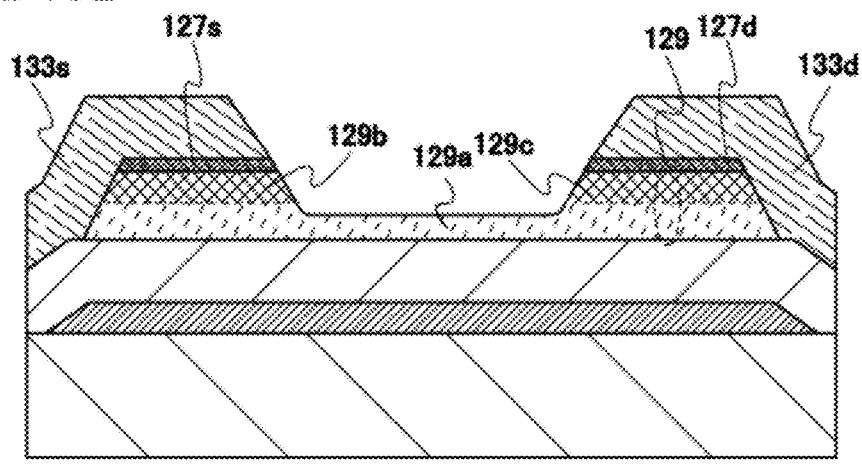

Next, after the conductive layer 111 is coated with a resist, exposure is performed using a third photomask. After that, development is performed, so that a resist mask is formed. The conductive layer 111 is wet-etched using the resist mask, so that the source electrode layer 133s and the drain electrode layer 133d are formed as illustrated in FIG. 19A. Note that in this example, the source electrode layer 133s and the drain electrode layer 133d are parallel in a plan view.

Next, the microcrystalline semiconductor layer 117 to which an impurity imparting one conductivity type is added or the amorphous semiconductor layer 159 to which an impurity imparting one conductivity type is added is etched with the use of the resist mask, so that the source region 127s and the drain region 127d are formed. Note that in that step, the crystal region 115b and the surface of the semiconductor layer 115a including an amorphous semiconductor of the semiconductor layer 115 are also partly etched, so that the crystal regions 129b and 129c and the semiconductor layer 129a including an amorphous semiconductor are formed (see FIG. 19B). Here, the etching is performed using an ICP etching apparatus under the condition that the ICP power is 150 W, the bias power is 40 W, the pressure is 1.0 Pa, chlorine with a flow rate of 100 sccm is used as an etching gas, and etching time is 36 seconds. The thickness of the semiconductor layer 129a including an amorphous semiconductor in this case is 40 nm.

Next, the surfaces of the crystal regions 129b and 129c, the semiconductor layer 129a including an amorphous semiconductor, the source region 127s and the drain region 127d are irradiated with carbon fluoride plasma so that an impurity remaining in the semiconductor layer 129a including an amorphous semiconductor is removed. Here, the etching is performed under the condition that the source power is 1000 W, the pressure is 0.67 Pa, carbon fluoride with a flow rate of 100 sccm is used as an etching gas, and etching time is 30 seconds.

Next, the surfaces of the crystal regions 129h and 129c, the semiconductor layer 129a including an amorphous semiconductor, the source region 127s and the drain region 127d are irradiated with water plasma. The condition is that plasma is generated in an atmosphere of water vapor with a flow rate of 300 sccm, where the power is 1800 W, the pressure is 66.5 Pa, and irradiation with the plasma is performed for 180 seconds. After that, the resist is removed.

Next, a silicon nitride layer is formed as a protective insulating layer. A silicon nitride layer with a thickness of 300 nm is formed in such a manner that the source gases are introduced, where the flow rate of $SiH_4$ is 20 sccm, the flow rate of $NH_3$ is 220 sccm, the flow rate of nitrogen is 450 sccm and the flow rate of hydrogen is 450 sccm, and plasma discharge with an output of 300 W is performed, where the pressure in the treatment chamber is 200 Pa and the temperature of the substrate is 250° C.

Next, after the protective insulating layer is coated with a resist, exposure is performed using a fourth photomask. After that, development is performed, so that a resist mask is formed. The protective insulating layer is partly dry-etched using the resist mask, so that the drain electrode layer 133d is exposed. Further, the protective insulating layer and the gate insulating layer 105 are partly dry-etched, so that the gate electrode layer 103 is exposed. Here, by using an ICP etching apparatus, after plasma is generated under the condition that the ICP power is 475 W, the bias power is 300 W, the pressure is 5.5 Pa, the flow rate of $CHF_3$ is 50 sccm, and the flow rate of helium is 100 sccm, etching is performed for 244 seconds with the use of $CHF_3$ with a flow rate of 7.5 sccm and helium with a flow rate of 142.5 sccm as etching gases. After that, the resist mask is removed.

Next, a conductive layer is formed over the protective insulating layer. Here, an ITO with a thickness of 50 nm is formed as the conductive layer by a sputtering method.

Next, after the conductive layer is coated with a resist, exposure is performed using a fifth photomask. After that, development is performed, so that a resist mask is formed. The conductive layer is partly dry-etched with the use of the resist mask, so that a pixel electrode is formed.

Through the above steps, the thin film transistor and the pixel electrode connected with the thin film transistor are formed.

In the samples 1 and 4, L/W is 3.4 μm/20 μm. In the samples 2 and 5, L/W is 9.4 μm/20.9 μm. In the samples 3 and 6, L/W is 99.4 μm/100.9 μm.

Further, the samples 1 to 3 (triangular dots in FIG. 23) are each a thin film transistor in which source and drain regions are formed using a microcrystalline silicon layer to which phosphorus is added. The samples 4 to 6 (circular dots in FIG. 23) are each a thin film transistor in which source and drain regions are formed using an amorphous silicon layer to which phosphorus is added.

Figure 23:
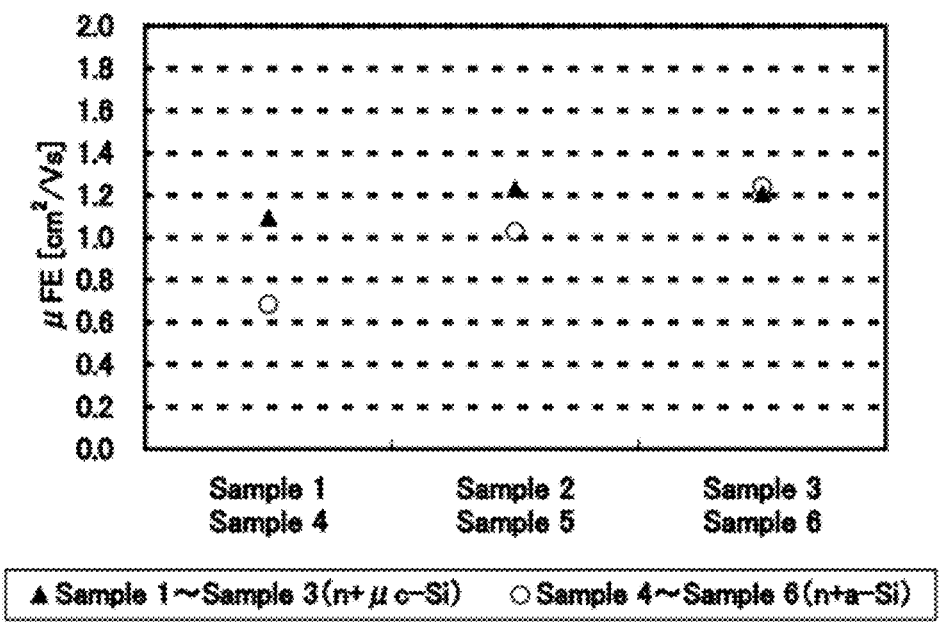
FIG. 23 is a graph showing field effect mobility of a thin film transistor manufactured in Example 2.

As shown in FIG. 23, even in the case where the samples 1 to 3 each of which is a thin film transistor in which source and drain regions are formed using a microcrystalline silicon layer to which phosphorus is added has a small channel length and a small channel width, mobility is not changed so much.

On the other hand, as the samples 4 to 6 each of which is a thin film transistor in which source and drain regions are formed using an amorphous silicon layer to which phosphorus is added have smaller channel lengths and smaller channel widths, field effect mobility is reduced.

That is, it is understood that since the source and drain regions are formed using an amorphous silicon layer to which phosphorus is added with high resistivity, resistance between the source region and the semiconductor layer and resistance between the drain region and the semiconductor layer are high. Therefore, a short L length increases an adverse affect of resistance in the regions, which reduces field effect mobility.

On the other hand, in the case where an upper portion of the semiconductor layer (that is, a base layer of source and drain regions) is a crystal region and a microcrystalline semiconductor layer to which phosphorus is added is formed over the crystal region, a low density layer is not formed at the interface between the semiconductor layer and the source and drain regions, and the source and drain regions are formed using a microcrystalline silicon layer to which phosphorus is added with low resistivity. Therefore, it is under stood that resistance between the source region and the semiconductor layer and resistance between the drain region and the semiconductor layer are low. Thus, even when the channel length is reduced, field effect mobility is not changed.

This application is based on Japanese Patent Application serial no. 2008-228765 filed with Japan Patent Office on Sep. 5, 2008, the entire contents of which are hereby incorporated by reference.

What is claimed is:

1. A thin film transistor comprising:
a gate electrode layer over a substrate;
a gate insulating layer over the gate electrode layer;
a semiconductor layer including an amorphous semiconductor over the gate insulating layer;
a pair of crystal regions over the semiconductor layer including the amorphous semiconductor; and
source and drain regions over and in contact with the pair of crystal regions, the source and drain regions including a microcrystalline semiconductor layer,
wherein the microcrystalline semiconductor layer includes an impurity imparting one conductivity type.

2. The thin film transistor according to claim 1, further comprising a source electrode layer over the source region, and a drain electrode layer over the drain region.

3. The thin film transistor according to claim 1, wherein each of the pair of crystal regions includes columnar crystal grains, inverted conical grains, or pyramidal crystal grains.

4. The thin film transistor according to claim 1, wherein the semiconductor layer including the amorphous semiconductor is an amorphous silicon layer, an amorphous silicon germanium layer, an amorphous silicon layer containing nitrogen, or an amorphous silicon germanium layer containing nitrogen.

5. The thin film transistor according to claim 1, wherein the semiconductor layer including the amorphous semiconductor has crystal grains each with a grain size of from 1 nm to 10 nm.

6. The thin film transistor according to claim 1, wherein a concentration of nitrogen of the semiconductor layer including the amorphous semiconductor is from $1\times10^{20}$ $cm^{-3}$ to $1\times10^{21}$ $cm^{-3}$.

7. The thin film transistor according to claim 1, wherein a concentration of oxygen of the semiconductor layer including the amorphous semiconductor measured by secondary ion mass spectrometry is $5\times10^{18}$ $cm^{-3}$ or less.

8. A thin film transistor comprising:
a gate electrode layer over a substrate;
a gate insulating layer over the gate electrode layer;
a semiconductor layer including an amorphous semiconductor over the gate insulating layer;
a pair of crystal regions over the semiconductor layer including the amorphous semiconductor;
source and drain regions over and in contact with the pair of crystal regions, the source and drain regions including a first microcrystalline semiconductor layer; and
a second microcrystalline semiconductor layer between the gate insulating layer and the semiconductor layer including the amorphous semiconductor,
wherein the first microcrystalline semiconductor layer includes an impurity imparting one conductivity type.

9. The thin film transistor according to claim 8, further comprising a source electrode layer over the source region, and a drain electrode layer over the drain region.

10. The thin film transistor according to claim 8, wherein each of the pair of crystal regions includes columnar crystal grains, inverted conical grains, or pyramidal crystal grains.

11. The thin film transistor according to claim 8, wherein the semiconductor layer including the amorphous semiconductor is an amorphous silicon layer, an amorphous silicon germanium layer, an amorphous silicon layer containing nitrogen, or an amorphous silicon germanium layer containing nitrogen.

12. The thin film transistor according to claim 8, wherein the semiconductor layer including the amorphous semiconductor has crystal grains each with a grain size of from 1 nm to 10 nm.

13. The thin film transistor according to claim 8, wherein a concentration of nitrogen of the semiconductor layer including the amorphous semiconductor is from $1\times10^{20}$ $cm^{-3}$ to $1\times10^{21}$ $cm^{-3}$.

14. The thin film transistor according to claim 8, wherein a concentration of oxygen of the semiconductor layer including the amorphous semiconductor measured by secondary ion mass spectrometry is $5\times10^{18}$ cm$^{-3}$ or less.

15. A thin film transistor comprising:
a gate electrode layer over a substrate;
a gate insulating layer over the gate electrode layer;
a semiconductor layer including an amorphous semiconductor over the gate insulating layer;
a pair of crystal regions over the semiconductor layer including the amorphous semiconductor;
source and drain regions over and in contact with the pair of crystal regions, the source and drain regions including a first microcrystalline semiconductor layer; and
a second microcrystalline semiconductor layer between the semiconductor layer including the amorphous semiconductor and the pair of crystal regions, the second microcrystalline semiconductor layer containing a halogen element,
wherein the first microcrystalline semiconductor layer includes an impurity imparting one conductivity type.

16. The thin film transistor according to claim 15, further comprising a source electrode layer over the source region, and a drain electrode layer over the drain region.

17. The thin film transistor according to claim 15, wherein each of the pair of crystal regions includes columnar crystal grains, inverted conical grains, or pyramidal crystal grains.

18. The thin film transistor according to claim 15, wherein the semiconductor layer including the amorphous semiconductor is an amorphous silicon layer, an amorphous silicon germanium layer, an amorphous silicon layer containing nitrogen, or an amorphous silicon germanium layer containing nitrogen.

19. The thin film transistor according to claim 15, wherein the semiconductor layer including the amorphous semiconductor has crystal grains each with a grain size of from 1 nm to 10 nm.

20. The thin film transistor according to claim 15, wherein a concentration of nitrogen of the semiconductor layer including the amorphous semiconductor is from $1\times10^{20}$ cm$^{-3}$ to $1\times10^{21}$ cm$^{-3}$.

21. The thin film transistor according to claim 15, wherein a concentration of oxygen of the semiconductor layer including the amorphous semiconductor measured by secondary ion mass spectrometry is $5\times10^{18}$ cm$^{-3}$ or less.

* * * * *